US009018513B2

(12) United States Patent
Croft et al.

(10) Patent No.: US 9,018,513 B2
(45) Date of Patent: Apr. 28, 2015

(54) SOLAR-CELL MODULE WITH IN-LAMINATE DIODES AND EXTERNAL-CONNECTION MECHANISMS MOUNTED TO RESPECTIVE EDGE REGIONS

(75) Inventors: Steven Thomas Croft, Menlo Park, CA (US); William James McColl, Palo Alto, CA (US); Shawn Everson, Fremont, CA (US); Jason Stephen Corneille, San Jose, CA (US); Kent Whitfield, Mountain View, CA (US); Todd Krajewski, Mountain View, CA (US); Darin Britwhistle, San Francisco, CA (US)

(73) Assignee: Apollo Precision (Kunming) Yuanhong Limited, Kunming, Yunan (CN)

( * ) Notice: Subject to any disclaimer, the term of this patent is extended or adjusted under 35 U.S.C. 154(b) by 40 days.

(21) Appl. No.: 13/084,297

(22) Filed: Apr. 11, 2011

(65) Prior Publication Data

US 2011/0192448 A1 Aug. 11, 2011

Related U.S. Application Data

(63) Continuation of application No. 12/121,602, filed on May 15, 2008.

(51) Int. Cl.
*H01L 31/042* (2014.01)
*H01L 31/02* (2006.01)
(Continued)

(52) U.S. Cl.
CPC ............ *H01L 31/0201* (2013.01); *Y02E 10/50* (2013.01); *H01L 31/02013* (2013.01); *H01L 31/042* (2013.01); *H01L 31/0512* (2013.01); *H02S 40/34* (2013.01)

(58) Field of Classification Search
USPC ................................................. 136/244, 251
See application file for complete search history.

(56) References Cited

U.S. PATENT DOCUMENTS 3,553,030 A 1/1971 Lebrun
4,577,051 A 3/1986 Hartman
(Continued)

FOREIGN PATENT DOCUMENTS

EP 0177300 A2 4/1986
EP 1237186 9/2002
(Continued)

OTHER PUBLICATIONS

JP2001-339087A, Machine Translation, Umemoto, Dec. 2001.*
(Continued)

*Primary Examiner* — Devina Pillay
(74) *Attorney, Agent, or Firm* — Weaver Austin Villeneuve & Sampson LLP

(57) ABSTRACT

A solar-cell module. The solar-cell module includes a plurality of solar cells that are electrically coupled together. The solar-cell module further includes an in-laminate-diode assembly electrically coupled with the plurality of solar cells. The in-laminate-diode assembly is configured to prevent power loss. The solar-cell module also includes a protective structure at least partially encapsulating the plurality of solar cells. In addition, the solar-cell module includes a plurality of external-connection mechanisms mounted to a respective plurality of edge regions of the protective structure. An external-connection mechanism of the plurality of external-connection mechanisms is configured to enable collection of current from the plurality of solar cells and to allow interconnection with at least one other external device.

17 Claims, 29 Drawing Sheets

(51) Int. Cl.

| | |
|---|---|
| ***H01L 31/05*** | (2014.01) |
| ***H02S 40/34*** | (2014.01) |

(56) References Cited

U.S. PATENT DOCUMENTS

| | | | | |
|---|---|---|---|---|
| 4,609,770 | A | 9/1986 | Nishiura et al. | |
| 4,652,693 | A | 3/1987 | Bar-On | |
| 4,665,277 | A | 5/1987 | Sah et al. | |
| 4,694,117 | A | 9/1987 | Friedrich et al. | |
| 4,746,618 | A | 5/1988 | Nath et al. | |
| 5,280,133 | A * | 1/1994 | Nath | 174/373 |
| 5,330,583 | A | 7/1994 | Asai et al. | |
| 5,389,159 | A | 2/1995 | Kataoka et al. | |
| 5,391,235 | A | 2/1995 | Inoue | |
| 5,457,057 | A | 10/1995 | Nath et al. | |
| 5,474,621 | A | 12/1995 | Barnard | |
| 5,567,248 | A | 10/1996 | Chung | |
| 5,620,528 | A | 4/1997 | Schade et al. | |
| 5,626,688 | A | 5/1997 | Probst et al. | |
| 5,814,195 | A | 9/1998 | Lehan et al. | |
| 5,961,738 | A | 10/1999 | Benton et al. | |
| 5,990,415 | A | 11/1999 | Green et al. | |
| 6,013,870 | A | 1/2000 | Psyk et al. | |
| 6,020,555 | A | 2/2000 | Garboushian et al. | |
| 6,058,020 | A | 5/2000 | Winterer et al. | |
| 6,066,797 | A * | 5/2000 | Toyomura et al. | 136/251 |
| 6,103,970 | A | 8/2000 | Kilmer et al. | |
| 6,114,046 | A | 9/2000 | Hanoka | |
| 6,121,542 | A | 9/2000 | Shiotsuka et al. | |
| 6,144,046 | A | 11/2000 | Hanoka et al. | |
| 6,208,020 | B1 | 3/2001 | Minamio et al. | |
| 6,218,606 | B1 | 4/2001 | Morizane | |
| 6,231,732 | B1 | 5/2001 | Hollars et al. | |
| 6,248,948 | B1 | 6/2001 | Nakagawa et al. | |
| 6,274,804 | B1 | 8/2001 | Psyk et al. | |
| 6,307,755 | B1 | 10/2001 | Williams et al. | |
| 6,313,396 | B1 | 11/2001 | Glenn | |
| 6,326,540 | B1 | 12/2001 | Kilmer et al. | |
| 6,359,210 | B2 | 3/2002 | Ho et al. | |
| 6,365,010 | B1 | 4/2002 | Hollars | |
| 6,372,538 | B1 | 4/2002 | Wendt et al. | |
| 6,384,313 | B2 | 5/2002 | Nakagawa et al. | |
| 6,388,336 | B1 | 5/2002 | Venkateshwaran et al. | |
| 6,479,744 | B1 | 11/2002 | Tsuzuki et al. | |
| 6,488,824 | B1 | 12/2002 | Hollars et al. | |
| 6,545,211 | B1 | 4/2003 | Mimura | |
| 6,600,100 | B2 | 7/2003 | Ho et al. | |
| 6,617,508 | B2 | 9/2003 | Kilmer et al. | |
| 6,728,097 | B2 | 4/2004 | Wada et al. | |
| 6,974,976 | B2 | 12/2005 | Hollars | |
| 7,563,647 | B2 | 7/2009 | Bathan et al. | |
| 7,675,148 | B2 | 3/2010 | Lim et al. | |
| 7,901,996 | B2 | 3/2011 | Bathan et al. | |
| 7,906,837 | B2 | 3/2011 | Cabahug et al. | |
| 8,203,200 | B2 | 6/2012 | Halstead et al. | |
| 8,586,857 | B2 | 11/2013 | Everson et al. | |
| 8,697,980 | B2 | 4/2014 | Paulson et al. | |
| 2003/0193322 | A1 | 10/2003 | Higashikozono | |
| 2004/0069340 | A1 | 4/2004 | Luch | |
| 2005/0072461 | A1 | 4/2005 | Kuchinski et al. | |
| 2005/0109392 | A1 | 5/2005 | Hollars | |
| 2005/0133083 | A1 | 6/2005 | Matsushita et al. | |
| 2005/0156296 | A1 | 7/2005 | Wang et al. | |
| 2005/0176270 | A1 | 8/2005 | Luch | |
| 2005/0241692 | A1 | 11/2005 | Rubin et al. | |
| 2006/0032752 | A1 | 2/2006 | Luch | |
| 2006/0180195 | A1 | 8/2006 | Luch | |
| 2007/0052076 | A1 | 3/2007 | Ramos et al. | |
| 2007/0074755 | A1 * | 4/2007 | Eberspacher et al. | 136/244 |
| 2007/0132073 | A1 | 6/2007 | Tiong et al. | |
| 2007/0283996 | A1 | 12/2007 | Hachtmann et al. | |
| 2007/0283997 | A1 | 12/2007 | Hachtmann et al. | |
| 2008/0023064 | A1 * | 1/2008 | Hayes et al. | 136/251 |
| 2008/0041442 | A1 * | 2/2008 | Hanoka | 136/251 |
| 2008/0044946 | A1 | 2/2008 | Cruz et al. | |
| 2008/0135990 | A1 | 6/2008 | Coyle et al. | |
| 2008/0203549 | A1 | 8/2008 | Chow et al. | |
| 2008/0289682 | A1 * | 11/2008 | Adriani et al. | 136/251 |
| 2008/0314432 | A1 | 12/2008 | Paulson et al. | |
| 2009/0014049 | A1 | 1/2009 | Gur et al. | |
| 2009/0014057 | A1 | 1/2009 | Croft et al. | |
| 2009/0014058 | A1 | 1/2009 | Croft et al. | |
| 2009/0038683 | A1 | 2/2009 | Walter et al. | |
| 2009/0114261 | A1 * | 5/2009 | Stancel et al. | 136/244 |
| 2009/0283137 | A1 | 11/2009 | Croft et al. | |
| 2010/0108122 | A1 | 5/2010 | Everson et al. | |
| 2010/0193922 | A1 | 8/2010 | Kastner et al. | |
| 2011/0074007 | A1 | 3/2011 | Lopez et al. | |
| 2011/0121441 | A1 | 5/2011 | Halstead et al. | |
| 2011/0146778 | A1 | 6/2011 | Croft et al. | |
| 2011/0192448 | A1 | 8/2011 | Croft et al. | |
| 2011/0284052 | A1 | 11/2011 | Croft et al. | |

FOREIGN PATENT DOCUMENTS

| | | | | |
|---|---|---|---|---|
| EP | 2345072 | | 7/2011 | |
| JP | 06-252333 | | 9/1994 | |
| JP | 07-302923 | | 11/1995 | |
| JP | 11-330524 | A * | 11/1999 | H01L 31/042 |
| JP | 2000-216421 | | 8/2000 | |
| JP | 2000-269531 | | 9/2000 | |
| JP | 2000-277785 | | 10/2000 | |
| JP | 2001-135847 | | 5/2001 | |
| JP | 2001-298134 | | 10/2001 | |
| JP | 2001-339087 | | 12/2001 | |
| JP | 2001-339087 | A * | 12/2001 | H01L 31/042 |
| JP | 2002-026195 | | 1/2002 | |
| JP | 2002-151554 | | 5/2002 | |
| JP | 2002-158324 | | 5/2002 | |
| JP | 2003-110077 | | 4/2003 | |
| JP | 2003-197828 | | 7/2003 | |
| JP | 2004-253475 | | 9/2004 | |
| JP | 2005-129773 | | 5/2005 | |
| WO | 2008-124158 | | 10/2008 | |
| WO | WO2008/124158 | A1 * | 10/2008 | H01N 10/44 |
| WO | 2008/156755 | | 12/2008 | |
| WO | WO 2008150558 | * | 12/2008 | H01L 31/048 |
| WO | 2009-076740 | | 6/2009 | |
| WO | WO2009/076740 | A1 * | 6/2009 | H01L 31/042 |
| WO | 2009-140521 | | 11/2009 | |
| WO | 2010-053730 | | 5/2010 | |
| WO | 2011/066178 | | 6/2011 | |
| WO | 2011/087749 | | 7/2011 | |

OTHER PUBLICATIONS

JP11-330524A, Machine Translation, Wakui, Nov. 1999.*

U.S. Appl. No. 12/264,712, "Combined diode, lead assembly incorporating an expansion unit", Everson et al., filed Nov. 4, 2008.

U.S. Appl. No. 12/626,281, "Diode leadframe for solar module assembly", Halstead et al., filed Nov. 25, 2009.

U.S. Appl. No. 12/644,324, "Diode rail system for photovoltaic modules", Andrew J. Zeiner, filed Dec. 22, 2009.

U.S. Appl. No. 12/644,360, "Shielding of interior diode assemblies from compression forces in thin-film photovoltaic modules", Croft et al., filed Dec. 22, 2009.

U.S. Appl. No. 12/121,602, Office Action mailed Mar. 26, 2010.

U.S. Appl. No. 12/121,602, Office Action mailed Aug. 6, 2010.

U.S. Appl. No. 12/121,602, Office Action mailed May 9, 2012.

U.S. Appl. No. 12/264,712, Office Action mailed Jul. 28, 2011.

U.S. Appl. No. 12/264,712, Office Action mailed Jan. 6, 2012.

U.S. Appl. No. 12/626,281, Office Action mailed May 12, 2011.

U.S. Appl. No. 12/626,281, Office Action mailed Dec. 7, 2011.

U.S. Appl. No. 12/626,281, Notice of Allowance mailed Feb. 21, 2012.

U.S. Appl. No. 11/812,515, Office Action mailed Oct. 12, 2010.

U.S. Appl. No. 11/812,515, Office Action mailed Apr. 14, 2011.

WO patent application No. PCT/US2009/043989, International Search Report and Written Opinion mailed Dec. 2, 2009.

International Preliminary Report on Patentability mailed Nov. 25, 2010, issued in PCT Application No. PCT/US2009/043989.

(56) References Cited

OTHER PUBLICATIONS

WO patent application No. PCT/US2009/062016, International Search Report and Written Opinion mailed May 20, 2010.
International Preliminary Report on Patentability mailed May 19, 2011, issued in PCT Application No. PCT/US2009/062016.
International Search Report and Written Opinion mailed Jul. 29, 2011, from PCT Application No. PCT/US2010/057327.
U.S. Appl. No. 12/264,712, Notice of Allowance mailed Jul. 18, 2013.
International Search Report and Written Opinion mailed Dec. 31, 2008, from PCT Application No. PCT/US2008/007531.
International Preliminary Report on Patentability mailed Dec. 22, 2009, from PCT Application No. PCT/US2008/007531.
Richards et al., "Enhancing the efficiency of production CdS/CdTe PV modules by overcoming poor spectral response at short wavelengths via luminescence down-shifting," 2006 IEEE 4th World Conference on Photovoltaic Energy Conversion, May 7-12, 2006, 4 pages.
Untila et al., "19.2% Efficient Bifacial ITO-($P^+Nn^+$)Si-ITO Laminated Grid Cell," 16th European Photovoltaic Solar Energy Conference, May 1-5, 2000, Glasgow, UK, pp. 1489-1491.
U.S. Appl. No. 11/812,515, Notice of Allowance mailed Dec. 10, 2013.
EP patent application No. 09825215, Supplementary EP Search Report mailed Sep. 11, 2014.
U.S. Appl. No. 13/204,552, Office Action mailed Aug. 27, 2014.

* cited by examiner

1500A

SOLAR-CELL MODULE WITH IN-LAMINATE DIODES AND EXTERNAL-CONNECTION MECHANISMS MOUNTED TO RESPECTIVE EDGE REGIONS

CROSS REFERENCE TO RELATED APPLICATION

This application is a continuation of prior application Ser. No. 12/121,602 filed on May 15, 2008, now pending, the disclosure of which is incorporated by reference herein in its entirety.

TECHNICAL FIELD

Embodiments of the present invention relate generally to the field of photovoltaic technology.

BACKGROUND

In the quest for renewable sources of energy, photovoltaic technology has assumed a preeminent position as a cheap renewable source of clean energy. In particular, solar cells based on the compound semiconductor copper indium gallium diselenide (CIGS) used as an absorber layer offer great promise for thin-film solar cells having high efficiency and low cost. Of comparable importance to the technology used to fabricate thin-film solar cells themselves, is the technology used to collect current from solar-cell modules and to interconnect one solar-cell module to another to form a solar-cell array.

Solar-cell arrays are impacted by parasitic series resistances, just as solar-cell modules and thin-film solar cells. A significant challenge is the development of solar-cell-module current-collection and interconnection schemes that minimize this effect in solar-cell arrays. Reliability and efficiency of solar-cell modules protected from shading effects is equally important as it determines the useful life and performance of solar-cell arrays.

SUMMARY

Embodiments of the present invention include a solar-cell module. The solar-cell module includes a plurality of solar cells that are electrically coupled together. The solar-cell module further includes an in-laminate-diode assembly electrically coupled with the plurality of solar cells. The in-laminate-diode assembly is configured to prevent power loss. The solar-cell module also includes a protective structure at least partially encapsulating the plurality of solar cells. In addition, the solar-cell module includes a plurality of external-connection mechanisms mounted to a respective plurality of edge regions of the protective structure. An external-connection mechanism of the plurality of external-connection mechanisms is configured to enable collection of current from the plurality of solar cells and to allow interconnection with at least one other external device.

DESCRIPTION OF THE DRAWINGS

The accompanying drawings, which are incorporated in and form a part of this specification, illustrate embodiments of the invention and, together with the description, serve to explain the embodiments of the invention.

Figure 1A:
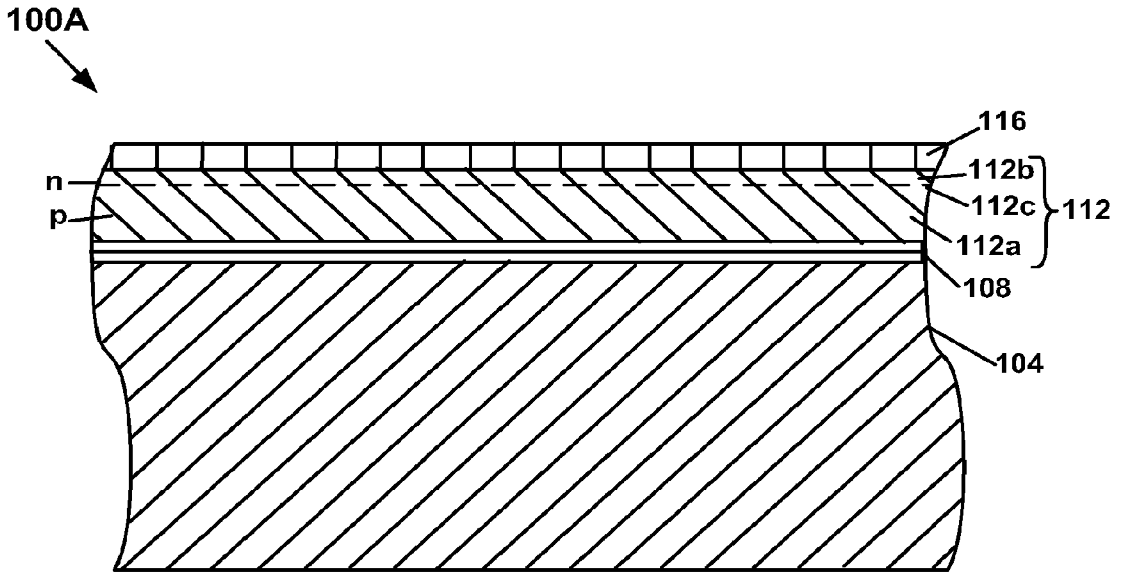
FIG. 1A is a cross-sectional elevation view of a layer structure of a solar cell, in accordance with an embodiment of the present invention.

The drawings referred to in this description should not be understood as being drawn to scale except if specifically noted.

DESCRIPTION OF EMBODIMENTS

Reference will now be made in detail to the various embodiments of the present invention. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention.

Overview

Section I describes in detail various embodiments of the present invention for an interconnect assembly (Sub-Section A), methods of fabricating the same (Sub-Section B), methods of interconnecting solar-cells (Sub-Section C), as well as a trace used in solar cells (Sub-Section D), that are incorporated as elements of the solar-cell module combined with in-laminate diodes and external-connection mechanisms mounted to respective edge regions. FIGS. 1 through 9 illustrate specific embodiments of the present invention for the interconnect assembly so incorporated as an element of the solar-cell module combined with in-laminate diodes and external-connection mechanisms mounted to respective edge regions. In particular, FIGS. 2, 3 and 4A through 4F illustrate specific embodiments of the present invention for the interconnection of solar cells in the solar-cell module of the present invention. Moreover, FIGS. 6A and 6B illustrate specific embodiments of the present invention for an integrated busbar-solar-cell-current collector that show the physical interconnection of a terminating solar cell in a solar-cell module of embodiments of the present invention.

Section II provides a detailed description of various embodiments of the present invention for the solar-cell module combined with in-laminate diodes and external-connection mechanisms mounted to respective edge regions. FIGS. 10 through 15 illustrate detailed arrangements of element combinations for the solar-cell module combined with in-laminate diodes and external-connection mechanisms mounted to respective edge regions, in accordance with embodiments of the present invention.

Section I:
Sub-Section A: Physical Description of Embodiments of the Present Invention for an Interconnect Assembly With reference to FIG. 1A, in accordance with an embodiment of the present invention, a cross-sectional elevation view of a layer structure of a solar cell 100A is shown. The solar cell 100A includes a metallic substrate 104. In accordance with an embodiment of the present invention, an absorber layer 112 is disposed on the metallic substrate 104; the absorber layer 112 may include a layer of the material copper indium gallium diselenide (CIGS) having the chemical formula $Cu(In_{1-x}Ga_x)Se_2$, where x may be a decimal less than one but greater than zero that determines the relative amounts of the constituents, indium, In, and gallium, Ga. Alternatively, semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 112. Moreover, in embodiments of the present invention, it should be noted that semiconductors, such as silicon and cadmium telluride, as well as other semiconductors, may be used as the absorber layer 112.

As shown, the absorber layer 112 includes a p-type portion 112*a* and an n-type portion 112*b*. As a result, a pn homojunction 112*c* is produced in the absorber layer 112 that serves to separate charge carriers that are created by light incident on the absorber layer 112. To facilitate the efficient conversion of light energy to charge carriers in the absorber layer 112, the composition of the p-type portion 112*a* of the absorber layer 112 may vary with depth to produce a graded band gap of the absorber layer 112. Alternatively, the absorber layer 112 may include only a p-type chalcopyrite semiconductor layer, such as a CIGS material layer, and a pn heterojunction may be produced between the absorber layer 112 and an n-type layer, such as a metal oxide, metal sulfide or metal selenide, disposed on its top surface in place of the n-type portion 112*b* shown in FIG. 1A. However, embodiments of the present invention are not limited to pn junctions fabricated in the manner described above, but rather a generic pn junction produced either as a homojunction in a single semiconductor material, or alternatively a heterojunction between two different semiconductor materials, is within the spirit and scope of embodiments of the present invention. Moreover, in embodiments of the present invention, it should be noted that semiconductors, such as silicon and cadmium telluride, as well as other semiconductors, may be used as the absorber layer 112.

In accordance with an embodiment of the present invention, on the surface of the n-type portion 112*b* of the absorber layer 112, one or more transparent electrically conductive oxide (TCO) layers 116 are disposed, for example, to provide a means for collection of current from the absorber layer 112 for conduction to an external load. As used herein, it should be noted that the phrase "collection of current" refers to collecting current carriers of either sign, whether they be positively charged holes or negatively charged electrons; for the structure shown in FIG. 1A in which the TCO layer is disposed on the n-type portion 112*b*, the current carriers collected under normal operating conditions are negatively charged electrons; but, embodiments of the present invention apply, without limitation thereto, to solar cell configurations where a p-type layer is disposed on an n-type absorber layer, in which case the current carriers collected may be positively charged holes. The TCO layer 116 may include zinc oxide, ZnO, or alternatively a doped conductive oxide, such as aluminum zinc oxide (AZO), $Al_xZn_{1-x}O_y$, and indium tin oxide (ITO), $In_xSn_{1-x}O_y$, where the subscripts x and y indicate that the relative amount of the constituents may be varied. Alternatively, the TCO layer 116 may be composed of a plurality of conductive oxide layers. These TCO layer materials may be sputtered directly from an oxide target, or alternatively the TCO layer may be reactively sputtered in an oxygen atmosphere from a metallic target, such as zinc, Zn, Al—Zn alloy, or In—Sn alloy targets. For example, the zinc oxide may be deposited on the absorber layer 112 by sputtering from a zinc-oxide-containing target; alternatively, the zinc oxide may be deposited from a zinc-containing target in a reactive oxygen atmosphere in a reactive-sputtering process. The reactive-sputtering process may provide a means for doping the absorber layer 112 with an n-type dopant, such as zinc, Zn, or indium, In, to create a thin n-type portion 112*b*, if the partial pressure of oxygen is initially reduced during the initial stages of sputtering a metallic target, such as zinc, Zn, or indium, In, and the layer structure of the solar cell 100A is subsequently annealed to allow interdiffusion of the zinc, Zn, or indium, In, with CIGS material used as the absorber layer 112. Alternatively, sputtering a compound target, such as a metal oxide, metal sulfide or metal selenide, may also be used to provide the n-type layer, as described above, on the p-type portion 112*a* of the absorber layer 112.

With further reference to FIG. 1A, in accordance with the embodiment of the present invention, a conductive backing layer 108 may be disposed between the absorber layer 112 and the metallic substrate 104 to provide a diffusion barrier between the absorber layer 112 and the metallic substrate 104. The conductive backing layer 108 may include molybdenum, Mo, or other suitable metallic layer having a low propensity for interdiffusion with an absorber layer 112, such as one composed of CIGS material, as well as a low diffusion coefficient for constituents of the substrate. Moreover, the conductive backing layer 108 may provide other functions in addition to, or independent of, the diffusion-barrier function, for example, a light-reflecting function, for example, as a light-reflecting layer, to enhance the efficiency of the solar cell, as well as other functions. The embodiments recited above for the conductive backing layer 108 should not be construed as limiting the function of the conductive backing layer 108 to only those recited, as other functions of the conductive backing layer 108 are within the spirit and scope of embodiments of the present invention, as well.

Figure 1B:
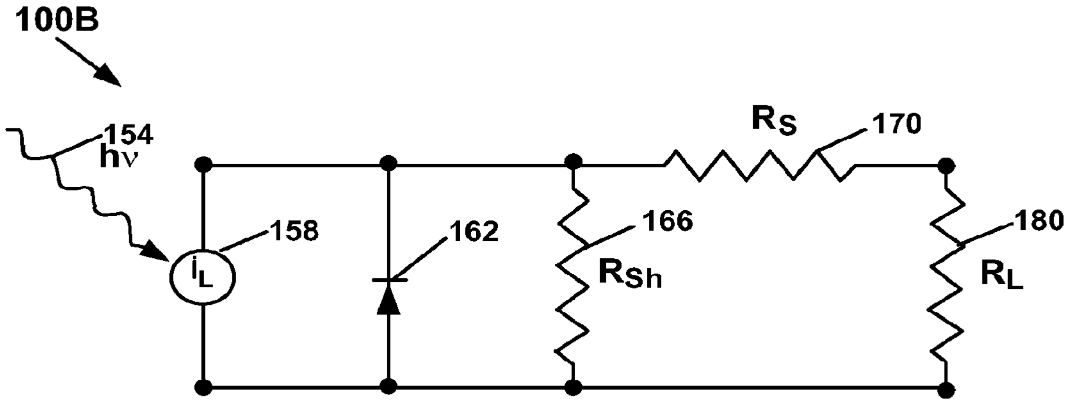
FIG. 1B is a schematic diagram of a model circuit of a solar cell, electrically connected to a load, in accordance with an embodiment of the present invention.

With reference now to FIG. 1B, in accordance with an embodiment of the present invention, a schematic diagram of a model circuit 100B of a solar cell that is electrically connected to a load is shown. The model circuit 100B of the solar cell includes a current source 158 that generates a photocurrent, $i_L$. As shown in FIG. 1A, the current source 158 is such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. The photocurrent, $i_L$, is produced when a plurality of incident photons, light particles, of which one example photon 154 with energy, hν, is shown, produce electron-hole pairs in the absorber layer 112 and these electron-hole pairs are separated by the pn homojunction 112*c*, or in the alternative, by a pn heterojunction as described above. It should be appreciated that the energy, hν, of each incident photon of the plurality of photons should exceed the band-gap energy, $E_g$, that separates the valence band from the conduction band of the absorber layer 112 to produce such electron-hole pairs, which result in the photocurrent, $i_L$.

The model circuit 100B of the solar cell further includes a diode 162, which corresponds to recombination currents, primarily at the pn homojunction 112*c*, that are shunted away from the connected load. As shown in FIG. 1B, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown. In addition, the model circuit 100B of the solar cell includes two parasitic resistances corresponding to a shunt resistor 166 with shunt resistance, $R_{Sh}$, and to a series resistor 170 with series resistance, $R_S$. The solar cell may be connected to a load represented by a load resistor 180 with load resistance, $R_L$. Thus, the circuit elements of the solar cell include the current source 158, the diode 162 and the shunt resistor 166 connected across the current source 158, and the series resistor 170 connected in series with the load resistor 180 across the current source 158, as shown. As the shunt resistor 166, like the diode 162, are connected across the current source 158, these two circuit elements are associated with internal electrical currents within the solar cell shunted away from useful application to the load. As the series resistor 170 connected in series with the load resistor 180 are connected across the current source 158, the series resistor 170 is associated with internal resistance of the solar cell that limits the electrical current to the load.

With further reference to FIG. 1B, it should be recognized that the shunt resistance may be associated with surface leakage currents that follow paths at free surfaces that cross the pn homojunction 112*c*; free surfaces are usually found at the edges of the solar cell along the side walls of the device that define its lateral dimensions; such free surfaces may also be found at discontinuities in the absorber layer 112 that extend past the pn homojunction 112*c*. The shunt resistance may also be associated with shunt defects which may be present that shunt electrical current away from the load. A small value of the shunt resistance, $R_{Sh}$, is undesirable as it lowers the open circuit voltage, $V_{OC}$, of the solar cell, which directly affects the efficiency of the solar cell. Moreover, it should also be recognized that the series resistance, $R_S$, is associated with: the contact resistance between the p-type portion 112*a* and the conductive backing layer 108, the bulk resistance of the p-type portion 112*a*, the bulk resistance of the n-type portion 112*b*, the contact resistance between the n-type portion 112*b* and TCO layer 116, and other components, such as conductive leads, and connections in series with the load. These latter sources of series resistance, conductive leads, and connections in series with the load, are germane to embodiments of the present invention as interconnect assemblies, which is subsequently described. A large value of the series resistance, $R_S$, is undesirable as it lowers the short circuit current, $I_{SC}$, of the solar cell, which also directly affects the efficiency of the solar cell.

Figure 2:
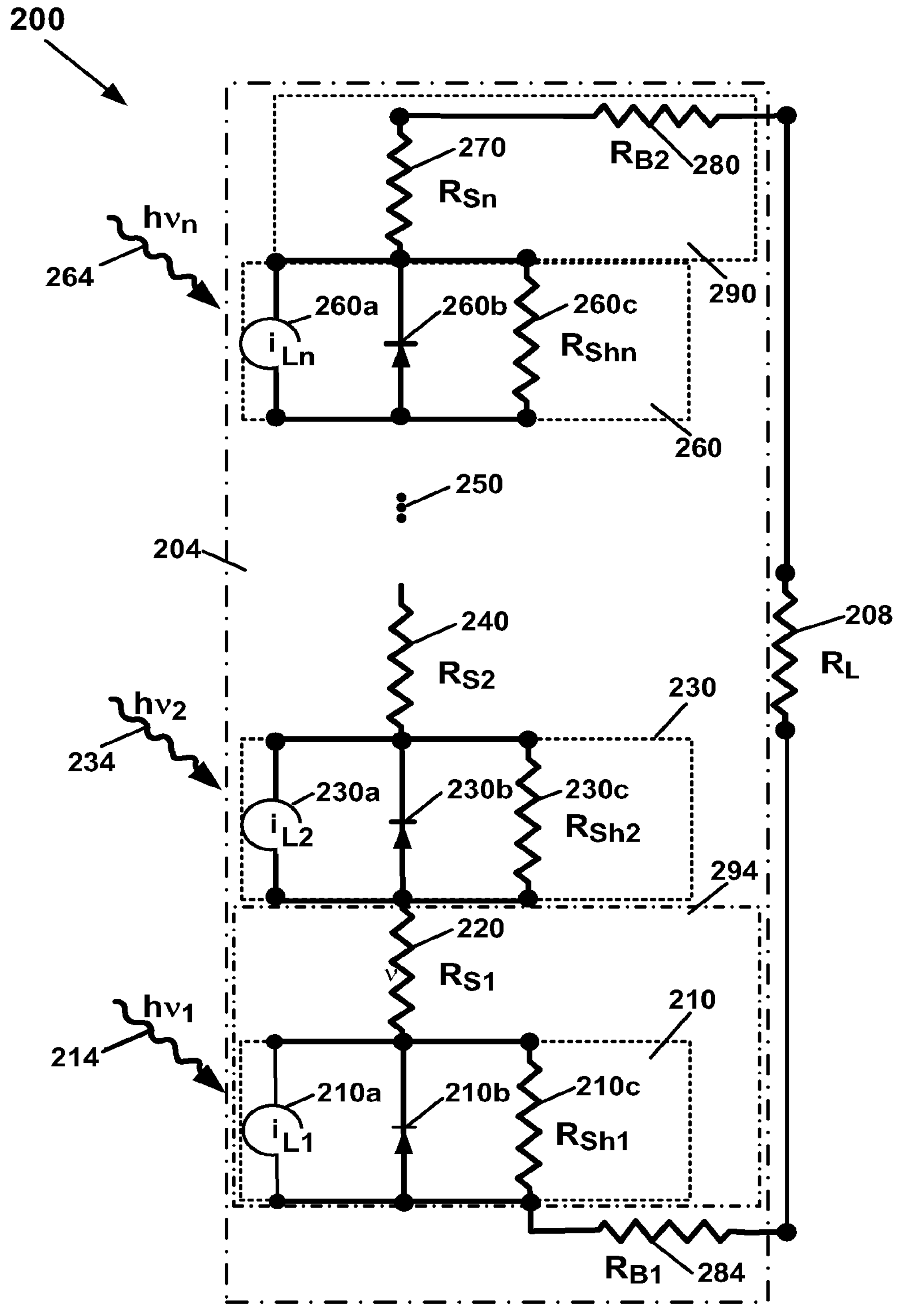
FIG. 2 is a schematic diagram of a model circuit of a solar-cell module, electrically connected to a load, that shows the interconnection of solar cells in the solar-cell module, in accordance with an embodiment of the present invention.

With reference now to FIG. 2, in accordance with an embodiment of the present invention, a schematic diagram of a model circuit 200 of a solar-cell module 204 that is coupled to a load is shown. The load is represented by a load resistor 208 with load resistance, $R_L$, as shown. The solar-cell module 204 of the model circuit 200 includes a plurality of solar cells: a first solar cell 210 including a current source 210*a* that generates a photocurrent, $i_{L1}$, produced by example photon 214 with energy, $h\nu_1$, a diode 210*b* and a shunt resistor 210*c* with shunt resistance, $R_{Sh1}$; a second solar cell 230 including a current source 230*a* that generates a photocurrent, $i_{L2}$, produced by example photon 234 with energy, $h\nu_2$, a diode 230*b* and a shunt resistor 230*c* with shunt resistance, $R_{Sh2}$; and, a terminating solar cell 260 including a current source 260*a* that generates a photocurrent, $i_{L3}$, produced by example photon 264 with energy, $h\nu_n$, a diode 260*b* and a shunt resistor 260*c* with shunt resistance, $R_{Shn}$. Parasitic series internal resistances of the respective solar cells 210, 230 and 260 have been omitted from the schematic diagram to simplify the discussion. Instead, series resistors with series resistances, $R_{S1}$, $R_{S2}$ and $R_{Sn}$ are shown disposed in the solar-cell module 204 of the model circuit 200 connected in series with the solar cells 210, 230 and 260 and the load resistor 208.

Figure 3:
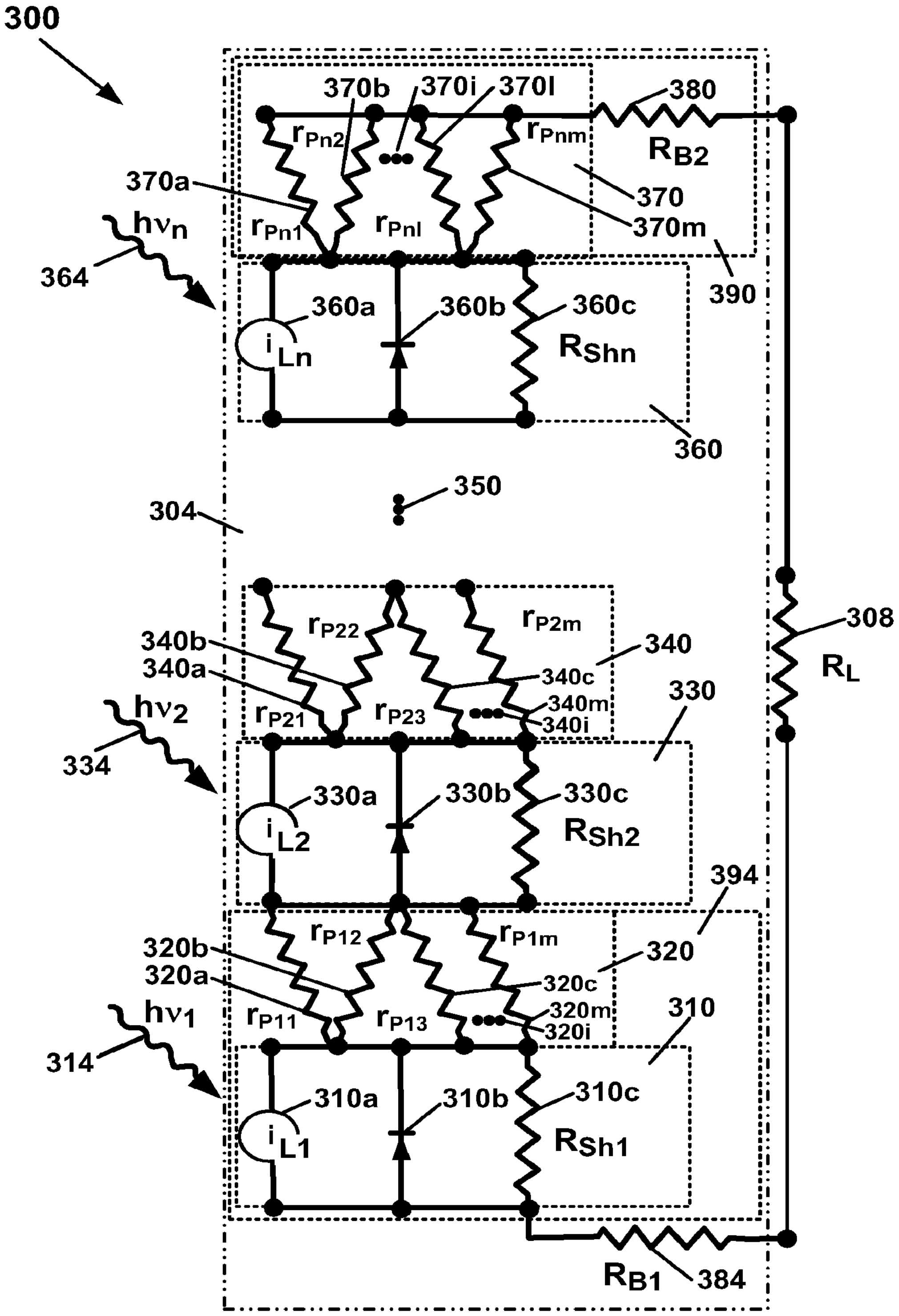
FIG. 3 is a schematic diagram of a model circuit of a solar-cell module, electrically connected to a load, that details model circuits of interconnect assemblies, in accordance with an embodiment of the present invention.

As shown in FIGS. 2 and 3, the current sources are such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. Similarly, as shown in FIGS. 2 and 3, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown.

With further reference to FIG. 2, in accordance with an embodiment of the present invention, the series resistors with series resistances $R_{S1}$ and $R_{S2}$ correspond to interconnect assemblies 220 and 240, respectively. Series resistor with series resistance, $R_{S1}$, corresponding to interconnect assembly 220 is shown configured both to collect current from the first solar cell 210 and to interconnect electrically to the second solar cell 230. Series resistor with series resistance, $R_{Sn}$, corresponds to an integrated solar-cell, current collector 270. The ellipsis 250 indicates additional solar cells and interconnect assemblies (not shown) coupled in alternating pairs in series in model circuit 200 that make up the solar-cell module 204. Also, in series with the solar cells 210, 230 and 260 are a first busbar 284 and a terminating busbar 280 with series resistances $R_{B1}$ and $R_{B2}$, respectively, that carry the electrical current generated by solar-cell module 204 to the load resistor 208. The series resistor with resistance $R_{Sn}$, corresponding to the integrated solar-cell, current collector 270, and $R_{B2}$, corresponding to the terminating busbar 280, in combination correspond to a integrated busbar-solar-cell-current collector 290 coupling the terminating solar cell 260 with the load resistor 208. In addition, series resistor with resistance $R_{S1}$, corresponding to interconnect assembly 220, and first solar cell 210 in combination correspond to a combined solar-cell, interconnect assembly 294.

As shown in FIG. 2 and as used herein, it should be noted that the phrases "to collect current," "collecting current" and "current collector" refer to collecting, transferring, and/or transmitting current carriers of either sign, whether they be positively charged holes or negatively charged electrons; for the structures shown in FIGS. 1A-B, 2, 3, 4A-F, 5A-C and 6A-B, in which an interconnect assembly is disposed above and electrically coupled to an n-type portion of the solar cell, the current carriers collected under normal operating conditions are negatively charged electrons. Moreover, embodiments of the present invention apply, without limitation thereto, to solar cell configurations where a p-type layer is disposed on an n-type absorber layer, in which case the current carriers collected may be positively charged holes, as would be the case for solar cells modeled by diodes and current sources of opposite polarity to those of FIGS. 1A-B, 2, 3, 4A-F, 5A-C and 6A-B. Therefore, in accordance with embodiments of the present invention, a current collector and associated interconnect assembly that collects current may, without limitation thereto, collect, transfer, and/or transmit charges associated with an electrical current, and/or charges associated with an electron-flow, as for either polarity of the diodes and current sources described herein, and thus for either configuration of a solar cell with an n-type layer disposed on and electrically coupled to a p-type absorber layer or a p-type layer disposed on and electrically coupled to an n-type absorber layer, as well as other solar cell configurations.

With further reference to FIG. 2, in accordance with an embodiment of the present invention, the series resistances of the interconnect assemblies 220 and 240, integrated solar-cell, current collector 270, and the interconnect assemblies included in ellipsis 250 can have a substantial net series resistance in the model circuit 200 of the solar-cell module 204, unless the series resistances of the interconnect assemblies 220 and 240, integrated solar-cell, current collector 270, and the interconnect assemblies included in ellipsis 250 are made small. If a large plurality of solar cells are connected in series, the short circuit current of the solar-cell module, $I_{SCM}$, may be reduced, which also directly affects the solar-cell-module efficiency analogous to the manner in which solar-cell efficiency is reduced by a parasitic series resistance, $R_S$, as described above with reference to FIG. 1. Embodiments of the present invention provide for diminishing the series resistances of the interconnect assemblies 220 and 240, integrated solar-cell, current collector 270, and the interconnect assemblies included in ellipsis 250.

With reference now to FIG. 3, in accordance with embodiments of the present invention, a schematic diagram of a model circuit 300 of a solar-cell module 304 is shown that illustrates embodiments of the present invention such that the series resistances of the interconnect assemblies 320 and 340, integrated solar-cell, current collector 370, and the interconnect assemblies included in ellipsis 350 are made small. The solar-cell module 304 is coupled to a load represented by a load resistor 308 with load resistance, $R_L$, as shown. The solar-cell module 304 of the model circuit 300 includes a plurality of solar cells: a first solar cell 310 including a current source 310*a* that generates a photocurrent, $i_{L1}$, produced by example photon 314 with energy, $h\nu_1$, a diode 310*b* and a shunt resistor 310*c* with shunt resistance, $R_{Sh1}$; a second solar cell 330 including a current source 330*a* that generates a photocurrent, $i_{L2}$, produced by example photon 334 with energy, $h\nu_2$, a diode 330*b* and a shunt resistor 330*c* with shunt resistance, $R_{Sh2}$; and, a terminating solar cell 360 including a current source 360*a* that generates a photocurrent, $i_{L3}$, produced by example photon 364 with energy, $h\nu_n$, a diode 360*b* and a shunt resistor 360*c* with shunt resistance, $R_{Shn}$.

With further reference to FIG. 3, in accordance with an embodiment of the present invention, the interconnect assemblies 320 and 340 and the integrated solar-cell, current collector 370, with respective equivalent series resistances $R_{S1}$, $R_{S2}$ and $R_{Sn}$ are shown disposed in the solar-cell module 304 of the model circuit 300 connected in series with the solar cells 310, 330 and 360 and the load resistor 308. The ellipsis 350 indicates additional solar cells and interconnect assemblies (not shown) coupled in alternating pairs in series in model circuit 300 that make up the solar-cell module 304. Also, in series with the solar cells 310, 330 and 360 are a first busbar 384 and a terminating busbar 380 with series resistances $R_{B1}$ and $R_{B2}$, respectively, that carry the electrical current generated by solar-cell module 304 to the load resistor 308. The integrated solar-cell, current collector 370 with resistance $R_{Sn}$, and the series resistor with series resistance $R_{B2}$, corresponding to the terminating busbar 380, in combination correspond to an integrated busbar-solar-cell-current collector 390 coupling the terminating solar cell 360 with the load resistor 308. In addition, interconnect assembly 320 with resistance, $R_{S2}$, and solar cell 310 in combination correspond to a combined solar-cell, interconnect assembly 394.

With further reference to FIG. 3, in accordance with embodiments of the present invention, the interconnect assembly 320 includes a trace including a plurality of electrically conductive portions, identified with resistors 320*a*, 320*b*, 320*c*, and 320*m* with respective resistances, $r_{P11}$, $r_{P12}$, $r_{P13}$ and $r_{P1m}$, and the ellipsis 320*i* indicating additional resistors (not shown). It should be noted that although the plurality of electrically conductive portions of the trace are modeled here as discrete resistors the interconnection with solar cell 330 is considerably more complicated involving the distributed resistance in the TCO layer of the solar cell, which has been omitted for the sake of elucidating functional features of embodiments of the present invention. Therefore, it should be understood that embodiments of the present invention may also include, without limitation thereto, the effects of such distributed resistances on the trace. The plurality of electrically conductive portions, without limitation thereto, identified with resistors 320*a*, 320*b*, 320*c*, 320*i*, and 320*m*, are configured both to collect current from the first solar cell 310 and to interconnect electrically to the second solar cell 330. The plurality of electrically conductive portions, identified with resistors 320*a*, 320*b*, 320*c*, 320*i*, and 320*m*, are configured such that upon interconnecting the first solar cell 310 and the second solar cell 330 the plurality of electrically conductive portions are connected electrically in parallel between the first solar cell 310 and the second solar cell 330.

Thus, in accordance with embodiments of the present invention, the plurality of electrically conductive portions is configured such that equivalent series resistance, $R_{S1}$, of the interconnect assembly 320 including the parallel network of resistors 320*a*, 320*b*, 320*c*, 320*i*, and 320*m*, is less than the resistance of any one resistor in the parallel network. Therefore, upon interconnecting the first solar cell 310 with the second solar cell 330, the equivalent series resistance, $R_{S1}$, of the interconnect assembly 320, is given approximately, omitting the effects of distributed resistances at the interconnects with the first and second solar cells 310 and 330, by the formula for a plurality of resistors connected electrically in parallel, viz. $R_{S1}=1/[\Sigma(1/r_{P1i})]$, where $r_{P1i}$ is the resistance of the ith resistor in the parallel-resistor network, and the sum, $\Sigma$, is taken over all of the resistors in the network from i=1 to m. Hence, by connecting the first solar cell 310 to the second solar cell 330, with the interconnect assembly 320, the series resistance, $R_{S1}$, of the interconnect assembly 320 can be reduced lowering the effective series resistance between solar cells in the solar-cell module 304 improving the solar-cell-module efficiency.

Moreover, in accordance with embodiments of the present invention, the configuration of the plurality of electrically conductive portions due to this parallel arrangement of electrically conductive portions between the first solar cell 310 and the second solar cell 330 provides a redundancy of electrical current carrying capacity between interconnected solar cells should one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of other parallel electrically conductive portions coupling the first solar cell 310 with the second solar cell 330. It should be noted that as used herein the phrase, "substantially undiminished," with respect to solar-cell efficiency means that the solar-cell efficiency is not reduced below an acceptable level of productive performance.

With further reference to FIG. 3, in accordance with embodiments of the present invention, the interconnect assembly 340 includes a trace including a plurality of electrically conductive portions identified with resistors 340*a*, 340*b*, 340*c*, and 340*m* with respective resistances, $r_{P21}$, $r_{P22}$, $r_{P23}$ and $r_{P2m}$, and the ellipsis 340*i* indicating additional resistors (not shown). The plurality of electrically conductive portions, without limitation thereto, identified with resistors 340*a*, 340*b*, 340*c*, 340*i*, and 340*m*, are configured both to collect current from a first solar cell 330 and to interconnect electrically to a second solar cell, in this case a next adjacent one of the plurality of solar cells represented by ellipsis 350. From this example, it should be clear that for embodiments of the present invention a first solar cell and a second solar cell refer, without limitation thereto, to just two adjacent solar cells configured in series in the solar-cell module, and need not be limited to a solar cell located first in line of a series of solar cells in a solar-cell module, nor a solar cell located second in line of a series of solar cells in a solar-cell module. The resistors 340*a*, 340*b*, 340*c*, 340*i*, and 340*m*, are configured such that upon interconnecting the first solar cell 330 and the second solar cell, in this case the next adjacent solar cell of the plurality of solar cells represented by ellipsis 350, the resistors 340*a*, 340*b*, 340*c*, 340*i*, and 340*m*, are coupled electrically in parallel between the first solar cell 330 and the second solar cell, the next adjacent solar cell of the plurality of solar cells represented by ellipsis 350.

Thus, in accordance with embodiments of the present invention, the plurality of electrically conductive portions is configured such that series resistance, $R_{S2}$, of the interconnect assembly 340 including the parallel network of resistors 340*a*, 340*b*, 340*c*, 340*i*, and 340*m*, is less than the resistance of any one resistor in the network. Hence, the series resistance, $R_{S2}$, of the interconnect assembly 340 can be reduced lowering the effective series resistance between solar cells in the solar-cell module improving the solar-cell-module efficiency of the solar-cell module 304. Moreover, the plurality of electrically conductive portions, identified with resistors 340*a*, 340*b*, 340*c*, 340*i*, and 340*m*, may be configured such that solar-cell efficiency is substantially undiminished in an event that any one of the plurality of electrically conductive portions is conductively impaired.

With further reference to FIG. 3, in accordance with embodiments of the present invention, the combined solar-cell, interconnect assembly 394 includes the first solar cell 310 and the interconnect assembly 320; the interconnect assembly 320 includes a trace disposed above a light-facing side of the first solar cell 310, the trace further including a plurality of electrically conductive portions, identified with resistors 320*a*, 320*b*, 320*c*, and 320*m* with respective resistances, $r_{P21}$, $r_{P22}$, $r_{P23}$ and $r_{P2m}$, and the ellipsis 320*i* indicating additional resistors (not shown). All electrically conductive portions of the plurality of electrically conductive portions, without limitation thereto, identified with resistors 320*a*, 320*b*, 320*c*, 320*i*, and 320*m*, are configured to collect current from the first solar cell 310 and to interconnect electrically to the second solar cell 330. In addition, the plurality of electrically conductive portions, identified with resistors 320*a*, 320*b*, 320*c*, 320*i*, and 320*m*, may be configured such that solar-cell efficiency is substantially undiminished in an event that any one of the plurality of electrically conductive portions is conductively impaired. Also, any of the plurality of electrically conductive portions, identified with resistors 320*a*, 320*b*, 320*c*, 320*i*, and 320*m*, may be configured to interconnect electrically to the second solar cell 330.

With further reference to FIG. 3, in accordance with embodiments of the present invention, the integrated busbar-solar-cell-current collector 390 includes the terminating busbar 380 and the integrated solar-cell, current collector 370. The integrated solar-cell, current collector 370 includes a trace including a plurality of electrically conductive portions, identified with resistors 370*a*, 370*b*, 3701, and 370*m* with respective resistances, $r_{Pn1}$, $r_{Pn2}$, $r_{Pnl}$ and $r_{Pnm}$, and the ellipsis 370*i* indicating additional resistors (not shown). The plurality of electrically conductive portions, without limitation thereto, identified with resistors 370*a*, 370*b*, 3701, 370*l* and 370*m*, are configured both to collect current from the first solar cell 310 and to interconnect electrically to the terminating busbar 380. The resistors 370*a*, 370*b*, 370*i*, 370*l* and 370*m*, are coupled electrically in parallel between the terminating solar cell 360 and the terminating busbar 380 series resistor with series resistance, $R_{B2}$. Thus, the plurality of electrically conductive portions is configured such that series resistance, $R_{Sn}$, of the interconnect assembly 340 including the parallel network of resistors 370*a*, 370*b*, 370*i*, 370*l* and 370*m*, is less than the resistance of any one resistor in the network.

In accordance with embodiments of the present invention, the integrated solar-cell, current collector 370 includes a plurality of integrated pairs of electrically conductive, electrically parallel trace portions. Resistors 370*a*, 370*b*, 370*l* and 370*m* with respective resistances, $r_{Pn1}$, $r_{Pn2}$, $r_{Pnl}$ and $r_{Pnm}$, and the ellipsis 370*i* indicating additional resistors (not shown) form such a plurality of integrated pairs of electrically conductive, electrically parallel trace portions when suitably paired as adjacent pair units connected electrically together as an integral unit over the terminating solar cell 360. For example, one such pair of the plurality of integrated pairs of electrically conductive, electrically parallel trace portions is pair of resistors 370*a* and 370*b* connected electrically together as an integral unit over the terminating solar cell 360, as shown. The plurality of integrated pairs of electrically conductive, electrically parallel trace portions are configured both to collect current from the terminating solar cell 360 and to interconnect electrically to the terminating busbar 380. Moreover, the plurality of integrated pairs of electrically conductive, electrically parallel trace portions is configured such that solar-cell efficiency is substantially undiminished in an event that any one electrically conductive, electrically parallel trace portion, for example, either one, but not both, of the resistors 370*a* and 370*b* of the integral pair, of the plurality of integrated pairs of electrically conductive, electrically parallel trace portions is conductively impaired.

With further reference to FIG. 3, in accordance with embodiments of the present invention, the solar-cell module 304 includes the first solar cell 310, at least the second solar cell 330 and the interconnect assembly 320 disposed above a light-facing side of an absorber layer of the first solar cell 310. The interconnect assembly 320 includes a trace including a plurality of electrically conductive portions, identified with resistors 320*a*, 320*b*, 320*c*, and 320*m* with respective resistances, $r_{P11}$, $r_{P12}$, $r_{P13}$ and $r_{P1m}$, and the ellipsis 320*i* indicating additional resistors (not shown). The plurality of electrically conductive portions is configured both to collect current from the first solar cell 310 and to interconnect electrically to the second solar cell 330. The plurality of electrically conductive portions is configured such that solar-cell efficiency is substantially undiminished in an event that any one of the plurality of electrically conductive portions is conductively impaired.

Figure 4A:
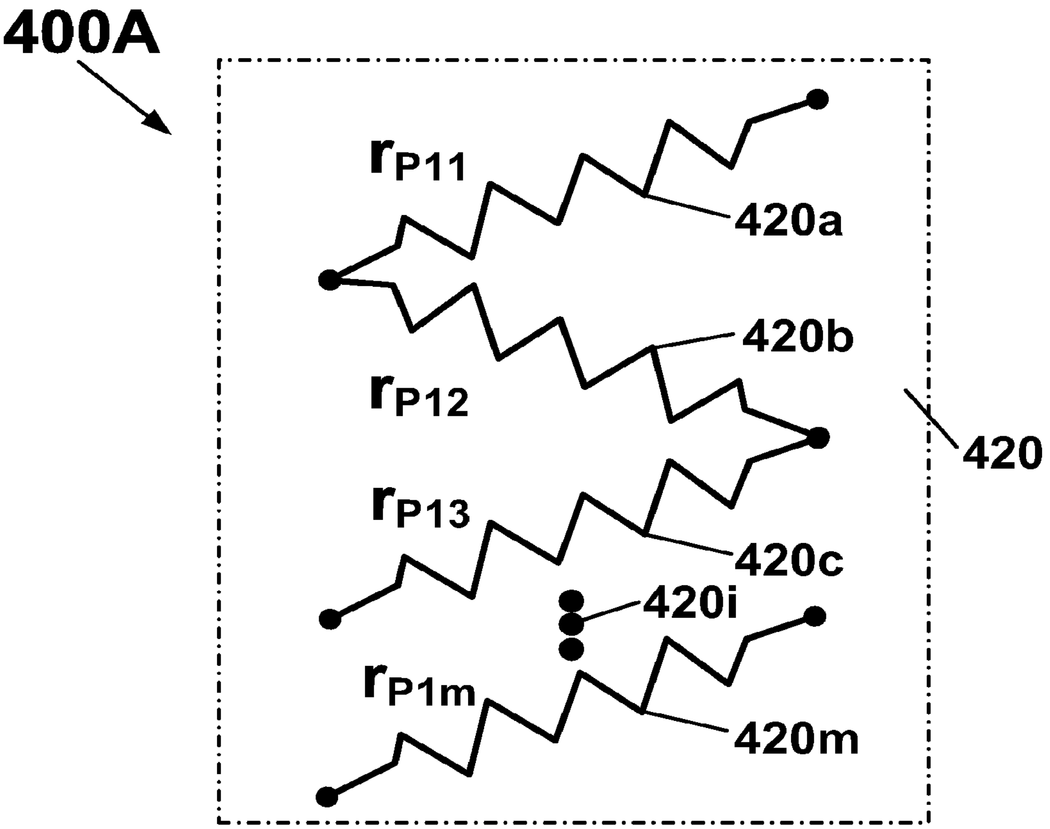
FIG. 4A is a schematic diagram of a model circuit of an interconnect assembly for connecting two solar cells of a solar-cell module, in accordance with an embodiment of the present invention.
Figure 4B:
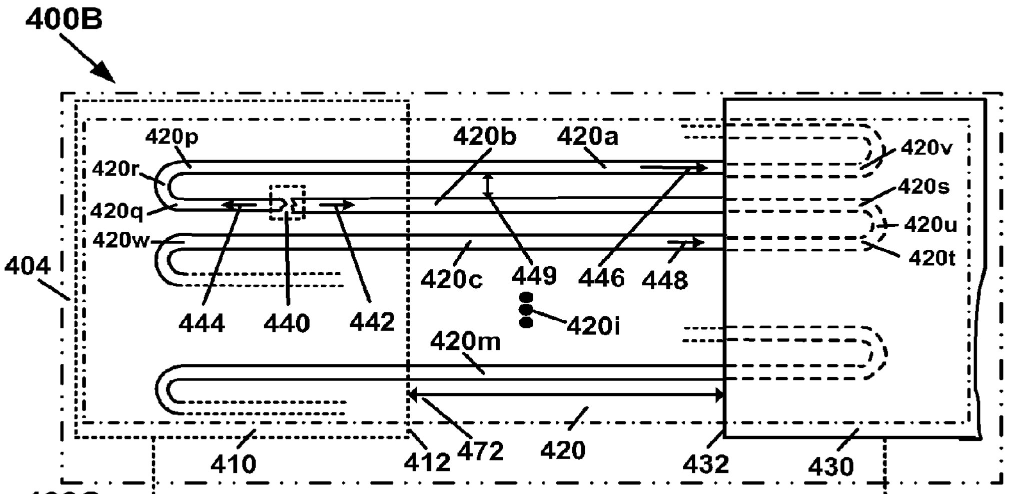
FIG. 4B is a plan view of the interconnect assembly of FIG. 4A that shows the physical interconnection of two solar cells in the solar-cell module, in accordance with an embodiment of the present invention.
Figure 4C:
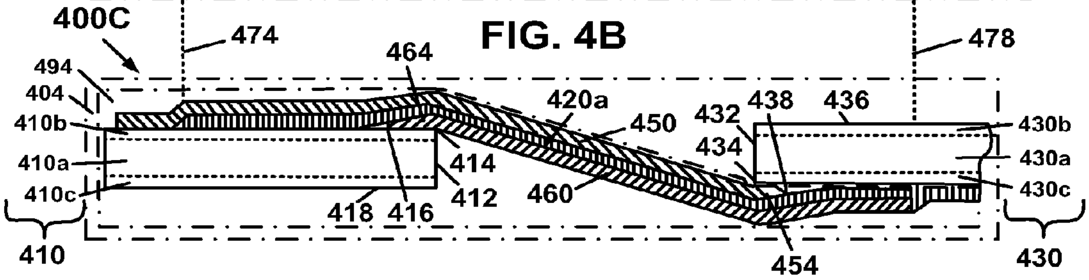
FIG. 4C is a cross-sectional, elevation view of the interconnect assembly of FIG. 4B that shows the physical interconnection of two solar cells in the solar-cell module, in accordance with an embodiment of the present invention.

With reference now to FIGS. 4A, 4B and 4C, in accordance with embodiments of the present invention, a schematic diagram of a model circuit 400A of an interconnect assembly 420 connecting a first solar cell 410 to a second solar cell 430 of a solar-cell module 404 is shown. The interconnect assembly 420 includes a trace including a plurality of electrically conductive portions, identified with resistors 420*a*, 420*b*, 420*c*, and 420*m* with respective resistances, $r_{P11}$, $r_{P12}$, $r_{P13}$ and $r_{P1m}$, and the ellipsis 420*i* indicating additional resistors (not shown). The plurality of electrically conductive portions, without limitation thereto, identified with resistors 420*a*, 420*b*, 420*c*, 420*i*, and 420*m*, are configured both to collect current from the first solar cell 410 and to interconnect electrically to the second solar cell 430. The plurality of electrically conductive portions, identified with resistors 420*a*, 420*b*, 420*c*, 420*i*, and 420*m*, are configured such that, upon interconnecting the first solar cell 410 and the second solar cell 430, the plurality of electrically conductive portions are connected electrically in parallel between the first solar cell 410 and the second solar cell 430. The plurality of electrically conductive portions is configured such that equivalent series resistance, $R_{S1}$, of the interconnect assembly 420 including the parallel network of resistors 420*a*, 420*b*, 420*c*, 420*i*, and 420*m*, is less than the resistance of any one resistor in the parallel network. Therefore, by connecting the first solar cell 410 to the second solar cell 430, with the interconnect assembly 420, the series resistance, $R_{S1}$, of the interconnect assembly 420 can be reduced lowering the effective series resistance between solar cells in the solar-cell module 404 improving the solar-cell-module efficiency.

Moreover, in accordance with embodiments of the present invention, the configuration of the plurality of electrically conductive portions due to this parallel arrangement of electrically conductive portions between the first solar cell 410 and the second solar cell 430 provides a redundancy of electrical current carrying capacity between interconnected solar cells should any one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of the unimpaired parallel electrically conductive portions coupling the first solar cell 410 with the second solar cell 430. It should be noted that as used herein the phrase, "substantially undiminished," with respect to solar-cell efficiency means that the solar-cell efficiency is not reduced below an acceptable level of productive performance. In addition, in accordance with embodiments of the present invention, the plurality of electrically conductive portions may be configured in pairs of electrically conductive portions, for example, identified with resistors 420*a* and 420*b*. Thus, the plurality of electrically conductive portions may be configured such that solar-cell efficiency is substantially undiminished even in an event that, in every pair of electrically conductive portions of the plurality of electrically conductive portions, one electrically conductive portion of the pair is conductively impaired. In accordance with embodiments of the present invention, each member of a pair of electrically conductive portions may be electrically equivalent to the other member of the pair, but need not be electrically equivalent to the other member of the pair, it only being necessary that in an event one member, a first member, of the pair becomes conductively impaired the other member, a second member, is configured such that solar-cell efficiency is substantially undiminished.

With further reference to FIGS. 4B and 4C, in accordance with embodiments of the present invention, a plan view 400B of the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above a light-facing side 416 of the absorber layer of the first solar cell 410. The interconnect assembly 420 includes a trace including a plurality of electrically conductive portions 420*a*, 420*b*, 420*c*, 420*i* and 420*m*, previously identified herein with the resistors 420*a*, 420*b*, 420*c*, 420*i* and 420*m* described in FIG. 400A, where the ellipsis of 420*i* indicates additional electrically conductive portions (not shown). The plurality of electrically conductive portions 420*a*, 420*b*, 420*c*, 420*i* and 420*m* is configured both to collect current from the first solar cell 410 and to interconnect electrically to the second solar cell 430. The plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired.

With further reference to FIG. 4B, in accordance with embodiments of the present invention, the detailed configuration of the plurality of electrically conductive portions 420*a*, 420*b*, 420*c*, 420*i* and 420*m* is shown. The plurality of electrically conductive portions 420*a*, 420*b*, 420*c*, 420*i* and 420*m* further includes a first portion 420*a* of the plurality of electrically conductive portions 420*a*, 420*b*, 420*c*, 420*i* and 420*m* configured both to collect current from the first solar cell 410 and to interconnect electrically to the second solar cell 430 and a second portion 420*b* of the plurality of electrically conductive portions 420*a*, 420*b*, 420*c*, 420*i* and 420*m* configured both to collect current from the first solar cell 410 and to interconnect electrically to the second solar cell 430. The first portion 420*a* includes a first end 420*p* distal from the second solar cell 430. Also, the second portion 420*b* includes a second end 420*q* distal from the second solar cell 430. The second portion 420*b* is disposed proximately to the first portion 420*a* and electrically connected to the first portion 420*a* such that the first distal end 420*p* is electrically connected to the second distal end 420*q*, for example, at first junction 420*r*, or by a linking portion, such that the second portion 420*b* is configured electrically in parallel to the first portion 420*a* when configured to interconnect to the second solar cell 430.

With further reference to FIG. 4B, in accordance with embodiments of the present invention, the plurality of electrically conductive portions 420*a*, 420*b*, 420*c*, 420*i* and 420*m* may further include the second portion 420*b* including a third end 420*s* distal from the first solar cell 410 and a third portion 420*c* of the plurality of electrically conductive portions 420*a*, 420*b*, 420*c*, 420*i* and 420*m* configured both to collect current from the first solar cell 410 and to interconnect electrically to the second solar cell 430. The third portion 420*c* includes a fourth end 420*t* distal from the first solar cell 410. The third portion 420*c* is disposed proximately to the second portion 420*b* and electrically connected to the second portion 420*b* such that the third distal end 420*s* is electrically connected to the fourth distal end 420*t*, for example, at second junction 420*u*, or by a linking portion, such that the third portion 420*c* is configured electrically in parallel to the second portion 420*b* when configured to interconnect with the first solar cell 430.

With further reference to FIGS. 4B and 4C, in accordance with embodiments of the present invention, it should be noted that the nature of the parallel connection between electrically conductive portions interconnecting a first solar cell and a second solar cell is such that, for distal ends of electrically conductive portions not directly joined together, without limitation thereto, the metallic substrate of a second solar cell and a TCO layer of the first solar cell may provide the necessary electrical coupling. For example, distal ends 420*v* and 420*s* are electrically coupled through a low resistance connection through a metallic substrate 430*c* of second solar cell 430. Similarly, for example, distal ends 420*w* and 420*q* are electrically coupled through the low resistance connection through the TCO layer 410*b* of first solar cell 410.

With further reference to FIG. 4B, in accordance with embodiments of the present invention, an open-circuit defect 440 is shown such that second portion 420*b* is conductively impaired. FIG. 4B illustrates the manner in which the plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired, for example, second portion 420*b*. An arrow 448 indicates the nominal electron-flow through a third portion 420*c* of the plurality of electrically conductive portions 420*a*, 420*b*, 420*c*, 420*i* and 420*m* essentially unaffected by open-circuit defect 440. In the absence of open-circuit defect 440, an electron-flow indicated by arrow 448 would normally flow through any one electrically conductive portion of the plurality of electrically conductive portions 420*a*, 420*b*, 420*c*, 420*i* and 420*m*, in particular, second portion 420*b*. However, when the open-circuit defect 440 is present, this electron-flow divides into two portions shown by arrows 442 and 444: arrow 442 corresponding to that portion of the normal electron-flow flowing to the right along the second portion 420*b* to the second solar cell 430, and arrow 444 corresponding to that portion of the normal electron-flow flowing to the left along the second portion 420*b* to the first portion 420*a* and then to the right along the first portion 420*a* to the second solar cell 430. Thus, the net electron-flow represented by arrow 446 flowing to the right along the first portion 420*a* is consequently larger than what would normally flow to the right along the first portion 420*a* to the second solar cell 430 in the absence of the open-circuit defect 440.

It should be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

With further reference to FIG. 4B, in accordance with embodiments of the present invention, the plurality of electrically conductive portions 420*a*, 420*b*, 420*c*, 420*i* and 420*m* may be connected electrically in series to form a single continuous electrically conductive line. Moreover, the trace that includes the plurality of electrically conductive portions 420*a*, 420*b*, 420*c*, 420*i* and 420*m* may be disposed in a serpentine pattern such that the interconnect assembly 420 is configured to collect current from the first solar cell 410 and to interconnect electrically to the second solar cell 430, as shown.

With further reference to FIG. 4C, in accordance with embodiments of the present invention, a cross-sectional, elevation view 400C of the interconnect assembly 420 is shown that further details the physical interconnection of two solar cells 410 and 430 in the solar-cell module 404. Projections 474 and 478 of planes orthogonal to both of the views in FIGS. 4B and 4C, and coincident with the ends of the plurality of electrically conductive portions 420*a*, 420*b*, 420*c*, 420*i* and 420*m* show the correspondence between features of the plan view 400B of FIG. 4B and features in the cross-sectional, elevation view 400C of FIG. 4C. Also, it should be noted that although the solar-cell module 404 is shown with separation 472 between the first solar cell 410 and the second solar cell 430, there need not be such separation 472 between the first solar cell 410 and the second solar cell 430. As shown in FIGS. 4B and 4C, a combined solar-cell, interconnect assembly 494 includes the first solar cell 410 and the interconnect assembly 420. The interconnect assembly 420 includes the trace disposed above the light-facing side 416 of the first solar cell 410, the trace further including the plurality of electrically conductive portions 420*a*, 420*b*, 420*c*, 420*i* and 420*m*. All electrically conductive portions of the plurality of electrically conductive portions 420*a*, 420*b*, 420*c*, 420*i* and 420*m* are configured to collect current from the first solar cell 410 and to interconnect electrically to the second solar cell 430. In addition, the plurality of electrically conductive portions 420*a*, 420*b*, 420*c*, 420*i* and 420*m* may be configured such that solar-cell efficiency is substantially undiminished in an event that any one of the plurality of electrically conductive portions 420*a*, 420*b*, 420*c*, 420*i* and 420*m* is conductively impaired. Also, any of the plurality of electrically conductive portions 420*a*, 420*b*, 420*c*, 420*i* and 420*m* may be configured to interconnect electrically to the second solar cell 430. The first solar cell 410 of the combined solar-cell, interconnect assembly 494 may include a metallic substrate 410*c* and an absorber layer 410*a*. The absorber layer 410*a* of the first solar cell 410 may include copper indium gallium diselenide (CIGS). Alternatively, other semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 410*a*. Moreover, in embodiments of the present invention, it should be noted that semiconductors, such as silicon and cadmium telluride, as well as other semiconductors, may be used as the absorber layer 410*a*.

With further reference to FIG. 4C, in accordance with embodiments of the present invention, the plurality of electrically conductive portions 420*a*, 420*b*, 420*c*, 420*i* and 420*m* of the combined solar-cell, interconnect assembly 494 further includes the first portion 420*a* of the plurality of electrically conductive portions 420*a*, 420*b*, 420*c*, 420*i* and 420*m* configured to collect current from the first solar cell 410 and the second portion 420*b* of the plurality of electrically conductive portions 420*a*, 420*b*, 420*c*, 420*i* and 420*m* configured to collect current from the first solar cell 410. The first portion 420*a* includes the first end 420*p* distal from an edge 414 of the first solar cell 410. The second portion 420*b* includes the second end 420*q* distal from the edge 414 of the first solar cell 410. The second portion 420*b* is disposed proximately to the first portion 420*a* and electrically connected to the first portion 420*a* such that the first distal end 420*p* is electrically connected to the second distal end 420*q* such that the second portion 420*b* is configured electrically in parallel to the first portion 420*a* when configured to interconnect to the second solar cell 430.

With further reference to FIG. 4C, in accordance with embodiments of the present invention, the interconnect assembly 420 further includes a top carrier film 450. The top carrier film 450 includes a first substantially transparent, electrically insulating layer coupled to the trace and disposed above a top portion of the trace. The first substantially transparent, electrically insulating layer allows for forming a short-circuit-preventing portion 454 at an edge 434 of the second solar cell 430. The first substantially transparent, electrically insulating layer allows for forming the short-circuit-preventing portion 454 at the edge 434 of the second solar cell 430 to prevent the first portion 420*a* from short circuiting an absorber layer 430*a* of the second solar cell 430 in the event that the first portion 420*a* buckles and rides up a side 432 of second solar cell 430. The edge 434 is located at the intersection of the side 432 of the second solar cell 430 and a back side 438 of the second solar cell 430 that couples with the plurality of electrically conductive portions 420*a*, 420*b*, 420*c*, 420*i* and 420*m*, for example, first portion 420*a* as shown. The second solar cell 430 may include the absorber layer 430*a*, a TCO layer 430*b*, and the metallic substrate 430*c*; a backing layer (not shown) may also be disposed between the absorber layer 430*a* and the metallic substrate 430*c*. Above a light-facing side 436 of the second solar cell 430, an integrated busbar-solar-cell-current collector (not shown in FIG. 4C, but which is shown in FIGS. 6A and 6B) may be disposed and coupled to the second solar cell 430 to provide interconnection with a load (not shown). Alternatively, above the light-facing side 436 of the second solar cell 430, another interconnect assembly (not shown) may be disposed and coupled to the second solar cell 430 to provide interconnection with additional solar-cells (not shown) in the solar-cell module 404.

With further reference to FIG. 4C, in accordance with embodiments of the present invention, the interconnect assembly 420 further includes a bottom carrier film 460. The bottom carrier film 460 may include a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming an edge-protecting portion 464 at the edge 414 of the first solar cell 410. Alternatively, a supplementary isolation strip (not shown) of a third electrically insulating layer may be disposed between the bottom carrier film 460 and the first portion 420*a* of the plurality of electrically conductive portions 420*a*, 420*b*, 420*c*, 420*i* and 420*m*, or alternatively between the bottom carrier film 460 and the edge 414, to provide additional protection at the edge 414. The supplementary isolation strip may be as wide as 5 millimeters (mm) in the direction of the double-headed arrow showing the separation 472, and may extend along the full length of a side 412 of the first solar cell 410. The edge 414 is located at the intersection of the side 412 of the first solar cell 410 and a light-facing side 416 of the first solar cell 410 that couples with the plurality of electrically conductive portions 420*a*, 420*b*, 420*c*, 420*i* and 420*m*, for example, first portion 420*a* as shown. The first solar cell 410 may include the absorber layer 410*a*, the TCO layer 410*b*, and the metallic substrate 410*c*; a backing layer (not shown) may also be disposed between the absorber layer 410*a* and the metallic substrate 410*c*. Below a back side 418 of the first solar cell 410, a first busbar (not shown) may be disposed and coupled to the first solar cell 410 to provide interconnection with a load (not shown). Alternatively, below the back side 418 of the first solar cell 410, another interconnect assembly (not shown) may be disposed and coupled to the first solar cell 410 to provide interconnection with additional solar-cells (not shown) in the solar-cell module 404.

Figure 4D:
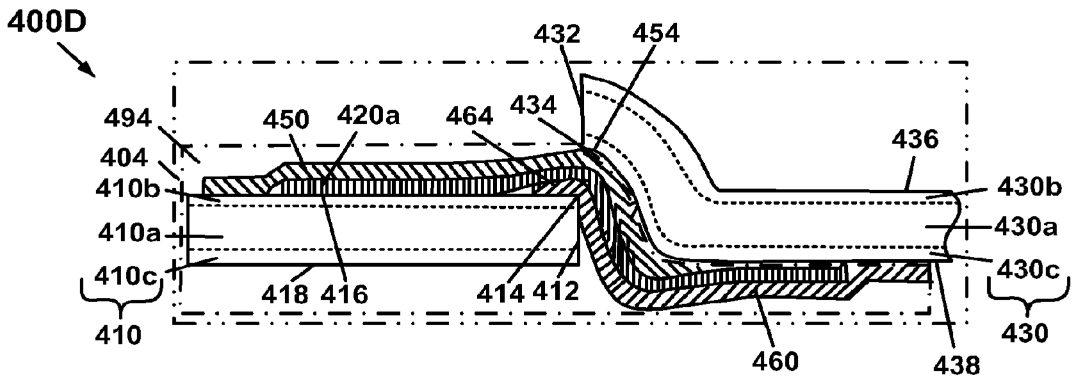
FIG. 4D is a cross-sectional, elevation view of an alternative interconnect assembly for FIG. 4B that shows an edge-conforming interconnect assembly for the physical interconnection of two solar cells in the solar-cell module, in accordance with an embodiment of the present invention.
Figure 4E:
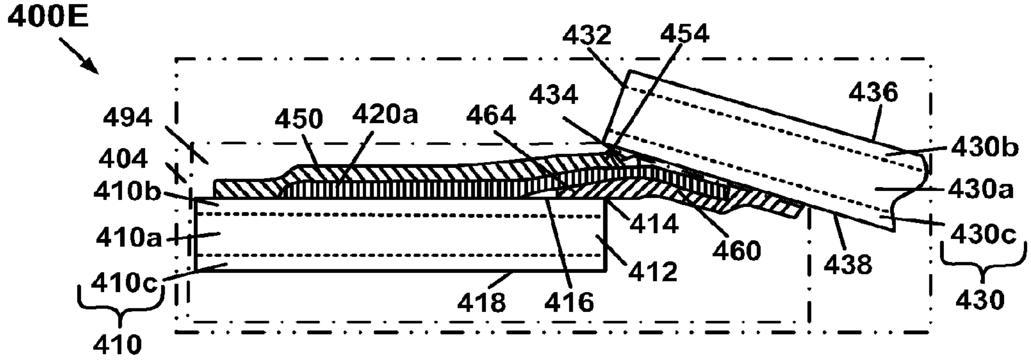
FIG. 4E is a cross-sectional, elevation view of an alternative interconnect assembly for FIG. 4B that shows a shingled-solar-cell arrangement for the physical interconnection of two solar cells in the solar-cell module, in accordance with an embodiment of the present invention.

With reference now to FIGS. 4D and 4E, in accordance with embodiments of the present invention, cross-sectional, elevation views 400D and 400E, respectively, of two alternative interconnect assemblies that minimize the separation 472 (see FIG. 4B) between the first solar cell 410 and the second solar cell 430 to improve the solar-cell-module efficiency of the solar-cell module 404 are shown. In both examples shown in FIGS. 4D and 4E, the side 412 of the first solar cell 410 essentially coincides with the side 432 of the second solar cell 430. It should be noted that as used herein the phrase, "essentially coincides," with respect to the side 412 of the first solar cell 410 and the side 432 of the second solar cell 430 means that there is little or no separation 472 between the first solar cell 410 and the second solar cell 430, and little or no overlap of the first solar cell 410 with the second solar cell 430 so that there is less wasted space and open area between the solar cells 410 and 430, which improves the solar-collection efficiency of the solar-cell module 404 resulting in improved solar-cell-module efficiency. FIG. 4D shows an edge-conforming interconnect assembly for the physical interconnection of the two solar cells 410 and 430 in the solar-cell module 404. FIG. 4E shows a shingled-solar-cell arrangement for the physical interconnection of the two solar cells 410 and 430 in the solar-cell module 404. For both the edge-conforming interconnect assembly of FIG. 4D and the shingled-solar-cell arrangement of FIG. 4E, the interconnect assembly 420 further includes the bottom carrier film 460. The bottom carrier film 460 includes a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming the edge-protecting portion 464 at the edge 414 of the first solar cell 410. In the case of the edge-conforming interconnect assembly shown in FIG. 4D, the bottom carrier film 460 and the first portion 420*a* of the interconnect assembly 420 may be relatively flexible and compliant allowing them to wrap around the edge 414 and down the side 412 of the first solar cell 410, as shown. The edge 414 is located at the intersection of the side 412 of the first solar cell 410 and the light-facing side 416 of the first solar cell 410 that couples with the plurality of electrically conductive portions 420*a*, 420*b*, 420*c*, 420*i* and 420*m*, for example, first portion 420*a* as shown. The first solar cell 410 may include the absorber layer 410*a*, a TCO layer 410*b*, and the metallic substrate 410*c*; a backing layer (not shown) may also be disposed between the absorber layer 410*a* and the metallic substrate 410*c*. Below the back side 418 of the first solar cell 410, another interconnect assembly (not shown) or first busbar (not shown) may be disposed and coupled to the first solar cell 410 as described above for FIG. 4C. If an additional solar cell (not shown) is interconnected to the back side 418 of the first solar cell 410 as in the shingled-solar-cell arrangement of FIG. 4E, the first solar cell 410 would be pitched upward at its left-hand side and interconnected to another interconnect assembly similar to the manner in which the second solar cell 430 is shown interconnected with solar cell 410 at side 412 in FIG. 4E.

With further reference to FIGS. 4D and 4E, in accordance with embodiments of the present invention, the interconnect assembly 420 further includes the top carrier film 450. The top carrier film 450 includes a first substantially transparent, electrically insulating layer coupled to the trace and disposed above a top portion of the trace. The first substantially transparent, electrically insulating layer allows for forming the short-circuit-preventing portion 454 at the edge 434 of the second solar cell 430 to prevent the first portion 420*a* from short circuiting the absorber layer 430*a* of the second solar cell 430 in the event that the first portion 420*a* rides up the side 432 of second solar cell 430. The edge 434 is located at the intersection of the side 432 of the second solar cell 430 and the back side 438 of the second solar cell 430 that couples with the plurality of electrically conductive portions 420*a*, 420*b*, 420*c*, 420*i* and 420*m*, for example, first portion 420*a* as shown. In the case of the edge-conforming interconnect assembly shown in FIG. 4D, the top carrier film 450 may be relatively flexible and compliant allowing it to follow the conformation of the bottom carrier film 460 and the first portion 420*a* of the interconnect assembly 420 underlying it that wrap around the edge 414 and down the side 412 of the first solar cell 410, as shown. The second solar cell 430 may include the absorber layer 430*a*, the TCO layer 430*b*, and the metallic substrate 430*c*; a backing layer (not shown) may also be disposed between the absorber layer 430*a* and the metallic substrate 430*c*. Also, in the case of the edge-conforming interconnect assembly, the absorber layer 430*a*, TCO layer 430*b*, and metallic substrate 430*c* of the second solar cell 430 may be relatively flexible and compliant allowing them to follow the conformation of the underlying interconnect assembly 420 that wraps around the edge 414 and down the side 412 of the first solar cell 410. Above the light-facing side 436 of the second solar cell 430, an integrated busbar-solar-cell-current collector (not shown in FIG. 4C, but which is shown in FIGS. 6A and 6B), or alternatively another interconnect assembly (not shown), may be disposed on and coupled to the second solar cell 430, as described above for FIG. 4C.

Figure 4F:
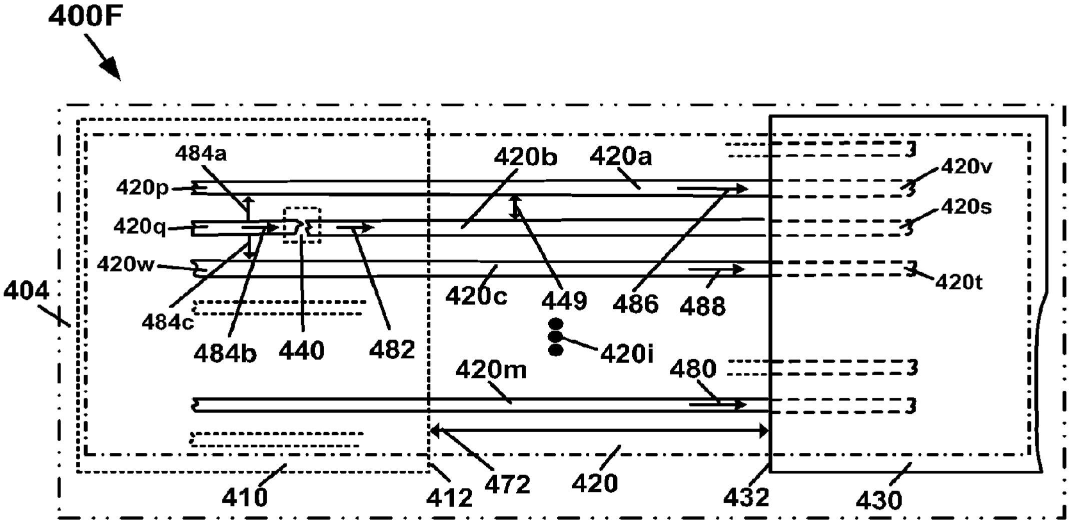
FIG. 4F is a plan view of an alternative interconnect assembly for FIG. 4A that shows the physical interconnection of two solar cells in the solar-cell module, in accordance with an embodiment of the present invention.

With reference now to FIG. 4F, in accordance with embodiments of the present invention, a plan view 400F of an alternative interconnect assembly for the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above the light-facing side 416 of the absorber layer of the first solar cell 410. The edges 414 and 434 of the solar cells 410 and 430 may be separated by the separation 472 as shown in FIG. 4F; or alternatively, the edges 414 and 434 of the solar cells 410 and 430 may essentially coincide as discussed above for FIGS. 4D and 4E. The interconnect assembly 420 includes a trace including a plurality of electrically conductive portions 420*a*, 420*b*, 420*c*, 420*i* and 420*m*, previously identified herein with the resistors 420*a*, 420*b*, 420*c*, 420*i* and 420*m* described in FIG. 400A, where the ellipsis of 420*i* indicates additional electrically conductive portions (not shown). The plurality of electrically conductive portions 420*a*, 420*b*, 420*c*, 420*i* and 420*m* is configured both to collect current from the first solar cell 410 and to interconnect electrically to the second solar cell 430. The plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired.

With further reference to FIG. 4F, in accordance with embodiments of the present invention, the detailed configuration of the plurality of electrically conductive portions 420*a*, 420*b*, 420*c*, 420*i* and 420*m* is shown without electrically connecting trace portions, for example, junctions formed in the trace or linking portions of the trace. For example, in the case where electrically connecting trace portions of the trace have been cut away, removed, or are otherwise absent, from the distal ends of the plurality of electrically conductive portions 420*a*, 420*b*, 420*c*, 420*i* and 420*m*, as shown in FIG. 4F. The plurality of electrically conductive portions 420*a*, 420*b*, 420*c*, 420*i* and 420*m* may be linked together instead indirectly by the TCO layer 410*b* of the first solar cell 410 at distal ends of the trace disposed over the first solar cell 410, for example, first distal end 420*p* of first portion 420*a* and second distal end 420*q* of second portion 420*b* by portions of the TCO layer 410*b* of the first solar cell 410 that lie in between the distal ends 420*p* and 420*q*. In like fashion, the distal ends 420*w* and 420*q* are electrically coupled through the low resistance connection through the TCO layer 410*b* of first solar cell 410. Similarly, the plurality of electrically conductive portions 420*a*, 420*b*, 420*c*, 420*i* and 420*m* may be linked together instead indirectly by the metallic substrate 430*c*, or intervening backing layer (not shown), of the first solar cell 430 at distal ends of the trace disposed under the second solar cell 430, for example, third distal end 420*s* of second portion 420*b* and fourth distal end 420*t* of third portion 420*c* by portions of the metallic substrate 430*c* of the second solar cell 430 that lie in between the distal ends 420*s* and 420*t*. In like fashion, the distal ends 420*v* and 420*s* are electrically coupled through a low resistance connection through the metallic substrate 430*c* of second solar cell 430.

With further reference to FIG. 4F, in accordance with embodiments of the present invention, the open-circuit defect 440 is shown such that second portion 420*b* is conductively impaired. FIG. 4F illustrates the manner in which the plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired, for example, second portion 420*b*. An arrow 480 indicates the nominal electron-flow through an m-th portion 420*m* of the plurality of electrically conductive portions 420*a*, 420*b*, 420*c*, 420*i* and 420*m* essentially unaffected by open-circuit defect 440. In the absence of open-circuit defect 440, an electron-flow indicated by arrow 480 would normally flow through any one electrically conductive portion of the plurality of electrically conductive portions 420*a*, 420*b*, 420*c*, 420*i* and 420*m*, in particular, second portion 420*b*. However, when the open-circuit defect 440 is present, portions of this electron-flow are lost to adjacent electrically conductive portions 420*a* and 420*c* shown by arrows 484*a* and 484*c*; arrow 482 corresponds to that portion of the normal electron-flow flowing to the right along the second portion 420*b* to the second solar cell 430, and arrow 484*b* corresponds to that portion of the normal electron-flow that would bridge the open-circuit defect 440 by flowing through the higher resistance path of the TCO layer 410*b* bridging across the two portions of second portion 420*b* on either side of the open-circuit defect 440. Thus, the net electron-flow represented by arrow 486 flowing to the right along the first portion 420*a* is consequently larger than what would normally flow to the right along the first portion 420*a* to the second solar cell 430 in the absence of the open-circuit defect 440; and, the net electron-flow represented by arrow 488 flowing to the right along the third portion 420*c* is consequently larger than what would normally flow to the right along the third portion 420*c* to the second solar cell 430 in the absence of the open-circuit defect 440.

Moreover, in the case of the alternative interconnect assembly depicted in FIG. 4F, as stated before for the interconnect assembly depicted in FIG. 4B, it should again be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

Figure 5A:
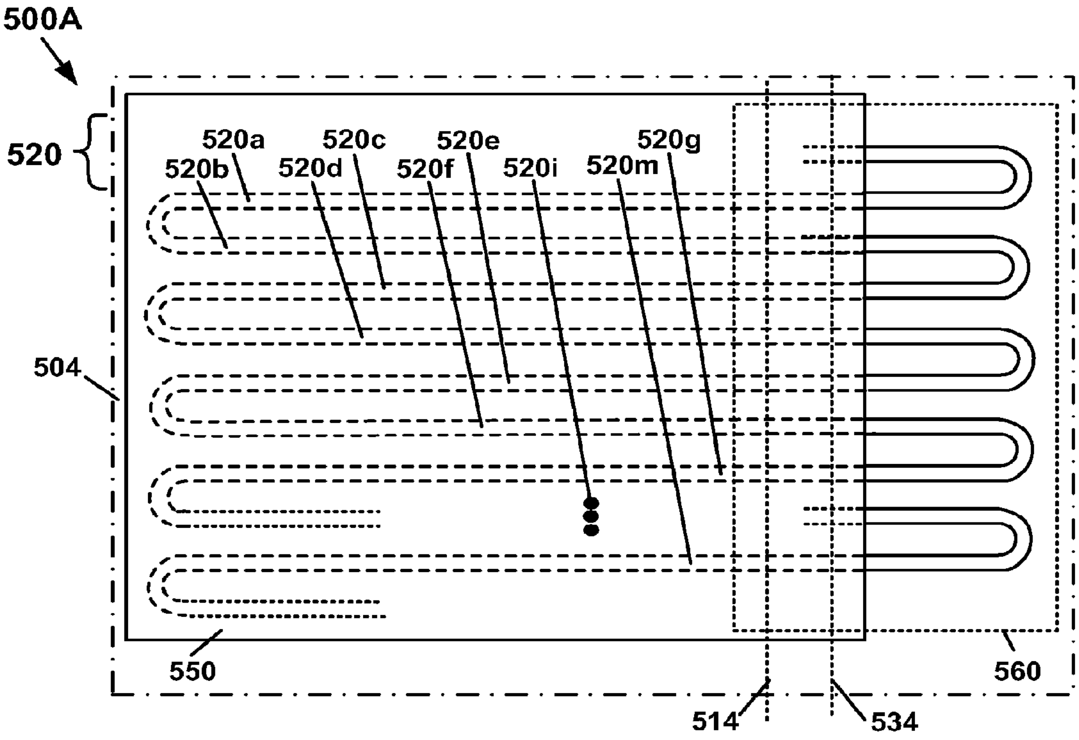
FIG. 5A is a plan view of the combined applicable carrier film, interconnect assembly that shows the physical arrangement of a trace with respect to a top carrier film and a bottom carrier film in the combined applicable carrier film, interconnect assembly, in accordance with an embodiment of the present invention.

With reference now to FIG. 5A, in accordance with embodiments of the present invention, a plan view 500A of the combined applicable carrier film, interconnect assembly 504 is shown. FIG. 5A shows the physical arrangement of a trace 520 with respect to a top carrier film 550 and a bottom carrier film 560 in the combined applicable carrier film, interconnect assembly 504. The combined applicable carrier film, interconnect assembly 504 includes the top carrier film 550 and the trace 520 including a plurality of electrically conductive portions 520*a*, 520*b*, 520*c*, 520*d*, 520*e*, 520*f*, 520*g*, 520*m* and 520*i*, the latter corresponding to the ellipsis indicating additional electrically conductive portions (not shown). The plurality of electrically conductive portions 520*a* through 520*m* is configured both to collect current from a first solar cell 510 (shown in FIG. 5C) and to interconnect electrically to a second solar cell (not shown). As shown in FIG. 5A, the plurality of electrically conductive portions 520*a* through 520*m* run over the top of the first solar cell 510 on the left and over an edge 514 of the first solar cell 510 to the right under an edge 534 of, and underneath, the second solar cell (not shown). The top carrier film 550 includes a first substantially transparent, electrically insulating layer 550A (shown in FIG. 5B). The plurality of electrically conductive portions 520*a* through 520*m* is configured such that solar-cell efficiency is substantially undiminished in an event that any one of the plurality of electrically conductive portions 520*a* through 520*m* is conductively impaired. It should be noted that as used herein the phrase, "substantially transparent," with respect to a substantially transparent, electrically insulating layer means that light passes through the substantially transparent, electrically insulating layer with negligible absorption. The first substantially transparent, electrically insulating layer 550*a* is coupled to the trace 520 and disposed above a top portion of the trace 520 (shown in FIG. 5B) as indicated by the dashed portions of the trace 520 on the left of FIG. 5A.

Figure 5B:
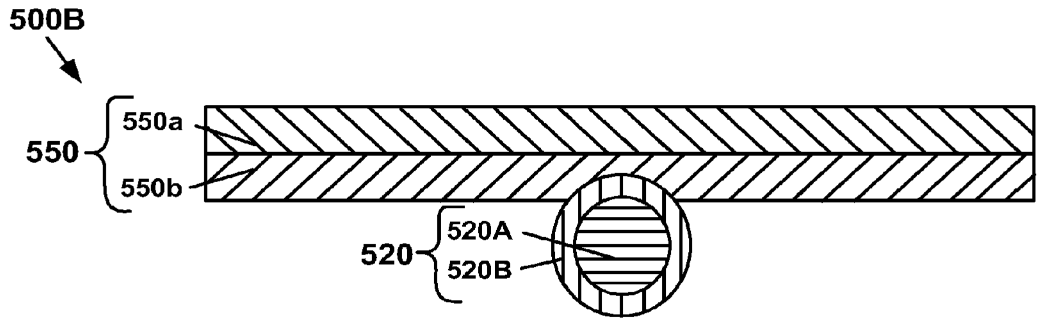
FIG. 5B is a cross-sectional, elevation view of the combined applicable carrier film, interconnect assembly of FIG. 5A that shows the physical arrangement of a trace with respect to a top carrier film in the combined applicable carrier film, interconnect assembly prior to disposition on a solar cell, in accordance with an embodiment of the present invention.
Figure 5C:
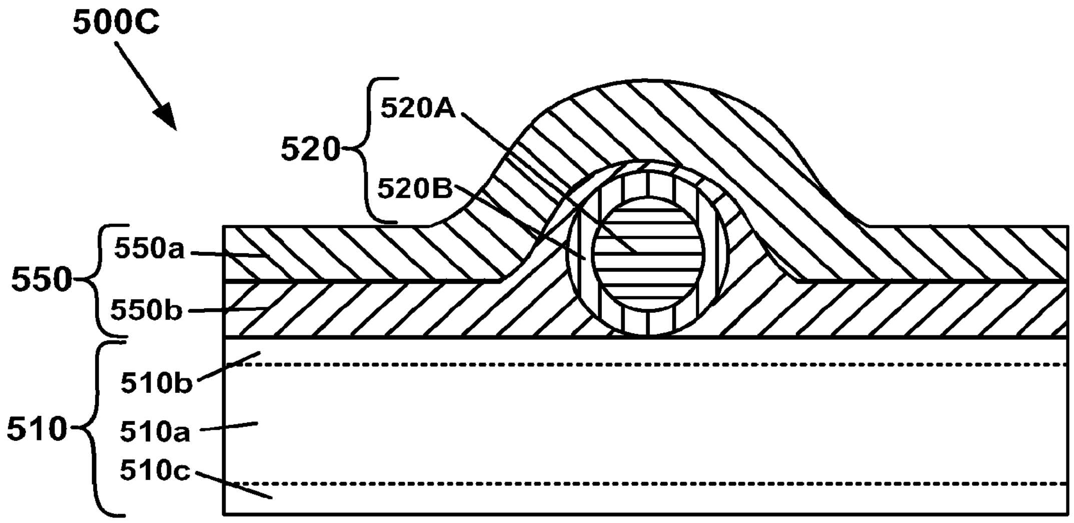
FIG. 5C is a cross-sectional, elevation view of the interconnect assembly of FIG. 5B that shows the physical arrangement of a trace with respect to a top carrier film in the combined applicable carrier film, interconnect assembly after disposition on a solar cell, in accordance with an embodiment of the present invention.
Figures 6A, 6B:
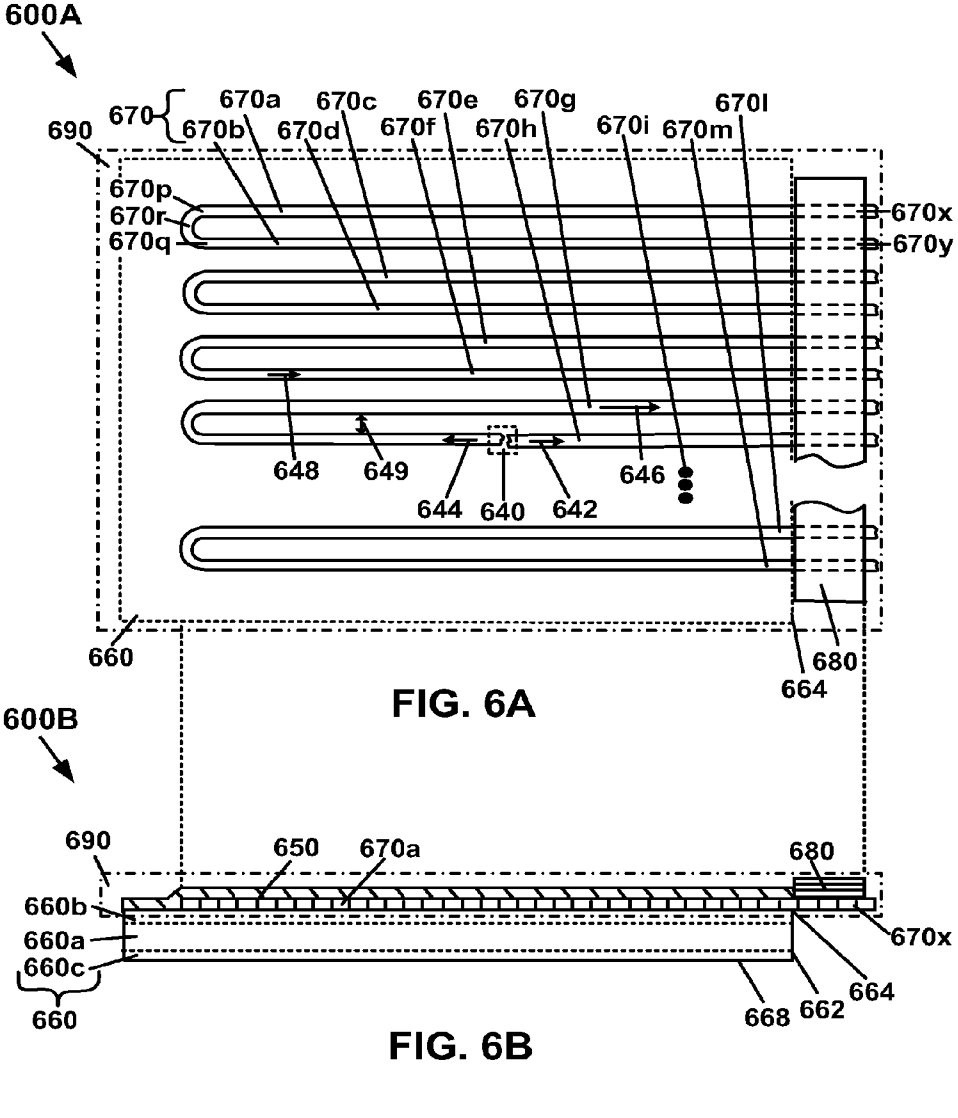
FIG. 6A is a plan view of an integrated busbar-solar-cell-current collector that shows the physical interconnection of a terminating solar cell with a terminating busbar in the integrated busbar-solar-cell-current collector, in accordance with an embodiment of the present invention.
FIG. 6B is a cross-sectional, elevation view of the integrated busbar-solar-cell-current collector of FIG. 6A that shows the physical interconnection of the terminating solar cell with the terminating busbar in the integrated busbar-solar-cell-current collector, in accordance with an embodiment of the present invention.

With reference now to FIGS. 5B and 5C, in accordance with embodiments of the present invention, a cross-sectional, elevation view of the combined applicable carrier film, interconnect assembly 504 of FIG. 5A is shown. As shown in FIGS. 5B and 5C, the cross-section of the view is taken along a cut parallel to the edge 514 of the first solar cell 510. The cross-sectional, elevation view of FIG. 5B shows the physical arrangement of the trace 520 with respect to the top carrier film 550 in the combined applicable carrier film, interconnect assembly 504 prior to disposition on the first solar cell 510. On the other hand, the cross-sectional, elevation view of FIG. 5C shows the physical arrangement of the trace 520 with respect to the top carrier film 550 and the first solar cell 510 of the combined applicable carrier film, interconnect assembly 504 after it couples with the first solar cell 510. The top carrier film 550 and the trace 520 are configured for applying to a light-facing side of the first solar cell 510 both to collect current from the first solar cell 510 and to interconnect electrically to the second solar cell (not shown). The first solar cell 510 may include an absorber layer 510*a*, a TCO layer 510*b*, and a metallic substrate 510*c*; the backing layer (not shown) may also be disposed between the absorber layer 510*a* and the metallic substrate 510*c*. The first substantially transparent, electrically insulating layer 550*a* holds the trace 520 down in contact with the first solar cell 510 and allows for forming a short-circuit-preventing portion at an edge of the second solar cell (not shown). The top carrier film 550 further includes a first substantially transparent, adhesive medium 550*b* coupling the trace 520 to the substantially transparent, electrically insulating layer 550*a*. As shown in FIG. 5B, prior to disposition on the first solar cell 510, the top carrier film 550 lies relatively flat across the top portion of the trace 520, for example, as for the conformational state of the top carrier film 550 immediately after roll-to-roll fabrication of the combined applicable carrier film, interconnect assembly 504. In contrast, after disposition on the first solar cell 510, the top carrier film 550 conforms to the top portion of the trace 520, as shown in FIG. 5B. The first substantially transparent, adhesive medium 550*b* allows for coupling the trace 520 to the first solar cell 510 without requiring solder. The first substantially transparent, electrically insulating layer 550*a* may include a structural plastic material, such as polyethylene terephthalate (PET). In accordance with embodiments of the present invention, a first substantially transparent, adhesive medium such as first substantially transparent, adhesive medium 550*b* may be included, without limitation thereto, in a top carrier film of: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With further reference to FIGS. 5A, 5B and 5C, in accordance with embodiments of the present invention, the combined applicable carrier film, interconnect assembly 504 further includes the bottom carrier film 560. The bottom carrier film 560 includes a second electrically insulating layer, like 550*a*, coupled to the trace 520 and disposed below a bottom portion of the trace 520, as indicated by the solid-line portions of the trace 520 on the right of FIG. 5A. Alternatively, the bottom carrier film 560 may include a carrier film selected from a group consisting of a second electrically insulating layer, a structural plastic layer, and a metallic layer, and is coupled to the trace 520 and is disposed below a bottom portion of the trace 520. The second electrically insulating layer, like 550*a*, holds the trace 520 down in contact with a back side of the second solar cell (not shown) and allows for forming an edge-protecting portion at the edge 514 of the first solar cell 510. The bottom carrier film 560 further includes a second adhesive medium, like 550*b*, coupling the trace to the second electrically insulating layer, like 550*a*. The second adhesive medium, like 550*b*, allows for coupling the trace 520 to the back side of the second solar cell (not shown) without requiring solder. The second electrically insulating layer, like 550*a*, includes a structural plastic material, such as PET. In accordance with embodiments of the present invention, a second adhesive medium, like 550*b*, may be included, without limitation thereto, in a bottom carrier film of: the combined applicable carrier film, interconnect assembly 504, the interconnect assembly 320, the combined solar-cell, interconnect assembly 494, or the interconnect assembly 420 of the solar-cell module 404.

With further reference to FIG. 5A, in accordance with embodiments of the present invention, the trace 520 may be disposed in a serpentine pattern that allows for collecting current from the first solar cell 510 (shown in FIG. 5C) and electrically interconnecting to the second solar cell (not shown). It should be noted that neither the first solar cell 510 nor the second solar cell (not shown) are shown in FIG. 5A so as not to obscure the structure of the combined applicable carrier film, interconnect assembly 504. As shown in FIG. 5A, the combined applicable carrier film, interconnect assembly 504 includes the trace 520 including the plurality of electrically conductive portions 520*a* through 520*m* that may run in a serpentine pattern back and forth between the first solar cell 510 and the second solar cell (not shown). The serpentine pattern is such that adjacent electrically conductive portions of the plurality of electrically conductive portions 520*a* through 520*m* are configured in pairs of adjacent electrically conductive portions: 520*a* and 520*b*, 520*c* and 520*d*, 520*e* and 520*f*, etc. The pairs of adjacent electrically conductive portions may be configured in a regular repeating pattern of equally spaced adjacent electrically conductive portions. The trace 520 including the plurality of electrically conductive portions 520*a* through 520*m* is disposed between the top carrier film 550 disposed above a top portion of the trace 520 and the bottom carrier film 560 disposed below a bottom portion of the trace 520. The first substantially transparent, electrically insulating layer 550*a* of top carrier film 550 and the second electrically insulating layer, or alternatively, structural plastic layer or metallic layer, of bottom carrier film 560 are coupled to the trace 520 with a first substantially transparent, adhesive medium 550*b* and second adhesive medium which also serve to couple the trace 520 to the first solar cell 510, which may be located on the left, and the second solar cell, which may be located on the right. In the space between the two solar cells, between the edge 514 of the first solar cell and the edge 534 of the second solar cell, the trace is sandwiched between the two carrier films 550 and 560; the overlapping region of the two carrier films 550 and 560 extends somewhat beyond the respective edges 514 and 534 of the first and second solar cells so as to form, respectively, an edge-protecting portion at the edge 514 of the first solar cell, and a short-circuit-preventing portion at the edge 534 of the second solar cell, from the trace 520 that crosses the edges 514 and 534.

With further reference to FIGS. 5B and 5C, in accordance with embodiments of the present invention, the trace 520 may further include an electrically conductive line including a conductive core 520A with at least one overlying layer 520B. In one embodiment of the present invention, the electrically conductive line may include the conductive core 520A including a material having greater conductivity than nickel, for example, copper, with an overlying nickel layer 520B. In another embodiment of the present invention, electrically conductive line may include the conductive core 520A including nickel without the overlying layer 520B. The electrically conductive line may also be selected from a group consisting of a copper conductive core clad with a silver cladding, a copper conductive core clad with a nickel coating further clad with a silver cladding and an aluminum conductive core clad with a silver cladding.

With further reference to FIGS. 5B and 5C, in accordance with embodiments of the present invention, the trace 520 for collecting current from a solar cell, for example the first solar cell 510, may include an electrically conductive line including the conductive core 520A, and the overlying layer 520B that limits current flow to a proximate shunt defect (not shown) in the solar cell. The proximate shunt defect may be proximately located in the vicinity of an electrical contact between the overlying layer 520B of the electrically conductive line and the TCO layer 510*b* of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510*b* of the solar cell, for example first solar cell 510, may include a conductive oxide selected from a group consisting of zinc oxide, aluminum zinc oxide and indium tin oxide. In addition, the absorber layer 510*a*, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510*a*. Moreover, an n-type layer, for example, n-type portion 112*b* of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112*b* of absorber layer 112 of FIG. 1A, may be selected from a group consisting of a metal oxide, a metal sulfide and a metal selenide.

Although the trace 520 is shown as having a circular cross-section having a point-like contact with a solar cell, for example, with the TCO layer 510*b*, or, without limitation thereto, to a top surface, of the first solar cell 510, embodiments of the present inventions include, without limitation thereto, other cross-sectional profiles of the trace 520, such as a profile including a flattened top portion and a flattened bottom portion, so as to increase the contact area between the trace 520 and a solar cell with which it makes contact. For example, a flattened bottom portion of trace 520 increases the contact area with the light-facing side of the first solar cell 510; on the other hand, a flattened top portion of trace 520 increases the contact area with a back side of an adjacent solar cell to which the plurality of electrically conductive portions 520*a* through 520*m* of the trace 520 interconnects. In accordance with embodiments of the present invention, a trace, such as trace 520, may be included, without limitation thereto, in: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With reference now to FIG. 6A, in accordance with embodiments of the present invention, a plan view 600A of an integrated busbar-solar-cell-current collector 690 is shown. FIG. 6A shows the physical interconnection of a terminating solar cell 660 with a terminating busbar 680 of the integrated busbar-solar-cell-current collector 690. The integrated busbar-solar-cell-current collector 690 includes the terminating busbar 680 and an integrated solar-cell, current collector 670. The integrated solar-cell, current collector 670 includes a plurality of integrated pairs 670*a&b*, 670*c&d*, 670*e&f*, 670*g&h*, and 670*l&m* and 670*i*, the ellipsis indicating additional integrated pairs (not shown), of electrically conductive, electrically parallel trace portions 670*a-m*. Throughout the following, the respective integrated pairs: 670*a* and 670*b*, 670*c* and 670*d*, 670*e* and 670*f*, 670*g* and 670*h*, and 670*l* and 670*m*, are referred to respectively as: 670*a&b*, 670*c&d*, 670*e&f*, 670*g&h*, and 670*l&m*; and the electrically conductive, electrically parallel trace portions: 670*a*, 670*b*, 670*c*, 670*d*, 670*e*, 670*f*, 670*g*, 670*h*, 670*l* and 670*m*, are referred to as 670*a-m*. The plurality of integrated pairs 670*a&b*, 670*c&c*, 670*e&f*, 670*g&h*, 670*i* and 670*l&m* of electrically conductive, electrically parallel trace portions 670*a-m* is configured both to collect current from the terminating solar cell 660 and to interconnect electrically to the terminating busbar 680. The plurality of integrated pairs 670*a&b*, 670*c&c*, 670*e&f*, 670*g&h*, 670*i* and 670*l&m* of electrically conductive, electrically parallel trace portions 670*a-m* is configured such that solar-cell efficiency is substantially undiminished in an event that any one electrically conductive, electrically parallel trace portion, for example, 670*h*, of the plurality of integrated pairs 670*a&b*, 670*c&c*, 670*e&f*, 670*g&h*, 670*i* and 670*l&m* of electrically conductive, electrically parallel trace portions 670*a-m* is conductively impaired.

With further reference to FIGS. 6A and 6B, in accordance with embodiments of the present invention, the plurality of integrated pairs 670*a&b*, 670*c&c*, 670*e&f*, 670*g&h*, 670*i* and 670*l&m* of electrically conductive, electrically parallel trace portions 670*a-m* further includes a first electrically conductive, electrically parallel trace portion 670*a* of a first integrated pair 670*a&b* of the electrically conductive, electrically parallel trace portions 670*a-m* configured both to collect current from the terminating solar cell 660 and to interconnect electrically to the terminating busbar 680, and a second electrically conductive, electrically parallel trace portion 670*b* of the first integrated pair 670*a&b* of the electrically conductive, electrically parallel trace portions 670*a-m* configured both to collect current from the terminating solar cell 660 and to interconnect electrically to the terminating busbar 680. The first electrically conductive, electrically parallel trace portion 670*a* includes a first end 6'70*p* distal from the terminating busbar 680 located parallel to a side 662 of the terminating solar cell 660. The second electrically conductive, electrically parallel trace portion 670*b* includes a second end 670*q* distal from the terminating busbar 680. The second electrically conductive, electrically parallel trace portion 670*b* is disposed proximately to the first electrically conductive, electrically parallel trace portion 670*a* and electrically connected to the first electrically conductive, electrically parallel trace portion 670*a* such that the first distal end 670*p* is electrically connected to the second distal end 670*q*, for example, at first junction 670*r*, or by a linking portion, such that the second electrically conductive, electrically parallel trace portion 670*b* is configured electrically in parallel to the first electrically conductive, electrically parallel trace portion 670*a* when configured to interconnect to the terminating busbar 680. In addition, in accordance with embodiments of the present invention, the terminating busbar 680 may be disposed above and connected electrically to extended portions, for example, 670*x* and 670*y*, of the plurality of integrated pairs 670*a&b*, 670*c&c*, 670*e&f*, 670*g&h*, 670*i* and 670*l&m* of electrically conductive, electrically parallel trace portions 670*a-m* configured such that the terminating busbar 680 is configured to reduce shadowing of the terminating solar cell 660.

With further reference to FIG. 6A, in accordance with embodiments of the present invention, an open-circuit defect 640 is shown such that eighth electrically conductive, electrically parallel trace portion 670*h* is conductively impaired. FIG. 6A illustrates the manner in which the plurality of integrated pairs 670*a&b*, 670*c&c*, 670*e&f*, 670*g&h* and 670*l&m* of electrically conductive, electrically parallel trace portions 670*a-m* is configured such that solar-cell efficiency is substantially undiminished in an event that any one electrically conductive, electrically parallel trace portion, for example, eighth electrically conductive, electrically parallel trace portion 670*h*, of the plurality of integrated pairs 670*a&b*, 670*c&c*, 670*e&f*, 670*g&h* and 670*l&m* of electrically conductive, electrically parallel trace portions 670*a-m* is conductively impaired. The arrow 648 indicates the nominal electron-flow through a sixth electrically conductive, electrically parallel trace portion 670*f* of the plurality of integrated pairs 670*a&b*, 670*c&c*, 670*e&f*, 670*g&h* and 670*l&m* of electrically conductive, electrically parallel trace portions 670*a-m* essentially unaffected by open-circuit defect 640. In the absence of open-circuit defect 640, an electron-flow indicated by arrow 648 would normally flow through any one electrically conductive, electrically parallel trace portion of the plurality of integrated pairs 670*a&b*, 670*c&c*, 670*e&f*, 670*g&h* and 670*l&m* of electrically conductive, electrically parallel trace portions 670*a-m*, in particular, eighth electrically conductive, electrically parallel trace portion 670*h*. However, when the open-circuit defect 640 is present, this electron-flow divides into two portions shown by arrows 642 and 644: arrow 642 corresponding to that portion of the normal electron-flow flowing to the right along the eighth electrically conductive, electrically parallel trace portion 670*h* to the terminating busbar 680, and arrow 644 corresponding to that portion of the normal electron-flow flowing to the left along the eighth electrically conductive, electrically parallel trace portion 670*h* to the seventh electrically conductive, electrically parallel trace portion 670*g* and then to the right along the seventh electrically conductive, electrically parallel trace portion 670*g* to the terminating busbar 680. Thus, the net electron-flow represented by arrow 646 flowing to the right along the seventh electrically conductive, electrically parallel trace portion 670*g* is consequently larger than what would normally flow to the right along the seventh electrically conductive, electrically parallel trace portion 670*g* to the terminating busbar 680 in the absence of the open-circuit defect 640. It should be noted that open-circuit defect 640 is for illustration purposes only and that embodiments of the present invention compensate for other types of defects in an electrically conductive, electrically parallel trace portion, in general, such as, without limitation to: a delamination of an electrically conductive, electrically parallel trace portion from the terminating solar cell 660, corrosion of an electrically conductive, electrically parallel trace portion, and even complete loss of an electrically conductive, electrically parallel trace portion. In accordance with embodiments of the present invention, in the event a defect completely conductively impairs an electrically conductive, electrically parallel trace portion, the physical spacing between adjacent electrically conductive, electrically parallel trace portions, identified with double-headed arrow 649, may be chosen such that solar-cell efficiency is substantially undiminished. Nevertheless, embodiments of the present invention embrace, without limitation thereto, other physical spacings between adjacent electrically conductive, electrically parallel trace portions in the event defects are less severe than those causing a complete loss of one of the electrically conductive, electrically parallel trace portions.

With reference now to FIG. 6B and further reference to FIG. 6A, in accordance with embodiments of the present invention, a cross-sectional, elevation view 600B of the integrated busbar-solar-cell-current collector 690 of FIG. 6A is shown. FIG. 6B shows the physical interconnection of the terminating solar cell 660 with the terminating busbar 680 in the integrated busbar-solar-cell-current collector 690. In accordance with embodiments of the present invention, the interconnection approach employing a carrier film is also conducive to coupling the integrated busbar-solar-cell-current collector 690 directly to the terminating busbar 680 without requiring solder. Thus, the integrated busbar-solar-cell-current collector 690 further includes a top carrier film 650. The top carrier film 650 includes a first substantially transparent, electrically insulating layer (not shown, but like 550*a* of FIG. 5B) coupled to the plurality of integrated pairs 670*a&b*, 670*c&c*, 670*e&f*, 670*g&h*, 670*i* and 670*l&m* of electrically conductive, electrically parallel trace portions 670*a-m*, for example, electrically conductive, electrically parallel trace portion 670*a*, and disposed above a top portion of the plurality of integrated pairs 670*a&b*, 670*c&c*, 670*e&f*, 670*g&h*, 670*i* and 670*l&m* of electrically conductive, electrically parallel trace portions 670*a-m*.

With further reference to FIGS. 6A and 6B, in accordance with embodiments of the present invention, the top carrier film 650 further includes a first adhesive medium (not shown, but like 550*b* of FIGS. 5B and 5C) coupling the plurality of integrated pairs 670*a&b*, 670*c&c*, 670*e&f*, 670*g&h*, 670*i* and 670*l&m* of electrically conductive, electrically parallel trace portions 670*a-m* to the electrically insulating layer (like 550*a* of FIG. 5B). The first adhesive medium (like 550*b* of FIGS. 5B and 5C) allows for coupling the plurality of integrated pairs 670*a&b*, 670*c&c*, 670*e&f*, 670*g&h*, 670*i* and 670*l&m* of electrically conductive, electrically parallel trace portions 670*a-m* to the terminating solar cell 660 without requiring solder. The terminating solar cell 660 may include an absorber layer 660*a*, a TCO layer 660*b*, and a metallic substrate 660*c*; a backing layer (not shown) may also be disposed between the absorber layer 660*a* and the metallic substrate 660*c*. The plurality of integrated pairs of electrically conductive, electrically parallel trace portions 670*a-m* may be connected electrically in series to form a single continuous electrically conductive line (not shown). The single continuous electrically conductive line may be disposed in a serpentine pattern (not shown, but like the pattern of trace 520 in FIG. 5A) such that the integrated busbar-solar-cell-current collector 690 is configured to collect current from the terminating solar cell 660 and to interconnect electrically to the terminating busbar 680. The plurality of integrated pairs 670*a&b*, 670*c&c*, 670*e&f*, 670*g&h*, 670*i* and 670*l&m* of electrically conductive, electrically parallel trace portions 670*a-m* may further include a plurality of electrically conductive lines (not shown, but like trace 520 of FIGS. 5B and 5C), any electrically conductive line of the plurality of electrically conductive lines selected from a group consisting of a copper conductive core clad with a silver cladding, a copper conductive core clad with a nickel coating further clad with a silver cladding and an aluminum conductive core clad with a silver cladding.

With further reference to FIGS. 6A and 6B, in accordance with embodiments of the present invention, integrated busbar-solar-cell-current collector 690 may include a supplementary isolation strip (not shown) at an edge 664 of the terminating solar cell 660 and running along the length of the side 662 to provide additional protection at the edge 664 and side 662 of the terminating solar cell 660 from the extended portions, for example, 670*x* and 670*y*, of the plurality of integrated pairs 670*a&b*, 670*c&c*, 670*e&f*, 670*g&h*, 670*i* and 670*l&m* of electrically conductive, electrically parallel trace portions 670*a-m*. In another embodiment of the present invention, the extended portions, for example, 670*x* and 670*y*, may be configured (not shown) to provide stress relief and to allow folding the terminating busbar 680 along edge 664 under a back side 668 and at the side 662 of terminating solar cell 660, so that there is less wasted space and open area between the terminating solar cell 660 of one module and the initial solar cell (not shown) of an adjacent module. Moreover, integrated busbar-solar-cell-current collector 690 may include a supplementary carrier-film strip (not shown) at the edge 664 of the terminating solar cell 660 and running along the length of the side 662 disposed above and coupled to top carrier film 650 and the terminating busbar 680 to affix the terminating busbar 680 to the extended portions, for example, 670*x* and 670*y*. Alternatively, the integrated busbar-solar-cell-current collector 690 may include the top carrier film 650 extending over the top of the terminating busbar 680 and extended portions, for example, 670*x* and 670*y*, to affix the terminating busbar 680 to these extended portions. Thus, these latter two embodiments of the present invention provide a laminate including the terminating busbar 680 disposed between top carrier film 650, or alternatively the supplementary carrier-film strip, and the supplementary isolation strip (not shown) along the edge 664 and side 662 of the terminating solar cell 660. Moreover, the top carrier film 650, or the supplementary carrier-film strip, is conducive to connecting the terminating busbar 680 without requiring solder to the plurality, itself, or to the extended portions, for example, 670*x* and 670*y*, of the plurality of integrated pairs 670*a&b*, 670*c&c*, 670*e&f*, 670*g&h*, 670*i* and 670*l&m* of electrically conductive, electrically parallel trace portions 670*a-m*

Figure 7A:
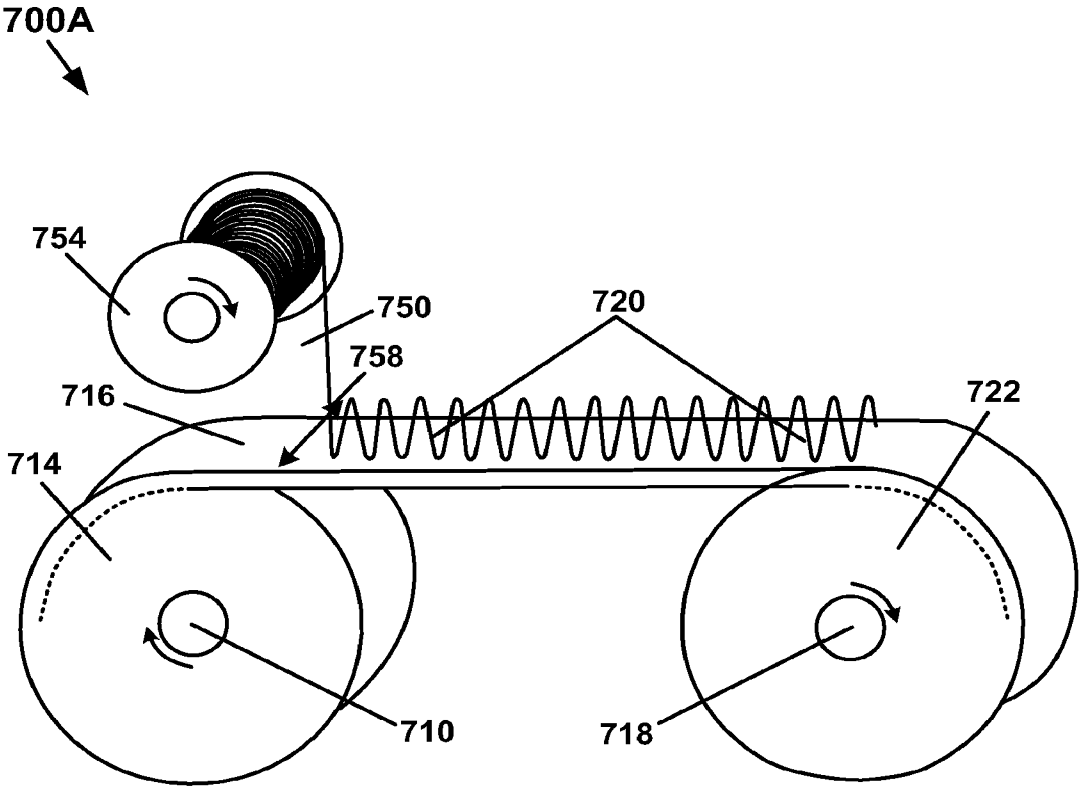
FIG. 7A is a combined cross-sectional elevation and perspective view of a roll-to-roll, interconnect-assembly fabricator for fabricating the interconnect assembly from a first roll of top carrier film and from a dispenser of conductive-trace material, in accordance with an embodiment of the present invention.

With reference now to FIG. 7A, in accordance with embodiments of the present invention, a combined cross-sectional elevation and perspective view of a roll-to-roll, interconnect-assembly fabricator 700A is shown. FIG. 7A shows the roll-to-roll, interconnect-assembly fabricator 700A operationally configured to fabricate an interconnect assembly 720. A top carrier film 716 including an electrically insulating layer, for example a first substantially transparent, electrically insulating layer, is provided to roll-to-roll, interconnect-assembly fabricator 700A in roll form from a first roll of material 714. The roll-to-roll, interconnect-assembly fabricator 700A includes an first unwinding spool 710 upon which the first roll of material 714 of the top carrier film 716 including the electrically insulating layer is mounted. As shown, a portion of the first roll of material 714 is unrolled. The unrolled portion of the top carrier film 716 including the electrically insulating layer passes to the right and is taken up on a take-up spool 718 upon which it is rewound as a third roll 722 of interconnect assembly 720, after conductive-trace material 750 is provided from a dispenser 754 and is laid down onto the unrolled portion of the top carrier film 716 including the electrically insulating layer. The dispenser 754 of conductive-trace material 750 may be a spool of wire, or some other container providing conductive-trace material. The conductive-trace material 750 may be laid down onto the unrolled portion of the top carrier film 716 including the electrically insulating layer in an oscillatory motion, but without limitation to a strictly oscillatory motion, indicated by double-headed arrow 758, to create a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired. As shown in FIG. 7A, a portion of the electrically conductive portions overhang one side of the top carrier film 716 to allow the electrically conductive portions of the trace to interconnect electrically to the second solar cell on the exposed top side of the trace, while the exposed bottom side of the trace, here shown as facing upward on the top carrier film 716, allows the electrically conductive portions of the trace in contact with the top carrier film 716 to interconnect electrically to the first solar cell. Moreover, the conductive-trace material 750 may be disposed in a serpentine pattern to create the plurality of electrically conductive portions configured both to collect current from the first solar cell and to interconnect electrically to the second solar cell. The arrows adjacent to the first unwinding spool 710, and the take-up spool 718 indicate that these are rotating components of the roll-to-roll, interconnect-assembly fabricator 700A; the first unwinding spool 710, and the take-up spool 718 are shown rotating in clockwise direction, as indicated by the arrow-heads on the respective arrows adjacent to these components, to transport the unrolled portion of the first roll of material 714 from the first unwinding spool 710 on the left to the take-up spool 718 on the right.

Figure 7B:
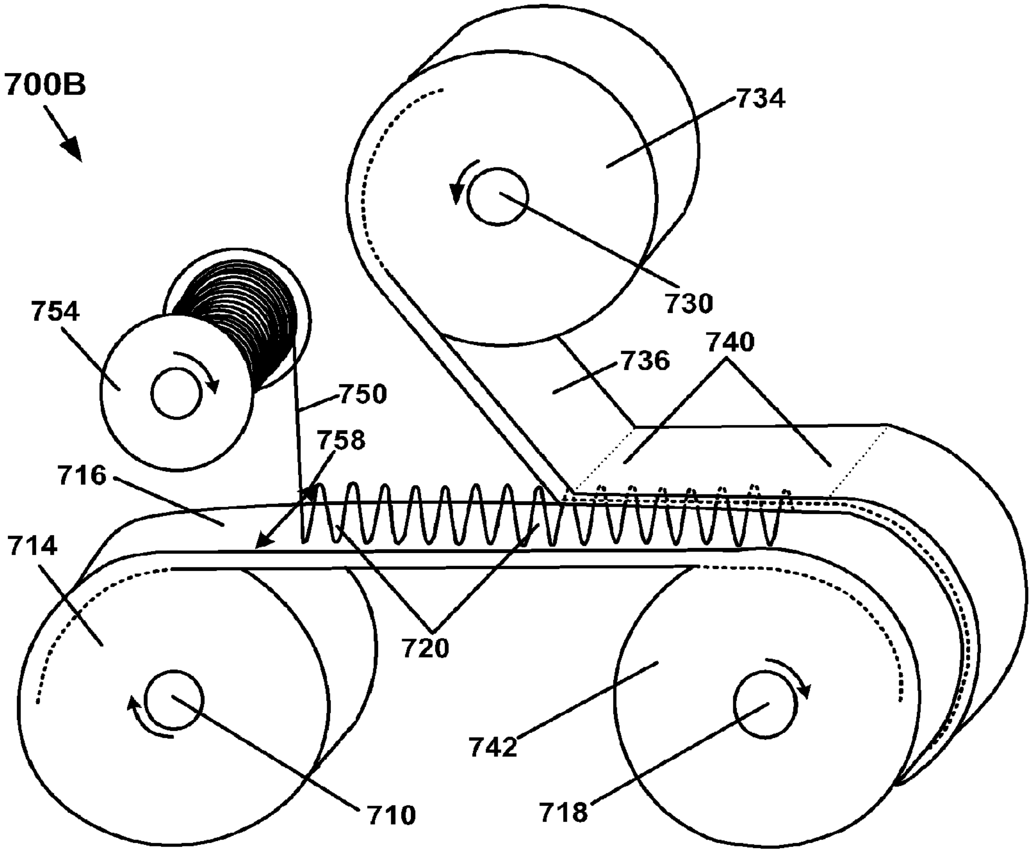
FIG. 7B is a combined cross-sectional elevation and perspective view of a roll-to-roll, laminated-interconnect-assembly fabricator for fabricating a laminated-interconnect assembly from the first roll of top carrier film, from a second roll of bottom carrier film and from the dispenser of conductive-trace material, in accordance with an embodiment of the present invention.
Figure 8:
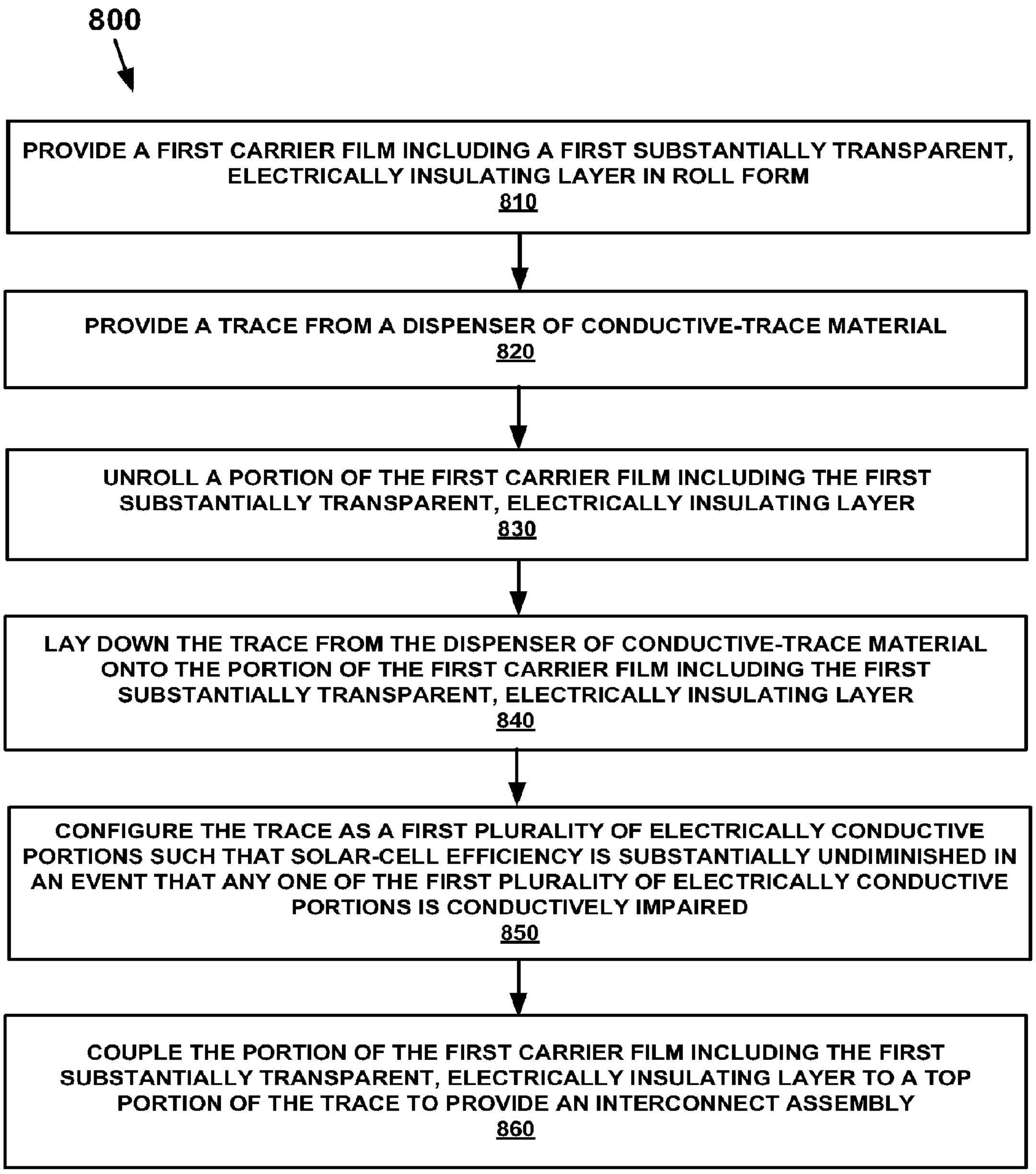
FIG. 8 is flow chart illustrating a method for roll-to-roll fabrication of an interconnect assembly, in accordance with an embodiment of the present invention.
Figure 9:
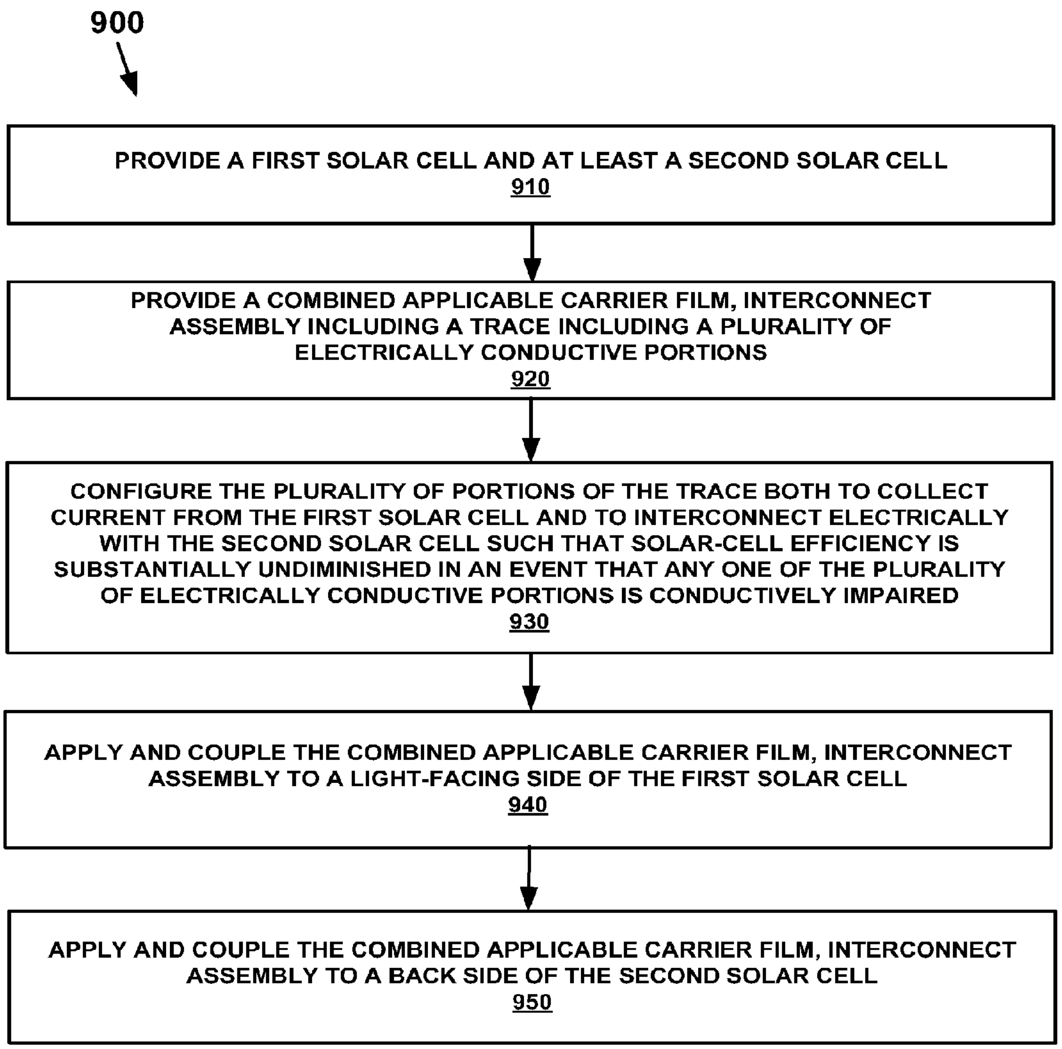
FIG. 9 is flow chart illustrating a method for interconnecting two solar cells, in accordance with an embodiment of the present invention.

With reference now to FIG. 7B, in accordance with embodiments of the present invention, a combined cross-sectional elevation and perspective view of a roll-to-roll, laminated-interconnect-assembly fabricator 700B is shown. FIG. 7A shows the roll-to-roll, laminated-interconnect-assembly fabricator 700B operationally configured to fabricate a laminated-interconnect assembly 740. The roll-to-roll, laminated-interconnect-assembly fabricator 700B first fabricates the interconnect assembly 720 shown on the left-hand side of FIG. 7B from the first roll of material 714 of the top carrier film 716 including the electrically insulating layer and from conductive-trace material 750 provided from dispenser 754. Then, the roll-to-roll, laminated-interconnect-assembly fabricator 700B continues fabrication of the laminated-interconnect assembly 740 by applying a bottom carrier film 736 from a second roll 734. The bottom carrier film 736 includes a carrier film selected from a group consisting of a second electrically insulating layer, a structural plastic layer, and a metallic layer, and is coupled to the conductive-trace material 750 and is disposed below a bottom portion of the conductive-trace material 750. If a metallic layer is used for the bottom carrier film 736, a supplementary isolation strip (not shown) of a third electrically insulating layer is added to the laminated-interconnect assembly 740 configured to allow interposition of the third electrically insulating layer between the bottom carrier film 736 and a top surface of the first solar cell to provide additional protection at an edge of the first solar cell and to prevent shorting out the solar cell in the event that the bottom carrier film 736 including the metallic layer should ride down the side of the first solar cell. The laminated-interconnect assembly 740 passes to the right-hand side of FIG. 7B and is taken up on the take-up spool 718 upon which it is wound as a fourth roll 742 of laminated-interconnect assembly 740. The arrows adjacent to the first unwinding spool 710, a second unwinding spool 730 and the take-up spool 718 indicate that these are rotating components of the roll-to-roll, laminated-interconnect-assembly fabricator 700B; the first unwinding spool 710, and the take-up spool 718 are shown rotating in clockwise direction, as indicated by the arrow-heads on the respective arrows adjacent to these components, to transport the unrolled portion of the first roll of material 714 from the first unwinding spool 710 on the left to the take-up spool 718 on the right. The second unwinding spool 730, and the dispenser 754 are shown rotating in a counterclockwise direction and a clockwise direction, respectively, as indicated by the arrow-heads on the respective arrows adjacent to these components, as they release the bottom carrier layer 736 and the conductive-trace material 750, respectively, in fabrication of the laminated-interconnect assembly 740. The double-headed arrow 758 indicates the motion imparted to the conductive trace material by the roll-to-roll, laminated-interconnect-assembly fabricator 700B creates a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired.

Sub-Section B: Description of Embodiments of the Present Invention for a Method for Roll-to-Roll Fabrication of an Interconnect Assembly With reference now to FIG. 8, a flow chart illustrates an embodiment of the present invention for a method for roll-to-roll fabrication of an interconnect assembly. At 810, a first carrier film including a first substantially transparent, electrically insulating layer is provided in roll form. At 820, a trace is provided from a dispenser of conductive-trace material. The dispenser may be a spool of wire or other container of conductive-trace material. At 830, a portion of the first carrier film including the first substantially transparent, electrically insulating layer is unrolled. At 840, the trace from the dispenser of conductive-trace material is laid down onto the portion of the first carrier film including the first substantially transparent, electrically insulating layer. At 850, the trace is configured as a first plurality of electrically conductive portions such that solar-cell efficiency is substantially undiminished in an event that any one of the first plurality of electrically conductive portions is conductively impaired. At 860, the portion of the first the first carrier film including the substantially transparent, electrically insulating layer is coupled to a top portion of the trace to provide an interconnect assembly.

In an embodiment of the present invention, configuring the trace also includes: configuring the trace as a second plurality of paired trace portions; configuring a first portion of a paired portion of the second plurality of paired trace portions to allow both collecting current from a first solar cell and electrically interconnecting the first solar cell with a second solar cell; disposing proximately to the first portion, a second portion of the paired portion; and configuring the second portion to allow both collecting current from the first solar cell and electrically interconnecting the first solar cell with the second solar cell. Alternatively, configuring the trace may include disposing the trace in a serpentine pattern that allows for collecting current from the first solar cell and electrically interconnecting to the second solar cell. In an embodiment of the present invention, the method may also include: providing a second carrier film including a second electrically insulating layer; coupling the second carrier film including the second electrically insulating layer to a bottom portion of the trace; and configuring the second electrically insulating layer to allow forming an edge-protecting portion at an edge of the first solar cell. Moreover, the method may include configuring the first substantially transparent, electrically insulating layer to allow forming a short-circuit-preventing portion at an edge of the second solar cell.

Sub-Section C: Description of Embodiments of the Present Invention for a Method of Interconnecting Two Solar Cells With reference now to FIG. 9, a flow chart illustrates an embodiment of the present invention for a method of interconnecting two solar cells. At 910, a first solar cell and at least a second solar cell are provided. At 920, a combined applicable carrier film, interconnect assembly including a trace including a plurality of electrically conductive portions is provided. At 930, the plurality of electrically conductive portions of the trace is configured both to collect current from the first solar cell and to interconnect electrically with the second solar cell such that solar-cell efficiency is substantially undiminished in an event that any one of the plurality of electrically conductive portions is conductively impaired. At 940, the combined applicable carrier film, interconnect assembly is applied and coupled to a light-facing side of the first solar cell. At 950, the combined applicable carrier film, interconnect assembly is applied and coupled to a back side of the second solar cell.

In an embodiment of the present invention, the method also includes applying and coupling the combined applicable carrier film, interconnect assembly to the light-facing side of the first solar cell without requiring solder. In addition, the method may include applying and coupling the combined applicable carrier film, interconnect assembly to the back side of the second solar cell without requiring solder. Moreover, the method includes applying and coupling the combined applicable carrier film, interconnect assembly to the light-facing side of the first solar cell such that a second electrically insulating layer of the applicable carrier film, interconnect assembly forms an edge-protecting portion at an edge of the first solar cell. The method also includes applying and coupling the combined applicable carrier film, interconnect assembly to the back side of the second solar cell such that a first substantially transparent, electrically insulating layer of the applicable carrier film, interconnect assembly forms a short-circuit-preventing portion at an edge of the second solar cell. The method may also include configuring the trace in a serpentine pattern that allows for collecting current from the first solar cell and electrically interconnecting to the second solar cell.

Sub-Section D: Physical Description of Embodiments of the Present Invention for a Trace In accordance with other embodiments of the present invention, the trace does not need to be used in conjunction with the afore-mentioned serpentine interconnect assembly approach, but could be used for other current collection and/or interconnection approaches used in solar cell technology. A trace including a conductive core with an overlying layer of nickel provides the unexpected result that when placed in contact with the TCO layer of a solar cell it suppresses current in the vicinity of short-circuit defects in the solar cell that might occur in the vicinity of the contact of the nickel layer of the trace with the TCO layer. The nickel increases local contact resistance which improves the ability of the solar cell to survive in the event of the formation of a defect, such as a shunt or a near shunt, located in the adjacent vicinity of the contact of the nickel layer of the trace with the TCO layer. If there is such a defect in the vicinity of the contact of the nickel layer of the trace with the TCO layer, the nickel reduces the tendency of the solar cell to pass increased current through the site of the defect, such as a shunt or a near shunt. Thus, the nickel acts as a localized resistor preventing run-away currents and high current densities in the small localized area associated with the site of the defect, such as a shunt or a near shunt. The current-limiting ability of nickel is in contrast, for example, to a low resistivity material such as silver, where the current density becomes so high at the location of the defect due to the high conductivity of silver that nearly almost all the current of the cell would be passed at the location of the defect causing a hot spot that would result in the melting of the silver with the formation of a hole in the solar cell filling with the silver migrating to the site of the defect to form a super-shunt. In contrast, nickel does not readily migrate nor melt in the presence of elevated localized temperatures associated with the site of increased currents attending formation of the defect, such as a shunt or a near shunt. Moreover, in contrast to silver, copper and tin, which tend to electromigrate, migrate or diffuse at elevated temperatures, nickel tends to stay put so that if the site of a shunt occurs in the vicinity of a nickel coated or nickel trace, the nickel has less tendency to move to the location of the shunt thereby further exacerbating the drop of resistance at the shunt site. In addition, experimental results of the present invention indicate that a nickel trace, or a trace including a nickel layer, may actually increase its resistance due the possible formation of a nickel oxide such that the nickel trace, or the trace including the nickel layer, acts like a localized fuse limiting the current flow in the vicinity of the shunt site. In some cases, the efficiency of the solar cell has actually been observed to increase after formation of the shunt defect when the nickel trace, or the trace including the nickel layer, is used in contact with the TCO layer.

With further reference to FIGS. 5B and 5C, in accordance with other embodiments of the present invention, the trace 520 for collecting current from a solar cell, for example, first solar cell 510, includes an electrically conductive line including the conductive core 520A, and the overlying layer 520B that limits current flow to a proximate shunt defect (not shown) in the solar cell, for example, first solar cell 510. The proximate shunt defect may be proximately located in the vicinity of an electrical contact between the overlying layer 520B of the electrically conductive line and the TCO layer 510*b* of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510*b* of the solar cell, for example, first solar cell 510, may include a conductive oxide selected from a group consisting of zinc oxide, aluminum zinc oxide and indium tin oxide. In addition, the absorber layer 510*a*, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510*a*. Moreover, an n-type layer, for example, n-type portion 112*b* of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112*b* of absorber layer 112 of FIG. 1A, may be selected from a group consisting of a metal oxide, a metal sulfide and a metal selenide.

Figure 10:
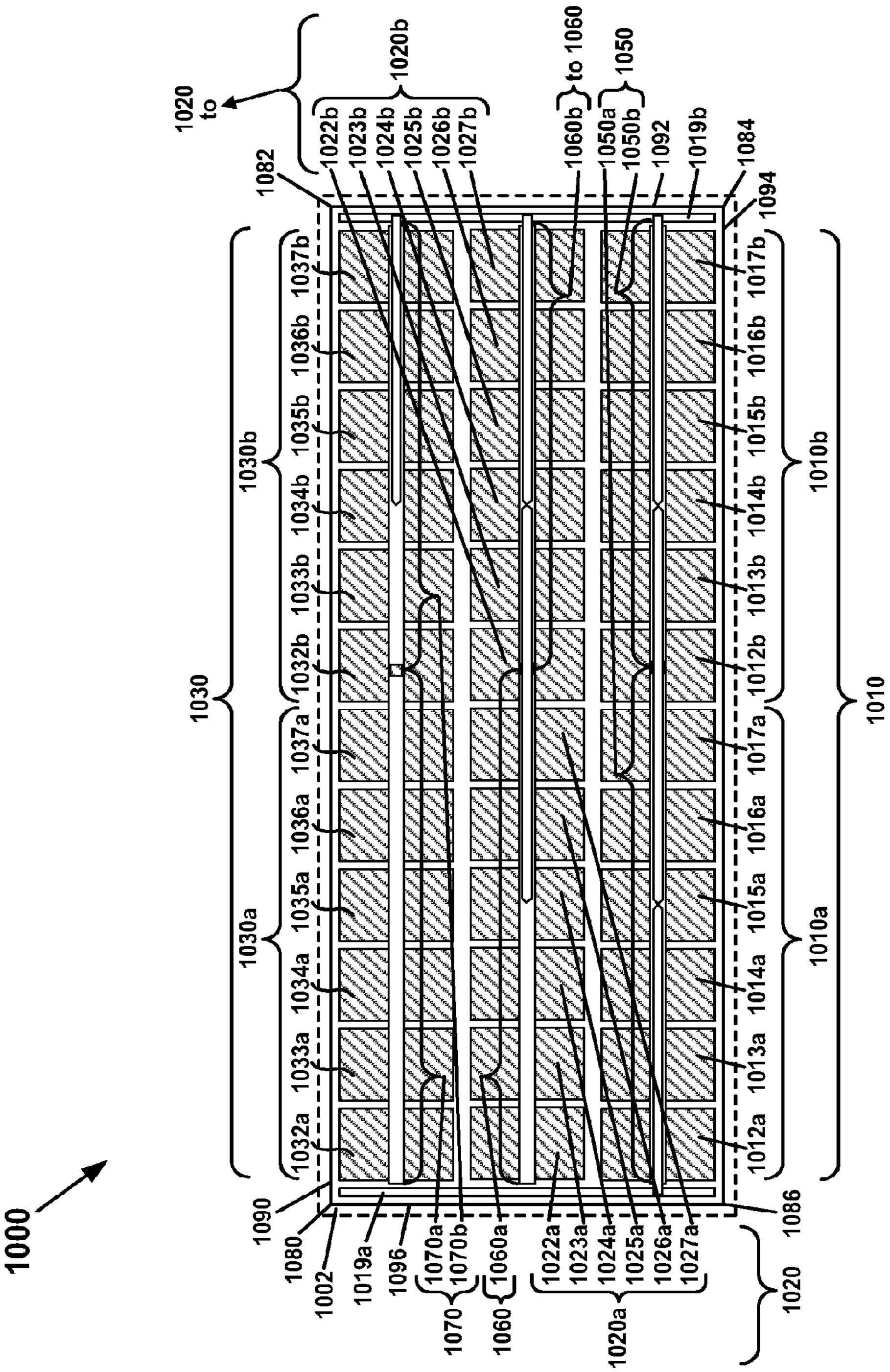
FIG. 10 is a plan view of a solar-cell module combined with external-connection mechanism mounted to respective edge regions and in-laminate-diode assembly, in accordance with an embodiment of the present invention.
Figure 14:
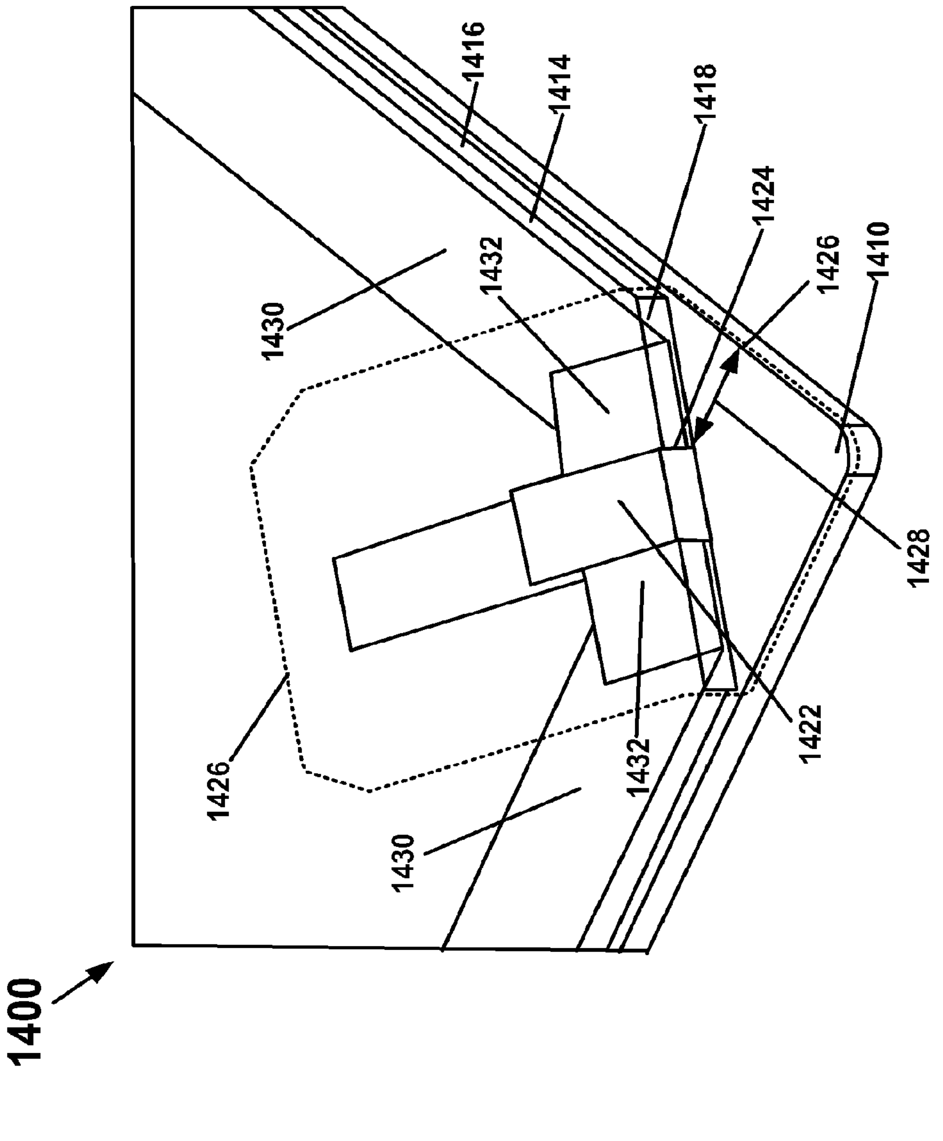
FIG. 14 is a combined plan and perspective view of a lead at a cut corner of a back glass of a solar-cell module, in accordance with an embodiment of the present invention.

Section II:

Physical Description of Embodiments of the Present Invention for a Solar-Cell Module Combined with In-Laminate Diodes and External-Connection Mechanisms Mounted to Respective Edge Regions With reference now to FIG. 10, in accordance with embodiments of the present invention, a plan view 1000 is shown of a solar-cell module 1002 combined with external-connection mechanisms (not shown) mounted to respective edge regions and in-laminate-diode assembly 1050. FIG. 10 shows the physical arrangement of the solar-cell module 1002 combined with in-laminate-diode assembly 1050 and external-connection mechanisms mounted to respective edge regions, which may be located at edges 1090, 1092, 1094 and 1096, or at corners 1080, 1082, 1084 and 1086. The solar-cell module 1002 includes a plurality 1010 of solar cells electrically coupled together, for example, solar cells 1012*a*-1017*a* and 1012*b*-1017*b*, which may be disposed in at least one solar-cell sub-module, for example, solar-cell sub-modules 1010*a* and 1010*b*, respectively. (Throughout the following, solar cells: 1012*a*, 1013*a*, 1014*a*, 1015*a*, 1016*a* and 1017*a*; 1012*b*, 1013*b*, 1014*b*, 1015*b*, 1016*b* and 1017*b*; 1022*a*, 1023*a*, 1024*a*, 1025*a*, 1026*a* and 1027*a*; 1022*b*, 1023*b*, 1024*b*, 1025*b*, 1026*b* and 1027*b*; 1032*a*, 1033*a*, 1034*a*, 1035*a*, 1036*a* and 1037*a*; and, 1032*b*, 1033*b*, 1034*b*, 1035*b*, 1036*b* and 1037*b*; are referred to in aggregate as: 1012*a*-1017*a*, 1012*b*-1017*b*, 1022*a*-1027*a*, 1022*b*-1027*b*, 1032*a*-1037*a* and 1032*b*-1037*b*, respectively. Solar-cell sub-modules: 1010*a* and 1010*b*, 1020*a* and 1020*b* and 1030*a* and 1030*b*, are referred to as: 1010*a*-1010*b*, 1020*a*-1020*b* and 1030*a*-1030*b*, respectively.) The plurality 1010 of solar cells 1012*a*-1017*a* and 1012*b*-1017*b* is electrically interconnected with one another through interconnect assemblies (not shown) similar to those discussed in Section I in FIGS. 4A through 4F. The solar-cell module 1002 also includes the in-laminate-diode assembly 1050 electrically coupled with the plurality 1010 of solar cells 1012*a*-1017*a* and 1012*b*-1017*b*. The in-laminate-diode assembly 1050 is configured to prevent power loss in the solar-cell module 1002, which can result, from amongst other causes, from shading of a particular solar cell, for example, solar cell 1012*a*. In addition, the solar-cell module 1002 includes a protective structure (not shown in FIG. 10, but in FIG. 14) at least partially encapsulating the plurality 1010 of solar cells 1012*a*-1017*a* and 1012*b*-1017*b*. As shown in FIG. 14, the protective structure may include a front glass 1410, which is disposed over a light-facing side of the solar cells 1012*a*-1017*a* and 1012*b*-1017*b*, and a back glass 1414 that encapsulate the plurality 1010 of solar cells 1012*a*-1017*a* and 1012*b*-1017*b*. The solar-cell module 1002 also includes a plurality of external-connection mechanisms mounted to a respective plurality of edge regions of the protective structure. An external-connection mechanism of the plurality of external-connection mechanisms is configured to enable collection of current from the plurality 1010 of solar cells 1012*a*-1017*a* and 1012*b*-1017*b* and to allow interconnection with at least one other external device (not shown). The external device may be selected from the group consisting of a solar-cell module, an inverter, a battery charger, an external load, and an electrical-power-distribution system.

With further reference to FIG. 10, in accordance with embodiments of the present invention, it should be noted that: a photovoltaic-convertor means for converting radiant power into electrical power may be a solar cell; a photovoltaic-convertor module may be a solar-cell module; a photovoltaic-convertor sub-module may be a solar-cell sub-module; an current-shunting means for by-passing current flow may be a diode; an in-laminate, current-shunting assembly means for by-passing current flow may be an in-laminate-diode assembly; an in-laminate, current-shunting sub-assembly means for by-passing current flow may be an in-laminate-diode sub-assembly; and a junction-enclosure means for protecting and electrically isolating electrical connections may be an external-connection mechanism. Moreover, it should be noted that a photovoltaic-convertor array may be a solar-cell array. With the preceding identifications of terms of art, it should be noted that embodiments of the present invention recited herein with respect to a solar cell, a solar-cell module, a solar-cell sub-module, a diode, an in-laminate-diode assembly, an in-laminate-diode sub-assembly, and an external-connection mechanism apply to a photovoltaic-convertor means for converting radiant power into electrical power, a photovoltaic-convertor module, a photovoltaic-convertor sub-module, an in-laminate, current-shunting means for by-passing current flow, an in-laminate, current-shunting assembly means for by-passing current flow, an in-laminate, current-shunting sub-assembly means for by-passing current flow, and a junction-enclosure means for protecting and electrically isolating electrical connections, respectively. Therefore, it should be noted that the preceding identifications of terms of art do not preclude, nor limit embodiments described herein, which are within the spirit and scope of embodiments of the present invention.

Figure 12A:
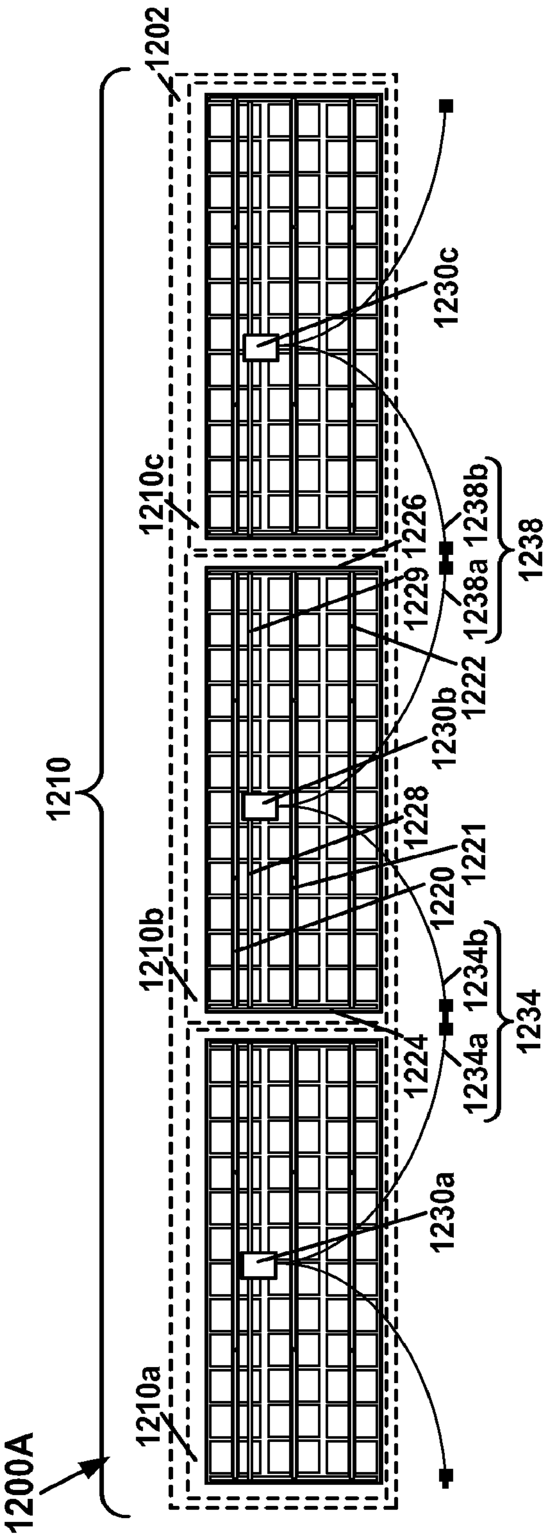
FIG. 12A is a plan view of a solar-cell array including a plurality of solar-cell modules combined with centrally-mounted junction boxes and in-laminate-diode assemblies, in accordance with an embodiment of the present invention.
Figure 12B:
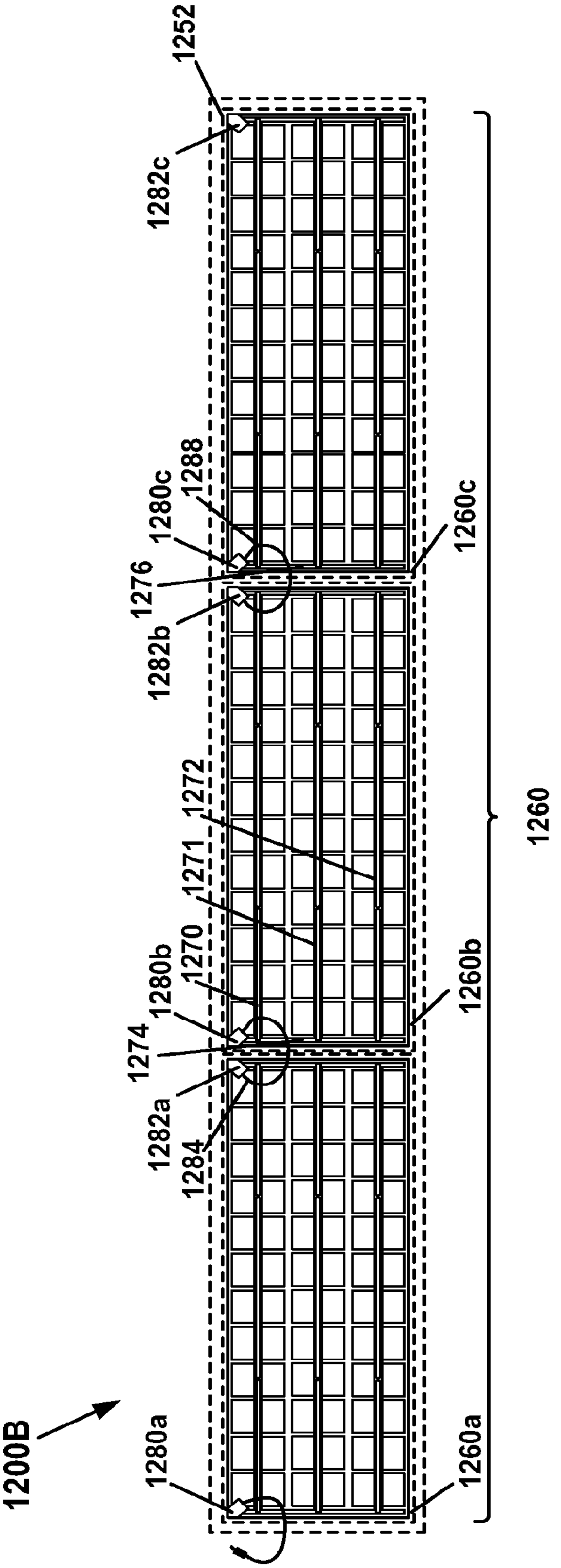
FIG. 12B is a plan view of a solar-cell array including a plurality of solar-cell modules combined with external-connection mechanism mounted to respective edge regions and in-laminate-diode assemblies, in accordance with an embodiment of the present invention.

With further reference to FIG. 10, in accordance with embodiments of the present invention, the solar-cell module 1002, identified with solar-cell module 1260*b*, may be a component of a solar-cell array, for example, solar-cell array 1252 as shown in FIG. 12B. Embodiments of the present invention also encompass the solar-cell array 1252, or alternatively a photovoltaic-convertor array, that may include a plurality of electrically coupled solar-cell modules, for example, solar-cell modules 1260*a*, 1260*b* and 1260*c*. The solar-cell module, for example, solar-cell modules 1260*b*, of a plurality 1260 of electrically coupled solar-cell modules 1260*a*, 1260*b* and 1260*c* may include a plurality of solar cells, at least one solar-cell sub-module, an in-laminate-diode assembly, a protective structure and a plurality of external-connection mechanisms as for embodiments of the present invention described herein.

With further reference to FIG. 10, in accordance with embodiments of the present invention, the in-laminate-diode assembly 1050 may include at least one in-laminate-diode sub-assembly 1050*a*, for example, from a plurality of in-laminate-diode sub-assemblies 1050*a*-1050*b* without limitation thereto. As shown in FIG. 10, the in-laminate-diode sub-assemblies 1050*a*-1050*b* are electrically coupled in parallel with the plurality 1010 of solar cells 1012*a*-1017*a* and 1012*b*-1017*b*, which may be disposed in solar-cell sub-modules, for example, solar-cell sub-modules 1010*a* and 1010*b*, respectively, as shown. (Throughout the following, in-laminate-diode sub-assemblies: 1050*a* and 1050*b*, 1060*a* and 1060*b* and 1070*a* and 1070*b*, are referred to as: 1050*a*-1050*b*, 1060*a*-1060*b* and 1070*a*-1070*b*, respectively.) At least one in-laminate-diode sub-assembly, for example, in-laminate-diode sub-assembly 1050*a*, includes at least one diode (not shown) and is configured to by-pass current flow around the solar-cell sub-module, for example, solar-cell sub-module 1010*a*, in an event at least one solar cell, for example, solar cell 1012*a*, of the plurality of solar cells 1012*a*-1017*a* develops high resistance to passage of solar-cell-module current, as may occur in case of shading of a solar-cell. As used herein, an in-laminate diode is a diode included in an in-laminate diode assembly or in-laminate-diode sub-assembly, where the term of art "in-laminate" refers to the disposition of the diode within such an assembly or sub-assembly rather than any inherent functionality of the diode itself. In addition, the solar-cell module 1002 may include a plurality of external-connection mechanisms mounted to respective edge regions, for example, external-connection mechanisms 1280*b* and 1282*b* mounted to respective edge regions, for example, corners as shown in FIG. 12B. At least one external-connection mechanism 1282*b* mounted to respective edge regions of the plurality of external-connection mechanisms 1280*b* and 1282*b* may be disposed at a cut corner of a back glass of the solar-cell module, for example, the solar-cell module 1260*b*. The external-connection mechanism 1280*b* and 1282*b* mounted to respective edge regions of the plurality of external-connection mechanisms 280*b* and 1282*b* are configured to collect current from the solar-cell module 1260*b* and to allow interconnection with at least one other external device, for example, the solar-cell module 1260*c*.

With further reference to FIG. 10, in accordance with embodiments of the present invention, the solar-cell module 1002 may include a second plurality 1020 of solar cells 1022*a*-1027*a* and 1022*b*-1027*b*. The second plurality 1020 of solar cells 1022*a*-1027*a* and 1022*b*-1027*b* is electrically interconnected with one another through interconnect assemblies (not shown) similar to those discussed in Section I in FIGS. 4A through 4F. Solar cells may be electrically coupled together in at least one solar-cell sub-module, for example, solar-cell sub-module 1020*a* may include solar cells 1022*a*-1027*a*, and solar-cell sub-module 1020*b* may include solar cells 1022*b*-1027*b*. The solar-cell module 1002 may also include a second in-laminate-diode assembly 1060 including a second plurality of in-laminate-diode sub-assemblies 1060*a*-1060*b* such that the in-laminate-diode sub-assemblies 1060*a*-1060*b* are electrically coupled in parallel with the second plurality 1020 of solar cells 1022*a*-1027*a* and 1022*b*-1027*b*, and which may be electrically coupled in parallel with solar-cell sub-modules 1020*a*-1020*b*. At least one in-laminate-diode sub-assembly, for example, in-laminate-diode sub-assembly 1060*a*, includes at least one diode (not shown) and is configured to by-pass current flow around the solar-cell sub-module, for example, solar-cell sub-module 1020*a*, in an event at least one solar cell, for example, solar cell 1022*a*, of the plurality 1020 of solar cells including solar cells 1022*a*-1027*a* develops high resistance to passage of solar-cell-module current. As shown in FIG. 10, the in-laminate-diode sub-assembly 1060*a* is also shown with some of its component conductors removed to reveal disposition of a portion of an electrically-insulating-laminate strip with respect to the second in-laminate-diode assembly 1060 and a portion of the second plurality 1020 of solar cells 1022*a*-1025*a*, which will be discussed below in greater detail in the description of FIG. 13.

With further reference to FIG. 10, in accordance with embodiments of the present invention, the solar-cell module 1002 may include a third plurality 1030 of solar cells 1032*a*-1037*a* and 1032*b*-1037*b*. The third plurality 1030 of solar cells 1032*a*-1037*a* and 1032*b*-1037*b* is electrically interconnected with one another through interconnect assemblies (not shown) similar to those discussed in Section I in FIGS. 4A through 4F. Solar cells may be electrically coupled together in at least one solar-cell sub-module, for example, solar-cell sub-module 1030*a* may include solar cells 1032*a*-1037*a*, and solar-cell sub-module 1030*b* may include solar cells 1032*b*-1037*b*. The solar-cell module 1002 may also include a third in-laminate-diode assembly 1070 including a third plurality of in-laminate-diode sub-assemblies 1070*a*-1070*b* such that the in-laminate-diode sub-assemblies 1070*a*-1070*b* are electrically coupled in parallel with the third plurality 1030 of solar cells 1032*a*-1037*a* and 1032*b*-1037*b*, and which may be electrically coupled in parallel with solar-cell sub-modules 1030*a*-1030*b*. At least one in-laminate-diode sub-assembly, for example, in-laminate-diode sub-assembly 1070*a*, includes at least one diode (not shown) and is configured to by-pass current flow around the solar-cell sub-module, for example, solar-cell sub-module 1030*a*, in an event at least one solar cell, for example, solar cell 1032*a*, of the third plurality 1030 of solar cells including solar cells 1032*a*-1037*a* develops high resistance to passage of solar-cell-module current. As shown in FIG. 10, the in-laminate-diode sub-assemblies 1070*a* and 1070*b* are also shown with some of their component conductors removed to reveal disposition of respective electrically-insulating-laminate strips with respect to the third in-laminate-diode assembly 1070 and a portion of the third plurality 1030 of solar cells 1032*a*-1037*a* and 1032*b*-1034*b*, which will also be discussed below in greater detail in the description of FIG. 13.

With further reference to FIG. 10, in accordance with embodiments of the present invention, a solar-cell sub-module 1010*a* includes at least one solar cell 1012*a*. Alternatively, the solar-cell sub-module 1010*a* may include a plurality of solar cells 1012*a*-1017*a*, as shown. A portion 1012*a*-1017*a* of the plurality 1010 of solar cells 1012*a*-1017*a* and 1012*b*-1017*b* of the solar-cell sub-module 1010*a* is electrically coupled in series. The in-laminate-diode assembly 1050 includes a plurality of in-laminate-diode sub-assemblies 1050*a*-1050*b*. At least one in-laminate-diode sub-assembly 1050*a* includes at least one diode (not shown) is configured to by-pass current flow around the solar-cell sub-module 1010*a* to prevent power loss in the solar-cell module 1002. The in-laminate-diode sub-assembly 1050*a* is configured to by-pass current flow around the solar-cell sub-module 1010*a* such that the diode (not shown) of the in-laminate-diode assembly 1050*a* is electrically coupled in parallel with the solar-cell sub-module 1010*a* with reverse polarity to polarities of the portion 1012*a*-1017*a* of the plurality 1010 of solar cells 1012*a*-1017*a* and 1012*b*-1017*b* of the solar-cell sub-module 1010*a*. The plurality of solar-cell sub-modules 1010*a*-1010*b* is electrically coupled in series. In addition, the plurality of in-laminate-diode sub-assemblies 1050*a*-1050*b* is electrically coupled in series.

Figure 11A:
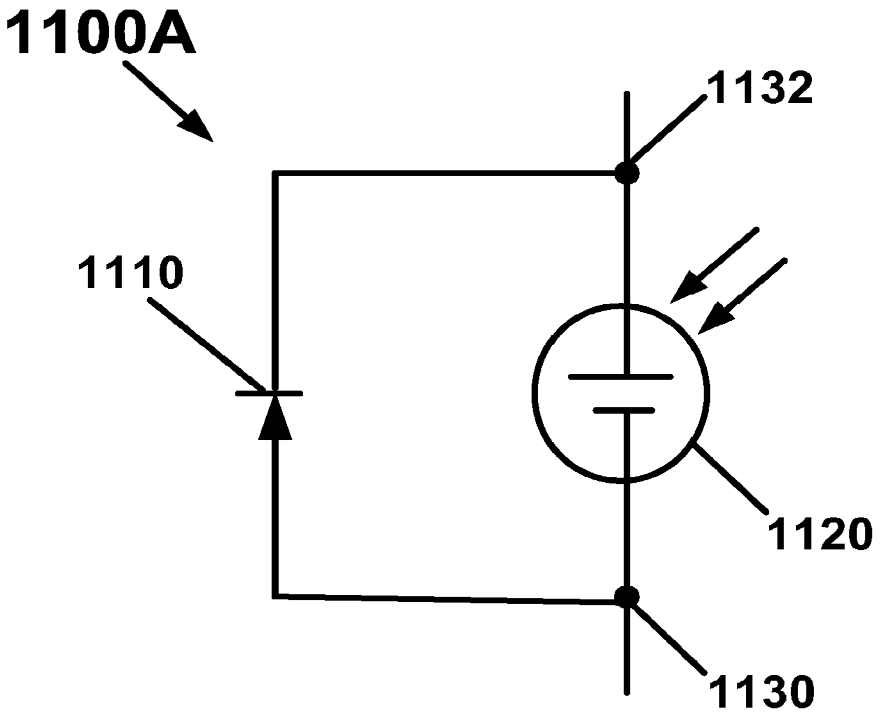
FIG. 11A is a schematic diagram of a diode used to by-pass current around a solar cell and electrically coupled in parallel with the solar cell, in accordance with an embodiment of the present invention.
Figure 11B:
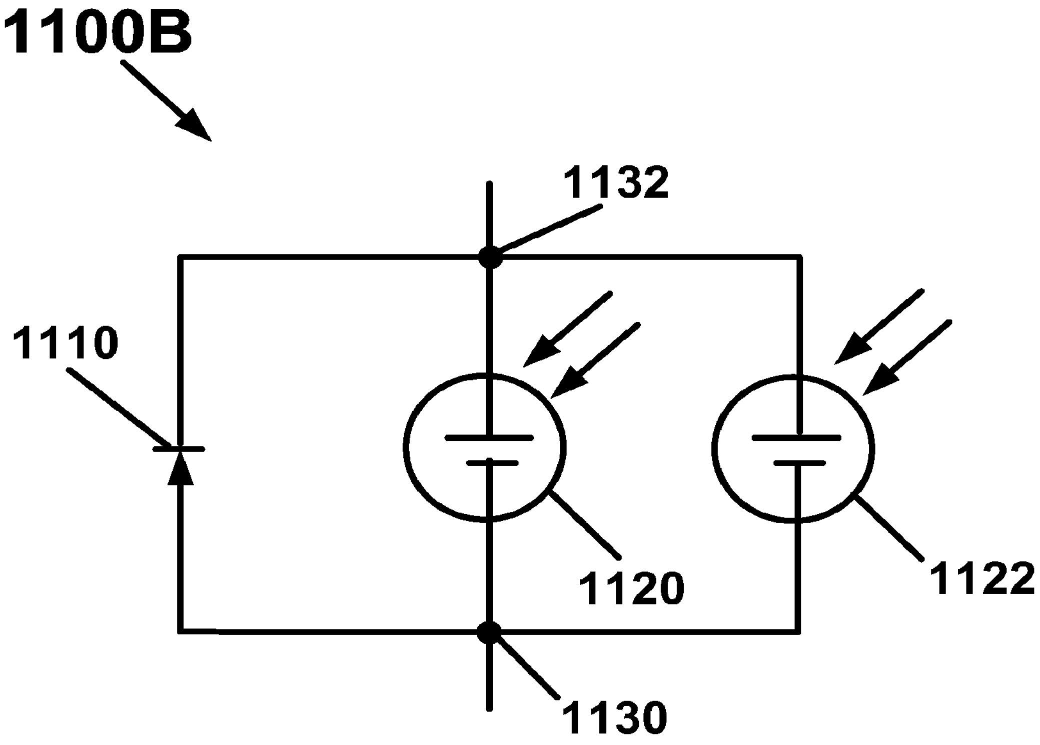
FIG. 11B is a schematic diagram of a diode used to by-pass current around a plurality of solar cells and electrically coupled in parallel with the plurality of solar cells that are electrically coupled in parallel, in accordance with an embodiment of the present invention.

With reference now to FIGS. 11A-11D, several embodiments of the present invention are shown that illustrate the manner in which a diode may be electrically coupled with at least one or a plurality of solar cells. Within the spirit and scope of embodiments of the present invention, at least one or the plurality of solar cells may be disposed in the solar-cell sub-module, and the diode may be disposed in an in-laminate-diode sub-assembly of an in-laminate diode assembly. FIG. 11A shows a schematic diagram 1100A of a diode 1110 used to by-pass current around a solar cell 1120 and electrically coupled in parallel with one solar cell 1120. The diode 1110 is electrically coupled in parallel to the solar cell 1120 at a first terminal 1132 and at a second terminal 1130. To by-pass current around the solar cell 1120 in an event that the solar cell 1120 develops a high resistance to the passage of solar-cell module current, the diode 1110 is coupled to solar cell 1120 with reverse polarity to that of the solar cell 1120. FIG. 11B shows a schematic diagram 1100B of the diode 1110 used to by-pass current around a plurality of solar cells and electrically coupled in parallel with the plurality of solar cells that are electrically coupled in parallel. The diode 1110 is electrically coupled in parallel to the combination of solar cell 1120 and a parallel solar cell 1122. The diode 1110 is electrically coupled with the parallel combination of solar cells 1120 and 1122 at first terminal 1132 and at second terminal 1130. To by-pass current around the parallel combination of solar cells 1120 and 1122 in an event that at least one of the solar cells

Figure 11C:
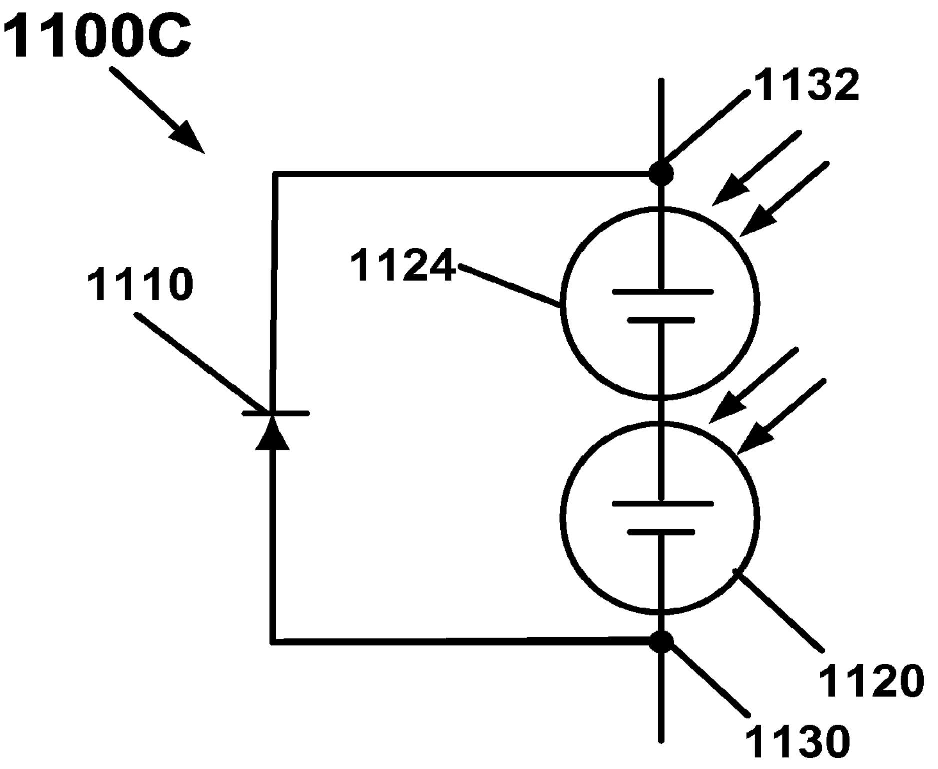
FIG. 11C is a schematic diagram of a diode used to by-pass current around a plurality of solar cells and electrically coupled in parallel with the plurality of solar cells that are electrically coupled in series, in accordance with an embodiment of the present invention.
Figure 11D:
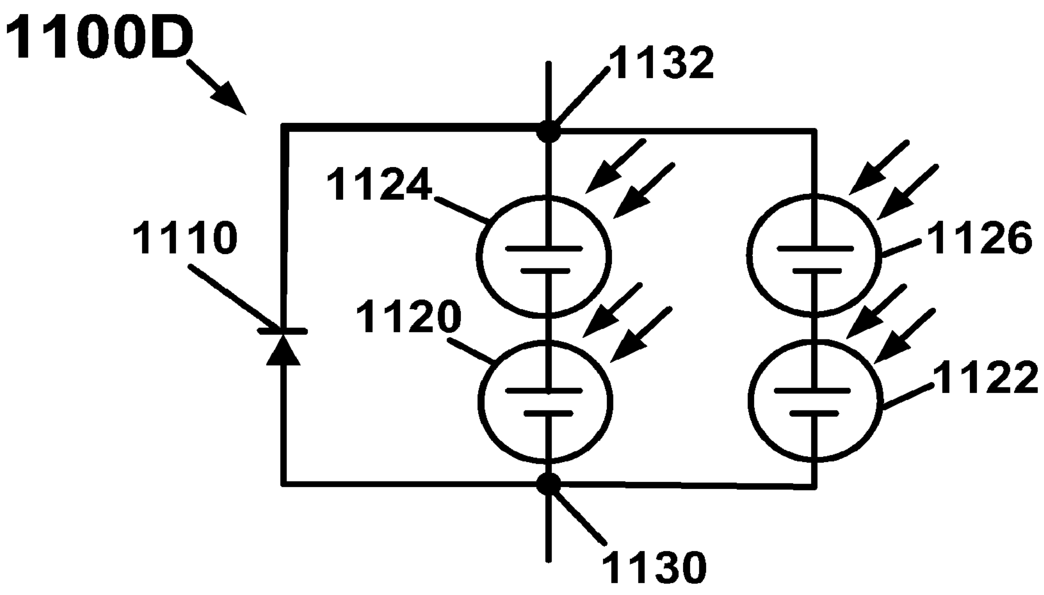
FIG. 11D is a schematic diagram of a diode used to by-pass current around a plurality of solar cells and electrically coupled in parallel with the plurality of solar cells that are electrically coupled in series and in parallel, in accordance with an embodiment of the present invention.

1120 or 1122 develops a high resistance to the passage of solar-cell module current, the diode 1110 is coupled to the solar cells 1120 and 1122 with reverse polarity to both of the solar cells 1120 and 1122. FIG. 11C shows a schematic diagram 1100C of the diode 1110 used to by-pass current around a plurality of solar cells and electrically coupled in parallel with the plurality of solar cells 1120 and 1124 that are electrically coupled in series. The diode 1110 is electrically coupled in parallel to the combination of solar cell 1120 and solar cell 1124 coupled in series with solar cell 1120. The diode 1110 is electrically coupled with the series combination of solar cells 1120 and 1124 at first terminal 1132 and at second terminal 1130. To by-pass current around the series combination of solar cells 1120 and 1124 in an event that at least one of the solar cells 1120 or 1124 develops a high resistance to the passage of solar-cell module current, the diode 1110 is coupled to the solar cells 1120 and 1122 with reverse polarity to both of the solar cells 1120 and 1124. FIG. 11D shows a schematic diagram 1100D of a diode used to by-pass current around a plurality of solar cells and electrically coupled in parallel with the plurality of solar cells that are electrically coupled in series and in parallel. The diode 1110 is electrically coupled in parallel to the combination of solar cell 1120 and solar cell 1124 coupled in series with solar cell 1120 and the combination of solar cell 1122 and solar cell 1126 coupled in series with solar cell 1122. The diode 1110 is electrically coupled with the series/parallel combination of solar cells 1120, 1124, 1122 and 1126 at first terminal 1132 and at second terminal 1130. To by-pass current around the series/parallel combination of solar cells 1120, 1124, 1122 and 1126 in an event that at least one of the solar cells 1120, 1124, 1122 and 1126 develops a high resistance to the passage of solar-cell module current, the diode 1110 is coupled to the solar cells 1120, 1124, 1122 and 1126 with reverse polarity to the solar cells 1120, 1124, 1122 and 1126. In accordance with embodiments of the present invention, a solar-cell sub-module may be selected from the group consisting of one solar cell, a parallel combination of solar cells, a series combination of solar cells and a series/parallel combination of solar cells. Moreover, although embodiments of the present invention have been shown as just two solar cells electrically coupled in series, and just two parallel legs of a circuit of solar cells electrically coupled in parallel, embodiments of the present invention include pluralities of series coupled solar cells greater than two, and pluralities of parallel coupled solar cells or parallel coupled pluralities of series coupled solar cells greater than two. Therefore, embodiments of the present invention include a diode electrically coupled in parallel with any network that includes a configuration of interconnected solar cells, in which the diode serves to by-pass current around the network in an event the network, or alternatively a solar cell within the network, develops high resistance to the flow of current through the solar-cell module.

With further reference to FIG. 10, in accordance with embodiments of the present invention, the solar-cell module 1002 includes at least one pair of first and terminating busbars 1019*a* and 1019*b*, respectively, electrically coupled to a first end and a terminating end of the plurality 1010 of solar-cells 1012*a*-1017*a* and 1012*b*-1017*b*. The first busbar 1019*a* may be disposed on and electrically coupled to a back side of a first solar cell, for example, solar cell 1012*a*. The terminating busbar 1019*b* may be disposed proximately to and electrically coupled to a light-facing side of a terminating solar cell 1017*b*. The pair of first and terminating busbars, respectively, 1019*a* and 1019*b* is electrically coupled to the pair of external-connection mechanisms mounted to respective edge regions, respectively, for example, located at corners 1080 and 1082. Alternatively, the solar-cell module 1002 may also include other pairs of first and terminating busbars (not shown), which may be electrically coupled to a first end and a terminating end of the second plurality 1020 of solar-cells 1022*a*-1027*a* and 1022*b*-1027*b*, or the third plurality 1030 of solar-cells 1032*a*-1037*a* and 1032*b*-1037*b*. Other first busbars may be disposed on and electrically coupled to back sides of respective first solar cells 1022*a* and 1032*a*. Other terminating busbars may be disposed proximately to and electrically coupled to light-facing sides of respective terminating solar cells 1027*b* and 1037*b*. The other pairs of first and terminating busbars may also be electrically coupled to the pair of external-connection mechanisms mounted to respective edge regions, respectively, for example, located at corners 1080 and 1082. The first busbar 1019*a* and the other first busbars may be separate entities that may be separated by one or more gaps; and, the terminating busbar 1019*b* and the other terminating busbars may be separate entities that may be separated by a second set of one or more gaps. In an embodiment of the present invention, the first busbar 1019*a* may be electrically coupled together with the other first busbars and the terminating busbar 1019*b* may be electrically coupled together with the other terminating busbars such that pluralities 1010, 1020 and 1030 of solar cells are electrically coupled in parallel. However, as shown in FIG. 10, there are no other busbars besides first busbar and terminating busbars 1019*a* and 1019*b*; only a single first busbar 1019*a* and a single terminating busbars 1019*b* electrically couple the pluralities 1010, 1020 and 1030 of solar cells in parallel.

With further reference to FIG. 10, in accordance with embodiments of the present invention, the solar-cell module 1002 may further include an integrated busbar-solar-cell-current collector as described above in Section I and shown in FIGS. 6A and 6B. The integrated busbar-solar-cell-current collector 690 includes the terminating busbar 680, identified with the terminating busbar 1019*b* of solar-cell module 1002, and the integrated solar-cell, current collector 670. The integrated solar-cell, current collector 670 includes the plurality of integrated pairs 670*a&b*, 670*c&d*, 670*e&f*, 670*g&h*, and 670*l&m* and 670*i* of electrically conductive, electrically parallel trace portions 670*a-m*. The plurality of integrated pairs 670*a&b*, 670*c&c*, 670*e&f*, 670*g&h*, 670*i* and 670*l&m* of electrically conductive, electrically parallel trace portions 670*a-m* is configured both to collect current from the terminating solar cell 660, identified with solar cell 1017*b*, and to interconnect electrically to the terminating busbar 680. The plurality of integrated pairs 670*a&b*, 670*c&c*, 670*e&f*, 670*g&h*, 670*i* and 670*l&m* of electrically conductive, electrically parallel trace portions 670*a-m* is configured such that solar-cell efficiency is substantially undiminished in an event that any one electrically conductive, electrically parallel trace portion, for example, 670*h*, of the plurality of integrated pairs 670*a&b*, 670*c&c*, 670*e&f*, 670*g&h*, 670*i* and 670*l&m* of electrically conductive, electrically parallel trace portions 670*a-m* is conductively impaired. The terminating busbar 680 may be disposed above, or below, and coupled electrically to extended portions, for example, extended portions 670*x* and 670*y*, of the plurality of integrated pairs 670*a&b*, 670*c&c*, 670*e&f*, 670*g&h*, 670*i* and 670*l&m* of electrically conductive, electrically parallel trace portions 670*a-m* configured such that the terminating busbar 680 is configured to reduce shadowing of the terminating solar cell 660. The extended portions 670*x* and 670*y* of the plurality of integrated pairs of electrically conductive, electrically parallel trace portions 670*a&b*, 670*c&c*, 670*e&f*, 670*g&h*, 670*i* and 670*l&m* allow the terminating busbar 680 to fold under the back side 668 of the terminating solar cell 660, identified with the terminating solar cell 1017*b* of solar-cell module 1002. Therefore, in accordance with embodiments of the present invention, the terminating busbar 680, identified with the terminating busbar 1019*b* of solar-cell module 1002, may be folded under the back side 668 of the terminating solar cell 660, identified with the terminating solar cell 1017*b* of solar-cell module 1002. Consequently, but without limitation to the folded-under configuration for the terminating busbar 680 described above, the solar-cell module 1002 may be arranged with a configuration to minimize wasted solar-collection space within the solar-cell module 1002 such that solar-cell-module efficiency is greater than solar-cell-module efficiency in the absence of such configuration, in accordance with embodiments of the present invention.

With further reference to FIG. 10, in accordance with embodiments of the present invention, the solar-cell module 1002 may further include an interconnect assembly 420 as described above in Section I and shown in FIGS. 4B and 4C. The solar-cell module 404, identified with solar-cell module 1002, includes the first solar cell 410, identified with solar cell 1012*a*, at least the second solar cell 430, identified with solar cell 1013*a*, and the interconnect assembly 420 disposed above the light-facing side 416 of the absorber layer of the first solar cell 410. The interconnect assembly 420 includes the trace including the plurality of electrically conductive portions 420*a*, 420*b*, 420*c*, 420*i* and 420*m*. The plurality of electrically conductive portions 420*a*, 420*b*, 420*c*, 420*i* and 420*m* is configured both to collect current from the first solar cell 410 and to interconnect electrically to the second solar cell 430. The plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired. In accordance with embodiments of the present invention, the plurality of electrically conductive portions 420*a*, 420*b*, 420*c*, 420*i* and 420*m* of the interconnect assembly 420 may be coupled electrically in series to form a single continuous electrically conductive line. In addition, the trace of the interconnect assembly 420 may be disposed in a serpentine pattern such that the interconnect assembly 420 is configured to collect current from the first solar cell 410 and to interconnect electrically to the second solar cell 430.

With further reference to FIG. 10, in accordance with embodiments of the present invention, the trace of the interconnect assembly 420 interconnecting the solar cells 1012*a* and 1013*a* of the solar-cell module 1002 is further described above in Section I and shown in FIGS. 5B and 5C. The trace 520 may further include an electrically conductive line including a conductive core 520A and at least one overlying layer 520B overlying the conductive core 520A. Alternatively, the trace 520 may include the electrically conductive line including the conductive core 520A including nickel, without the overlying layer 520B; or, the trace 520 may include the electrically conductive line including the conductive core 520A including material having greater conductivity than nickel and the overlying layer 520B including nickel.

With reference now to FIG. 12B, in accordance with embodiments of the present invention, a plan view 1200B of the solar-cell array 1252 including the plurality 1260 of solar-cell modules 1260*a*, 1260*b* and 1260*c* is shown. FIG. 12B shows the plurality 1260 of solar-cell modules 1260*a*, 1260*b* and 1260*c* combined with external-connection mechanisms mounted to respective edge regions and in-laminate-diode assemblies. For example, solar-cell module 1260*b* includes a first in-laminate-diode assembly 1270, a second in-laminate-diode assembly 1271 and a third in-laminate-diode assembly 1272; solar-cell module 1260*b* also includes a first busbar 1274 and a terminating busbar 1276 each electrically coupled with the first, second and third in-laminate-diode assemblies 1270, 1271 and 1272. The solar-cell module 1260*b* further includes a first external-connection mechanism 1280*b*, for example, a first junction box, mounted to a first edge region, for example, a first corner, of the protective structure and a second external-connection mechanism 1282*b*, for example, a second junction box, mounted to a second edge region, for example, a second corner, of the protective structure. The first external-connection mechanism 1280*b* mounted to a first respective edge region is configured to enable collection of current from the solar cells of the solar-cell module 1260*b* and to allow interconnection with at least one other external device, as shown here solar-cell module 1260*a*. Similarly, the second external-connection mechanism 1282*b* mounted to a second respective edge region is configured to enable collection of current from the solar-cell sub-modules of the solar-cell module 1260*b* and to allow interconnection with at least one other external device, as shown here solar-cell module 1260*c*. In embodiments of the present invention, the solar-cell module 1260*b* is coupled in series with the other solar-cell module 1260*a*, and also solar-cell module 1260*c*. However, in accordance with embodiments of the present invention, solar-cell modules may be interconnected in parallel or series/parallel combinations which are within the spirit and scope of the embodiments of the present invention.

With further reference to FIG. 12B, in accordance with embodiments of the present invention, solar-cell module 1260*a* also includes first external-connection mechanism 1280*a*, for example, a first junction box, mounted to a first edge region, for example, a first corner, of the protective structure of solar-cell module 1260*a* and a second external-connection mechanism 1282*a*, for example, a second junction box, mounted to a second edge region, for example, a second corner, of the protective structure of solar-cell module 1260*a*. Similarly, solar-cell module 1260*c* also includes a first external-connection mechanism 1280*c*, for example, a first junction box, mounted to a first edge region, for example, a first corner, of the protective structure of solar-cell module 1260*c* and a second external-connection mechanism 1282*c*, for example, a second junction box, mounted to a second edge region, for example, a second corner, of the protective structure of solar-cell module 1260*c*.

With further reference to FIG. 12B, in accordance with embodiments of the present invention, the external-connection mechanism 1280*b* mounted to its respective edge region of solar-cell module 1260*b* is disposed in a configuration opposite the external-connection mechanism 1282*b* mounted to its respective edge region of solar-cell module 1260*b* on a lateral side of the solar-cell module 1260*b*. This configuration, when applied to the plurality 1260 of all solar-cell modules 1260*a*, 1260*b* and 1260*c*, allows the two solar-cell modules 1260*a* and 1260*b* with external-connection mechanisms 1282*a* and 1280*b* mounted to respective edge regions to be disposed on respective lateral sides of the two solar-cell modules 1260*a* and 1260*b*. The solar-cell modules 1260*a* and 1260*b*, thus configured, may be intercoupled with interconnector 1284. Thus, the second external-connection mechanism 1282*a* of the first solar-cell module 1260*a* may be disposed proximately to the first external-connection mechanism 1280*b* of the second solar-cell module 1260*b*. Alternatively, the first external-connection mechanism 1280*c* of the third solar-cell module 1260*c* may be disposed proximately to the second the second external-connection mechanism 1282*b* of the second solar-cell module 1260*b*. Thus, in accordance with embodiments of the present invention, a first external-connection mechanism of a plurality of external-connection mechanisms of a solar-cell module is disposed proximate to a second external-connection mechanism of a second plurality of external-connection mechanisms of another solar-cell module. Moreover, in accordance with embodiments of the present invention, a first external-connection mechanism of a plurality of external-connection mechanisms of a solar-cell module, for example, the first external-connection mechanism 1280*c* of third solar-cell module 1260*c*, and a second external-connection mechanism of a plurality of external-connection mechanisms of a second solar-cell module, for example, the second external-connection mechanism 1282*b* of solar-cell module 1260*b*, are arranged on their respective solar-cell modules 1260*c* and 1260*b* to minimize a length of an interconnector 1288 between the first external-connection mechanism 1280*c* and the second external-connection mechanism 1282*b*. Thus, the solar-cell modules 1260*a*, 1260*b* and 1260*c* are intercoupled to form the solar-cell array 1252. Furthermore, in accordance with embodiments of the present invention, a first external-connection mechanism of a plurality of external-connection mechanisms of a solar-cell module may be selected from the group consisting of a wire, a connector, a lead, and a junction box. Also, an edge region may be selected from the group consisting of an edge of the solar-cell module and a corner of the solar-cell module, where two edges may meet.

With reference now to FIG. 12A, the embodiments of the present invention described for FIG. 12B are contrasted with another embodiment of the present invention that employs centrally-mounted junction boxes 1230*a*, 1230*b* and 1230*c*. FIG. 12A is a plan view 1200A of a solar-cell array 1202 including a plurality 1210 of solar-cell modules 1210*a*, 1210*b* and 1210*c* combined with centrally-mounted junction boxes 1230*a*, 1230*b* and 1230*c* and in-laminate-diode assemblies 1220, 1212 and 1222 (shown only for solar-cell module 1210*b*). Solar-cell module 1210*b* includes a first in-laminate-diode assembly 1220, a second in-laminate-diode assembly 1221 and a third in-laminate-diode assembly 1222. Solar-cell module 1210*b* also includes a first busbar 1224 and a terminating busbar 1226 each electrically coupled with the first, second and third in-laminate-diode assemblies 1220, 1221 and 1222. Because the junction box 1230*b* of solar-cell module 1210*b* is centrally mounted, centrally-mounted junction box 1230*b* requires additional wiring to collect current from the solar-cell module 1210*b*. For example, a first supplemental busbar 1228 is electrically coupled to the first busbar 1224; and a second supplemental busbar 1229 is electrically coupled to the terminating busbar 1226. Similarly, because the junction box 1230*b* of solar-cell module 1210*b* is centrally mounted, long interconnectors are required between solar-cell modules. For example, a first interconnector 1234 between centrally-mounted junction boxes 1230*a* and 1230*b* is required to interconnect solar-cell modules 1210*a* and 1210*b*; and, a second interconnector 1238 between centrally-mounted junction boxes 1230*b* and 1230*c* is required to interconnect solar-cell modules 1210*b* and 1210*c*. As shown in FIG. 12A, the first interconnector 1234 includes two portions 1234*a* and 1234*b* which attach respectively to centrally-mounted junction boxes 1230*a* and 1230*b*, and are provided with connectors joining the two portions together; and, the second interconnector 1238 includes two portions 1238*a* and 1238*b* which attach respectively to centrally-mounted junction boxes 1230*b* and 1230*c*, and are provided with connectors joining the two portions together. This arrangement is contrasted with the short interconnectors 1284 and 1288 shown in FIG. 12B. Thus, the interconnection arrangement shown in FIG. 12B is less costly, because it requires less wiring, and improves solar-cell array efficiency, because there is less parasitic series resistance than would obtain with the additional wiring shown in FIG. 12A.

With further reference to FIGS. 12A and 12B, another distinguishing feature of embodiments of the present invention of FIG. 12B is that the use of an in-laminate-diode assembly facilitates the use of a plurality of external-connection mechanisms mounted to a respective plurality of edge regions. For embodiments of the present invention of FIG. 12A having centrally mounted junction boxes, a single diode included in the junction box would typically be employed instead of the in-laminate-diode assemblies, as shown. To the inventors' knowledge, one of the reasons those skilled in the art have not considered using separate junction boxes is because of the difficulty in placing a diode within separated junction boxes to provide the by-pass protection discussed above. Thus, a distinguishing feature of embodiments of the present invention is the use of an in-laminate-diode assembly that allows the use of separate junction boxes without the necessity of including diodes within a junction box.

Figure 13:
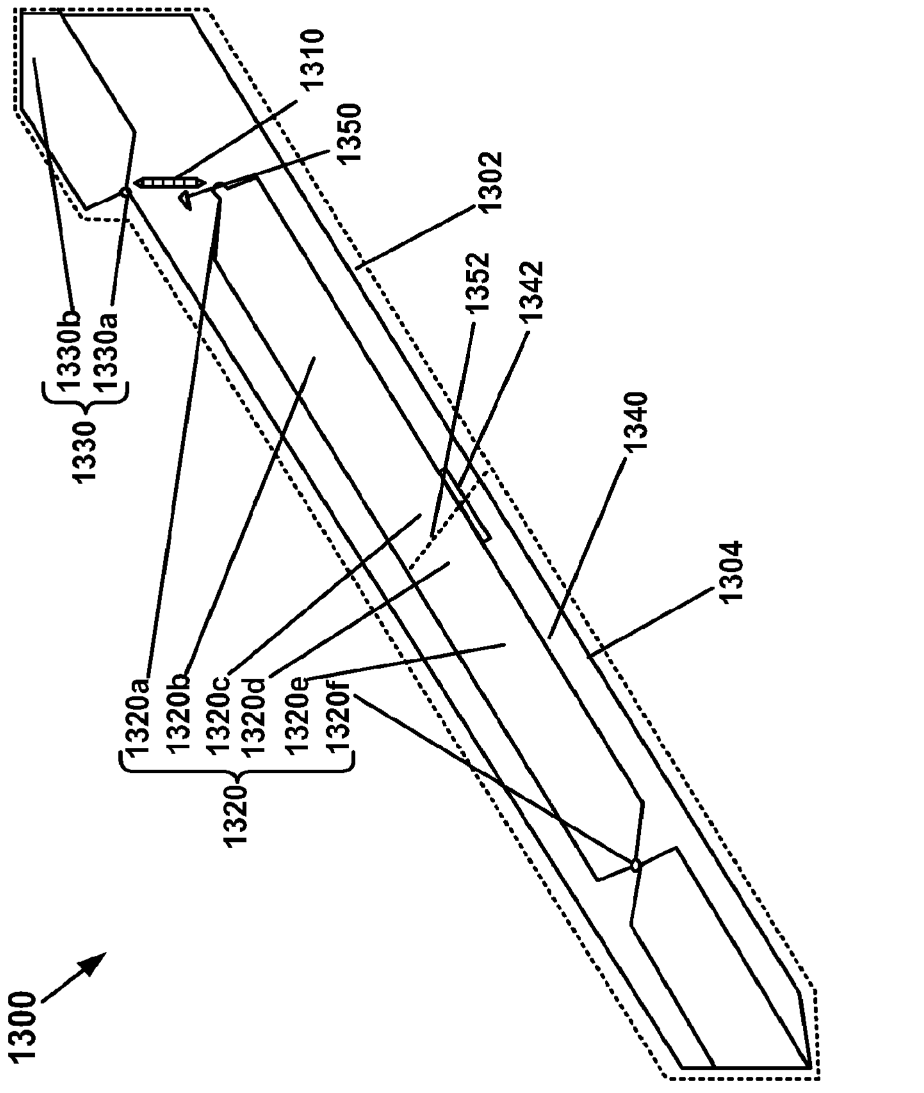
FIG. 13 is a combined perspective-plan and expanded view of in-laminate-diode sub-assemblies showing an arrangement of a diode therein, in accordance with an embodiment of the present invention.

With reference now to FIG. 13, in accordance with embodiments of the present invention, a combined perspective-plan and expanded view 1300 of an in-laminate-diode sub-assembly 1302 with diode 1310 is shown at the top and right of the figure. Also, towards the bottom and left of FIG. 13, a perspective-plan view of a second in-laminate-diode sub-assembly 1304 in a more fully assembled state is shown. The in-laminate-diode assembly of a solar-cell module, for example, in-laminate-diode assembly 1050 of solar-cell module 1002 of FIG. 10, may include a plurality of in-laminate-diode sub-assemblies, for example, in-laminate-diode sub-assemblies 1050*a* and 1050*b*. Alternatively, an in-laminate-diode assembly may include at least one in-laminate-diode sub-assembly. The in-laminate-diode sub-assembly 1302, which may be identified with in-laminate-diode sub-assembly 1050*b*, includes the diode 1310. The in-laminate-diode sub-assembly also includes a first conductor 1320 electrically coupled to the diode 1310. The first conductor 1320 is configured to couple electrically with a first terminal, which may be electrically coupled to a back side, of a primary solar cell of the solar-cell sub-module. The in-laminate-diode sub-assembly 1302 also includes a second conductor 1330 electrically coupled to the diode 1310, the second conductor 1330 configured to couple electrically with a second terminal, which may be electrically coupled to a light-facing side, of a last solar cell of the solar-cell sub-module.

With further reference to FIG. 13, in accordance with embodiments of the present invention, the diode 1310 is disposed between the first conductor 1320 and the second conductor 1330. In the expanded view at the top and right of FIG. 13, the disposition of the diode 1310 between first and second conductors 1320 and 1330 is indicated by a double-headed arrow 1350. The diode 1310 is disposed between a first tab portion 1320*a* of first conductor 1320 and a second tab portion 1330*a* of second conductor 1330. In an embodiment of the present invention, the diode may be a simple chip diced from a silicon wafer having a pn junction, as may be the case for an initially homogenously doped wafer with a diffused or implanted dopant profile of opposite type from a dopant species used in growing a boule from which the wafer is sliced. At least one of the first and second conductors 1320 and 1330 may be configured as a heat sink to remove heat generated by the diode 1310, although a heat-dissipating function may be provided by separate components. Because first and second conductors 1320 and 1330 may have the dual function of both providing an electrical path for, and dissipating heat generated by, current that by-passes a solar-cell sub-module with high resistance, both first conductor 1320 and second conductor 1330 may have a large current-carrying and heat-dissipating portions 1320*b* and 1330*b*, respectively. Alternatively, the in-laminate-diode assembly may be made with separate components for the heat-spreading function and the current-carrying function. Therefore, the first and second conductors 1320 and 1330 may be configured to provide an electrical path for current that by-passes a solar-cell sub-module; and, separate heat sinks configured as separate components from the first and second conductors 1320 and 1330 may be provided to dissipate heat generated by current that by-passes a solar-cell sub-module. In addition, both first conductor 1320 and second conductor 1330 may have broad low-contact-resistance portions 1320*c* (not shown for second conductor 1330) for making electrical contact and electrically coupling with respective portions of solar cells, or other components, for example, busbars, in the solar-cell sub-module, which the in-laminate-diode sub-assembly protects. In addition, the in-laminate-diode sub-assembly 1302 includes an electrically-insulating-laminate strip 1340. The electrically-insulating-laminate strip 1340 may be disposed between a plurality of first and second terminals, which may be back sides, of solar cells of the solar-cell sub-module, and the first conductor 1320 and the second conductor 1330. In an embodiment of the present invention, the plurality of first and second terminals of solar cells may be exclusive of the back side of the primary, or first, solar cell of a solar-cell sub-module.

With further reference to FIG. 13, in accordance with embodiments of the present invention, the back side of a solar cell may provide electrical coupling to both the light-facing side of one solar cell in the solar-cell sub-module and the back side of an adjacent solar cell in an adjacent solar-cell sub-module as for the interconnect assembly described above for FIGS. 4A-4F. The first terminal may be electrically coupled to a positive terminal or a negative terminal of a solar cell in the solar-cell sub-module with which the diode is electrically coupled in parallel as described above for FIGS. 11A-11D. Similarly, the second terminal may be electrically coupled to a positive terminal or a negative terminal of a solar cell in the solar-cell sub-module with which the diode is electrically coupled in parallel, but the second terminal will be electrically coupled to the terminal of the solar cell having opposite polarity to that of the terminal of the solar cell to which the first terminal is electrically coupled. For example, if the first terminal is electrically coupled to a positive terminal of a solar cell, the second terminal will be electrically coupled to a negative terminal of a solar cell. However, the polarity of the diode will always be electrically coupled with opposite to the polarity of the solar cell terminals with which the first and second terminals are electrically coupled as described above for FIGS. 11A-11D. In an embodiment of the present invention, the back side of a solar cell corresponds to positive terminal of the solar cell, and the light-facing side corresponds to negative terminal of the solar cell, as for the CIGS solar cells described in FIGS. 1A-1B. However, it should be noted that nothing precludes the application of embodiments of the present invention to solar-cell modules where the back side of a solar cell corresponds to a negative terminal of the solar cell, and the light-facing side corresponds to a positive terminal of the solar cell, or alternatively where both the positive and negative terminals of the solar cell may be disposed on the same side of the solar cell, whether it may be a back side or a light-facing side, so that such embodiments of the present invention are within the spirit and scope of embodiments of the present invention.

With further reference to FIG. 13, in accordance with embodiments of the present invention, the in-laminate-diode sub-assembly 1302 further includes the electrically-insulating-laminate strip 1340 configured to allow access of at least one of the first and second conductors 1320 and 1330 to a solar cell of the plurality of solar cells of a solar-cell module, or solar-cell sub-module, for electrically coupling with the solar cell. For example, the electrically-insulating-laminate strip 1340 may include a continuous electrically-insulating-laminate strip with an access region 1342 through which the first conductor electrically couples with the back side of the primary solar cell. Alternatively, the electrically-insulating-laminate strip 1340 may include a plurality of separate electrically-insulating-laminate sub-strips separated by gaps corresponding with first and second terminals at which an in-laminate-diode sub-assembly makes contact with solar cells of the solar-cell sub-module. Therefore, the access region 1342 may be selected from the group consisting of a window, an opening, an aperture, a gap, and a discontinuity in the electrically-insulating-laminate strip 1340. As shown in FIG. 13, this also allows the second conductor 1330 to electrically couple with the light-facing side of the last solar cell of the solar-cell sub-module, because the light-facing side of the last solar cell of the solar-cell sub-module may be electrically coupled in common with the back side of the primary solar cell of an adjacent solar-cell sub-module through an interconnect assembly between the back side of the primary solar cell and the light-facing side of the last solar cell of adjacent solar-cell sub-modules (not shown).

With further reference to FIG. 13, in accordance with embodiments of the present invention, the in-laminate-diode sub-assembly 1302 further includes at least one of the first and second conductors 1320 and 1330 structured to enable a laminated electrical connection between at least one of the first and second conductors 1320 and 1330 and another component of the solar-cell module. Another component of the solar-cell module may be a first busbar, a terminating busbar and the terminal of a solar cell of a solar-cell sub-module. The laminated electrical connection does not require solder, welding, a conducting adhesive or any other material disposed between a first contacting surface of the first conductor 1320 and/or second conductor 1330 and a second contacting surface of the other component of the solar-cell module to which the first conductor 1320 and/or second conductor 1330 are electrically connected. The laminated electrical connection requires only that a mechanical pressure be applied to hold the first conductor 1320 and/or second conductor 1330 in intimate contact with the other component of the solar-cell module to which the first conductor 1320 and/or second conductor 1330 are electrically connected.

With further reference to FIG. 10 and FIG. 13, in accordance with embodiments of the present invention, the first conductor 1320 may further include a first electrically-conducting-laminate strip configured to couple electrically with a first terminal of an adjacent last solar cell, for example, solar cell 1017*a*, of a first adjacent solar-cell sub-module, for example, solar-cell sub-module 1010*a*, and electrically coupled with a first adjacent diode. In an embodiment of the present invention, the first terminal of the adjacent last solar cell of the first adjacent solar-cell sub-module may be a light-facing side of the adjacent last solar cell of the first adjacent solar-cell sub-module. Thus, the first electrically-conducting-laminate strip has the function of both the first conductor 1320 of in-laminate-diode sub-assembly 1302 and the second conductor of second in-laminate-diode sub-assembly 1304. As shown in FIG. 13, the first conductor 1320 of in-laminate-diode sub-assembly 1302 has portions 1320*d*, 1320*e* and

1320*f* that serve, respectively, as a broad low-contact-resistance portion 1320*d*, a large current-carrying and heat-dissipating portion 1320*e* and a second tab portion 1320*f* as a second conductor of second in-laminate-diode sub-assembly 1304. Alternatively, the second conductor of second in-laminate-diode sub-assembly 1304 may be separated from the first conductor 1320 of in-laminate-diode sub-assembly 1302 along dashed line 1352 to provide the functions of the broad low-contact-resistance portion 1320*d*, the large current-carrying and heat-dissipating portion 1320*e* and the second tab portion 1320*f* of the second conductor of second in-laminate-diode sub-assembly 1304. Similarly, in accordance with embodiments of the present invention, the second conductor 1330 may further include a second electrically-conducting-laminate strip configured to couple electrically with a second terminal of an adjacent primary solar cell, for example, solar cell 1012*b*, of a second adjacent solar-cell sub-module, for example, solar-cell sub-module 1010*b*, and electrically coupled with a second adjacent diode. In an embodiment of the present invention, the second terminal of the adjacent primary solar cell of the second adjacent solar-cell sub-module may be a back side of the adjacent primary solar cell of the second adjacent solar-cell sub-module. Alternatively, the first terminal and the second terminal may be configured as described in the preceding paragraphs, particularly as described for FIGS. 11A-11D.

With reference now to FIG. 14, FIG. 10 and FIG. 12, in accordance with embodiments of the present invention, a combined plan and perspective view 1400 of a lead 1422 at a cut corner 1418 of the back glass 1414 of a solar-cell module, for example, solar-cell module 1002, is shown. The lead 1422 is shown here as a folded-over lead, without limitation thereto for embodiments of the present invention. An external-connection mechanism of the solar-cell module is electrically coupled to the lead 1422 at an edge region, for example, the cut corner 1418, of the plurality of edge regions of the protective structure of the solar-cell module, for example, solar-cell module 1002. The lead 1422 is electrically coupled to the plurality of solar cells, for example, plurality 1010 of solar cells 1012*a*-1017*a* and 1012*b*-1017*b*. As described above, an external-connection mechanism of the solar-cell module may be selected from the group consisting of a wire, a connector, a lead, and a junction box, for example, external-connection mechanism 1282*b* as discussed here; and, an edge region may be selected from the group consisting of an edge of the solar-cell module and a corner of the solar-cell module, where two edges may meet, for example, cut corner 1418 as discussed here. The junction box, for example, external-connection mechanism 1282*b*, of the solar-cell module, for example, solar-cell module 1260*b*, may be electrically coupled to an interconnector, for example, interconnector 1288, through the lead 1422 at the cut corner 1418 of the back glass 1414 of the solar-cell module 1260*b*. The lead 1422 may be intercoupled with appropriate lugs and internal wiring to an external terminal junction of the junction box, for example, external-connection mechanism 1282*b*, to provide this electrical coupling. The lead 1422 may be electrically coupled to the plurality of solar-cell sub-modules, for example, solar-cell sub-modules 1010*a*-1010*b*, through a busbar (not shown) to which it is electrically coupled. In embodiments of the present invention, the lead 1422 at the edge region, for example, cut corner 1418, of the plurality of edge regions of the protective structure, for example, back glass 1414, may include a copper lead.

With further reference to FIG. 14 and FIG. 10, in accordance with embodiments of the present invention, an edge 1424 of the lead 1422 at the edge region, for example, cut corner 1418, of the protective structure, for example, front glass 1410 or back glass 1414, is located at a distance 1428 at least three-eighths of an inch from a nearest externally accessible portion of the protective structure, for example, a joint 1426 between the external-connection mechanism (not shown) and the front glass 1410 or back glass 1414, proximate to the edge of the lead. For example, the edge 1424 of the lead at the cut corner 1418 of the front glass 1410 or back glass 1414 may be located no closer than the distance 1428 of three-eighths of an inch from the joint 1426 that an external-connection mechanism, for example, a junction box, makes with the protective structure, for example, front glass 1410 or back glass 1414. Alternatively, the edge region may be a set-off notch (not shown) at an edge, for example, edges 1090, 1092, 1094 and 1096 as shown in FIG. 10, of the protective structure, rather than the cut corner 1418, at which an external-connection mechanism, for example, a junction box might be disposed. It should be noted that the joint 1426 between the outer surface of the junction box and the front glass 1410 or back glass 1414 is the nearest externally accessible portion of the protective structure. The three-eighths of an inch distance 1428 between this joint 1426 and the edge 1424 of the lead 1422 would provide a safe distance against the intrusive migration of water along the interface between encapsulating adhesives used to attach the junction box to the front glass 1410 or back glass 1414 and potting compounds used in the junction box to electrically insulate the lead 1422. A distance shorter than the three-eighths of an inch distance 1428 might cause an electrical shock hazard for a potential difference above ground potential, greater than or equal to 600 volts, on the lead 1422. In addition, the lead 1422 at the edge region, for example, cut corner 1418, of the protective structure, for example, back glass 1414, may include a portion of a bulbar (not shown) attached to the plurality of solar cells, for example, the plurality 1010 of solar cells 1012*a*-1017*a* and 1012*b*-1017*b*. As shown in FIG. 14, the front glass 1410 and the back glass 1414 that encapsulate the plurality of solar cells, for example, the plurality 1010 of solar cells 1012*a*-1017*a* and 1012*b*-1017*b*, provides a protective structure for the solar-cell module, for example, solar-cell module 1002 as shown in FIG. 10. In accordance with embodiments of the present invention, the lead 1422 at the edge region, for example, cut corner 1418, is sealed between the front glass 1410 of the protective structure and a bottom portion, for example, back glass 1414, of the protective structure with a first layer 1430 of polymeric sealing material and a second layer 1432 of polymeric sealing material. The first layer 1430 of polymeric sealing material is disposed between a lead-facing portion of the front glass 1410 and the lead 1422, and the second layer 1432 of polymeric sealing material is disposed between a lead-facing portion of the bottom portion of the protective structure and the lead 1422. In embodiments of the present invention, the polymeric sealing material may be a butyl-based sealing material. The bottom portion of the protective structure may be a back glass 1414 but without limitation thereto for embodiments of the present invention; for example, the bottom portion might be a non-transparent electrically insulating material other than glass. To the inventors' knowledge, the use of this double application of polymeric sealing material to seal a lead emerging from between the edges of the protective structure, for example, front glass 1410 and back glass 1414, of a solar-cell module has not been used prior to its use in embodiments of the present invention.

Figure 15A:
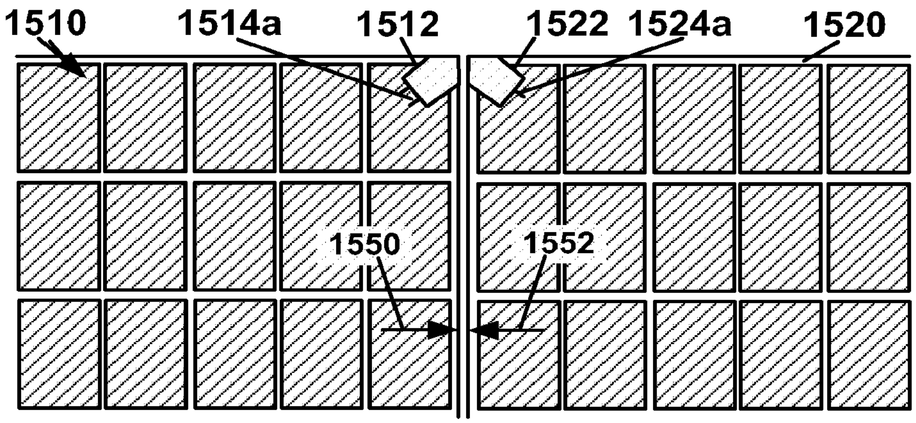
FIG. 15A is a plan view of a first junction box of a first solar-cell module with a female receptacle and a second junction box of a second solar-cell module with a male connector configured to allow interconnection with the first solar-cell module, in accordance with an embodiment of the present invention.
Figure 15B:
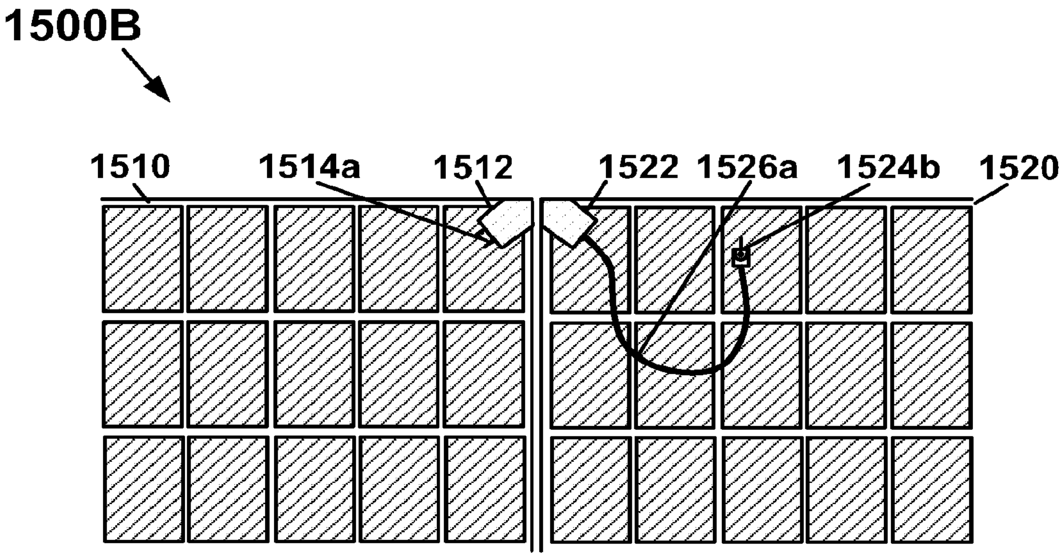
FIG. 15B is a plan view of an interconnector with a male connector integrally attached to the second junction box of the second solar-cell module and configured to allow interconnection with the first junction box with the female receptacle of the first solar-cell module, in accordance with an embodiment of the present invention.
Figure 15C:
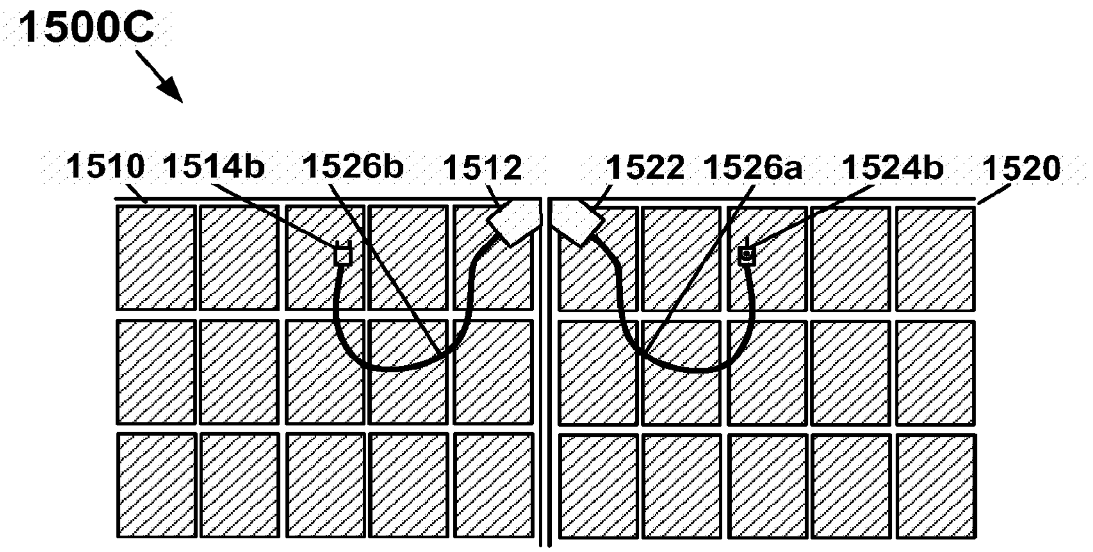
FIG. 15C is a plan view of an interconnector with a female receptacle integrally attached to the first junction box of the first solar-cell module, and of the interconnector with the male connector integrally attached to the second junction box of the second solar-cell module and configured to allow interconnection with the first junction box, in accordance with an embodiment of the present invention.

With reference now to FIGS. 15A, 15B and 15C, in accordance with embodiments of the present invention, various interconnection schemes for interconnecting solar-cell modules having a variety of external-connection mechanisms are shown. The external-connection mechanisms are selected from the group consisting of junction boxes with an integrally attached male connector or an integrally attached female receptacle, and junction boxes with integrally attached leads having an attached male connector or an attached female receptacle. The embodiments of the present invention described for FIGS. 15A, 15B and 15C are but representative of embodiments of the present invention and are provided without limitation thereto, as other embodiments of the present invention for interconnecting two solar-cell modules are also within the spirit and scope of embodiments of the present invention.

With reference now to FIG. 15A, in accordance with embodiments of the present invention, a plan view 1500A of a first junction box 1512 of a first solar-cell module 1510 with a female receptacle 1514*a* and a second junction box 1522 of a second solar-cell module 1520 with a male connector 1524*a* configured to allow interconnection with the first solar-cell module 1510 is shown. An interconnector (not shown) provided with the male connector at one end and a female receptacle at the other end may be used to interconnect first and second solar cell modules 1510 and 1520. Junction boxes 1512 and 1522 may be mounted on the respective corners of their respective solar-cell modules 1510 and 1520 with adhesives, and the internal wiring and connections with respective leads of their respective solar-cell modules 1510 and 1520 may be protected from the environment with suitable electrical potting compounds. In accordance with embodiments of the present invention, the separation between first and second solar-cell modules 1510 and 1520, indicated by a gap between arrows 1550 and 1552, may also be minimized so as to reduce the length of an interconnector (not shown) between first and second solar-cell modules 1510 and 1520. Minimizing the separation between solar-cell modules improves solar-cell array efficiency by reducing wasted solar-collection space over the foot-print of the solar-cell array, as well as reducing the parasitic series resistance associated with a long interconnector having to span a large separation between first and second solar-cell modules 1510 and 1520. Thus, in accordance with embodiments of the present invention, the solar-cell modules are arranged with a configuration to minimize wasted solar-collection space within the solar-cell array such that solar-cell-array efficiency is greater than solar-cell-array efficiency in the absence of the configuration.

With reference now to FIG. 15B, in accordance with embodiments of the present invention, a plan view 1500B of an interconnector 1526*a* with a male connector 1524*b* integrally attached to the second junction box 1522 of the second solar-cell module 1520 and configured to allow interconnection with the first junction box 1512 with the female receptacle 1514*a* of the first solar-cell module 1510 is shown. In accordance with embodiments of the present invention, the interconnector 1526*a* between the second junction box 1522 of the second solar-cell module 1520 and the first junction box 1512 of the first solar-cell module 1510 may be a flexible interconnector. The interconnector 1526*a* between the second junction box 1522 of the second solar-cell module 1520 and the first junction box 1512 of the first solar-cell module 1510 may also be a rigid interconnector. The interconnector 1526*a* may be integrally attached to the second junction box 1522 of the second solar-cell module 1520 and configured to allow interconnection with the first junction box 1512 of the first solar-cell module 1510 such that the interconnector 1526*a* has the male connector 1524*b* to interconnect to the female receptacle 1514*a* integrally attached to the first junction box 1512 of the first solar-cell module 1510.

With reference now to FIG. 15C, in accordance with embodiments of the present invention, a plan view 1500C of an interconnector 1526*b* with a female receptacle 1514*b* integrally attached to the first junction box 1512 of the first solar-cell module 1510, and of the interconnector 1526*a* with the male connector 1524*b* integrally attached to the second junction box 1522 of the second solar-cell module 1520 and configured to allow interconnection with the first junction box 1512 is shown. In accordance with embodiments of the present invention, the interconnector 1526*a* attached to the second junction box 1522 of the second solar-cell module 1520 may be a flexible interconnector. Similarly, the interconnector 1526*b* attached to the first junction box 1512 of the first solar-cell module 1510 may be a flexible interconnector. The interconnector 1526*a* attached to the second junction box 1522 of the second solar-cell module 1520 and the first junction box 1512 of the first solar-cell module 1510 may also be a rigid interconnector. Similarly, the interconnector 1526*b* attached to the first junction box 1512 of the first solar-cell module 1510 may be a rigid interconnector. The interconnectors 1526*a* and 1526*b* may be integrally attached to their respective junction boxes 1522 and 1512 and configured to allow interconnection of the first junction box 1512 of the first solar-cell module 1510 to the second junction box 1522 of the second solar-cell module 1520 through the interconnection of the male connector 1524*b* with the female receptacle 1514*b*.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A solar cell module, comprising:

a plurality of electrically interconnected solar cells;

a protective structure at least partially encapsulating the plurality of solar cells, the protective structure comprising a substantially rectangular electrically insulating transparent front layer over a light-facing side of the plurality of solar cells, and an electrically insulating back layer under a back side of the plurality of solar cells, the front layer being substantially rectangular without an oblique cut corner, the back layer being substantially co-extensive with the front layer but comprising an oblique cut corner; and a junction box, electrically connected with the plurality of solar cells, the junction box configured for collection of electric current from said plurality of solar cells and for electrical interconnection with an external device, the junction box mounted on the module in a joint region and covering a portion of the back layer and the oblique cut corner of the back layer of the protective structure without extending over any portion of the front layer;

wherein the junction box is electrically connected with the plurality of solar cells via an uninsulated flat lead emerging from the module at the oblique corner cut;

wherein a first layer of polymeric sealing material is disposed between a lead-facing portion of the front layer and the lead; and wherein a proximal edge of the lead and a second layer of polymeric sealing material disposed between a lead-facing portion of the back layer and the lead are folded over the back layer at the oblique cut corner of the back layer and the lead is located at a distance of at least three-eighths of an inch from a nearest externally accessible portion of the protective structure.

2. The solar cell module of claim 1, wherein the front and back layers of the protective structure comprise glass sheets.

3. The solar cell module of claim 1, wherein the front layer of the protective structure comprises a glass sheet and the back layer of the protective structure comprises a non-transparent electrically insulating material other than glass.

4. The solar cell module of claim 1, wherein the lead is electrically connected with the plurality of solar cells via a busbar in turn electrically connected with an interconnect/current collector in contact with the light-facing side of the plurality of solar cells.

5. The solar cell module of claim 4, wherein the junction box comprises lugs and internal wiring to an external terminal junction.

6. The solar cell of claim 5, wherein the external terminal junction is configured to electrically connect with an interconnector cable configured for electrical connection to an external device.

7. The solar cell module of claim 1, wherein the polymeric sealing material of the first and second layers is a butyl-based sealing material.

8. The solar cell module of claim 1, wherein the external device is selected from the group consisting of another solar cell module, an inverter, a battery charger, an external load, and an electrical-power-distribution system.

9. The solar cell module of claim 1, wherein the lead is electrically connected with the plurality of solar cells via a busbar in turn electrically connected with an interconnect/current collector in contact with the light-facing side of the plurality of solar cells.

10. The solar cell module of claim 1, wherein the junction box comprises lugs and internal wiring to an external terminal junction.

11. The solar cell of claim 10, wherein the external terminal junction is configured to electrically connect with an interconnector cable configured for electrical connection to an external device.

12. The solar cell module of claim 11, wherein the external device is selected from the group consisting of another solar cell module, an inverter, a battery charger, an external load, and an electrical-power-distribution system.

13. The solar cell module of claim 1, wherein the module is frameless.

14. A solar cell array, comprising:

a plurality solar cell modules according to claim 1;

electrical interconnections between the plurality of solar cell modules, the interconnections comprising electrical connections between the corner junction boxes of adjacent solar cells.

15. A frameless solar cell module, comprising:

a plurality of electrically interconnected solar cells;

a protective structure at least partially encapsulating the plurality of solar cells, the protective structure comprising, a front glass over a light-facing side of the plurality of solar cells, the front glass being substantially rectangular without an oblique cut corner, and a back glass under a back side of the plurality of solar cells, the back glass comprising an oblique corner cut;

an uninsulated flat lead emerging from the module at the oblique corner cut, a proximal edge of the lead located at a distance of at least three-eighths of an inch from a nearest edge of the front glass; and a junction box, electrically connected with the plurality of solar cells, the junction box configured for collection of electric current from said plurality of solar cells and for electrical interconnection with an external device, the junction box disposed in a joint region and covering a portion of the back layer and the oblique corner cut of the protective structure without extending over any portion of the front layer and electrically connected with the plurality of solar cells via the lead emerging from the module at the oblique corner cut;

wherein a first layer of a polymeric sealing material is disposed between a lead-facing portion of the front layer and the lead; and wherein a proximal edge of the lead and a second layer of the polymeric sealing material disposed between a lead-facing portion of the back layer and the lead are folded over the back layer at the oblique cut corner of the back layer and the lead is located at a distance of at least three-eighths of an inch from a nearest externally accessible portion of the protective structure.

16. The solar cell module of claim 15, wherein the polymeric sealing material of the first and second layers is a butyl-based sealing material.

17. The solar cell module of claim 15, wherein the junction box comprises lugs and internal wiring to an external terminal junction.

* * * * *